United States Patent
Takeda

(10) Patent No.: US 11,937,504 B2
(45) Date of Patent: *Mar. 19, 2024

(54) ORGANIC ELECTROLUMINESCENT DEVICE

(71) Applicant: UDC IRELAND LIMITED, Dublin (IE)

(72) Inventor: Akira Takeda, Kanagawa (JP)

(73) Assignee: UDC Ireland Limited, Dublin (IE)

( * ) Notice: Subject to any disclaimer, the term of this patent is extended or adjusted under 35 U.S.C. 154(b) by 0 days.

This patent is subject to a terminal disclaimer.

(21) Appl. No.: 17/812,567

(22) Filed: Jul. 14, 2022

(65) Prior Publication Data
US 2022/0384736 A1  Dec. 1, 2022

Related U.S. Application Data

(60) Continuation of application No. 16/176,135, filed on Oct. 31, 2018, now Pat. No. 11,411,185, which is a continuation of application No. 15/142,509, filed on Apr. 29, 2016, now Pat. No. 10,128,446, which is a division of application No. 12/122,059, filed on May 16, 2008, now Pat. No. 9,359,548.

(30) Foreign Application Priority Data

May 18, 2007 (JP) ................. 2007-133112
Apr. 14, 2008 (JP) ................. 2008-105096

(51) Int. Cl.
| | | |
|---|---|---|
| H01L 51/50 | (2006.01) | |
| C09K 11/02 | (2006.01) | |
| C09K 11/06 | (2006.01) | |
| H05B 33/14 | (2006.01) | |
| H10K 85/30 | (2023.01) | |
| H10K 85/40 | (2023.01) | |
| H10K 85/60 | (2023.01) | |
| H10K 50/11 | (2023.01) | |
| H10K 101/10 | (2023.01) | |

(52) U.S. Cl.
CPC ........ H10K 85/6572 (2023.02); C09K 11/025 (2013.01); C09K 11/06 (2013.01); H05B 33/14 (2013.01); H10K 85/322 (2023.02); H10K 85/342 (2023.02); H10K 85/361 (2023.02); H10K 85/40 (2023.02); C09K 2211/1007 (2013.01); C09K 2211/1011 (2013.01); C09K 2211/1014 (2013.01); C09K 2211/1022 (2013.01); C09K 2211/1029 (2013.01); C09K 2211/1037 (2013.01); C09K 2211/1044 (2013.01); C09K 2211/1059 (2013.01); C09K 2211/1088 (2013.01); C09K 2211/1092 (2013.01); C09K 2211/185 (2013.01); H10K 50/11 (2023.02); H10K 85/324 (2023.02); H10K 85/351 (2023.02); H10K 85/615 (2023.02); H10K 2101/10 (2023.02)

(58) Field of Classification Search
None
See application file for complete search history.

(56) References Cited

U.S. PATENT DOCUMENTS

| | | |
|---|---|---|
| 6,303,238 B1 | 10/2001 | Thompson |
| 2003/0068536 A1 | 4/2003 | Tsuboyama |
| 2003/0134140 A1 | 7/2003 | Li |
| 2004/0137268 A1 | 7/2004 | Igarashi |
| 2004/0164292 A1 | 8/2004 | Tung |
| 2004/0170863 A1* | 9/2004 | Kim ............ C07D 235/18 313/506 |
| 2004/0253478 A1 | 12/2004 | Thompson |
| 2005/0260447 A1 | 11/2005 | Brooks |
| 2006/0060842 A1 | 3/2006 | Sano |
| 2006/0068222 A1 | 3/2006 | Kitamura |

(Continued)

FOREIGN PATENT DOCUMENTS

| | | |
|---|---|---|
| JP | 2001240854 | 9/2001 |
| JP | 2004355898 A | 12/2004 |

(Continued)

OTHER PUBLICATIONS

Hall et al. "Cyclization of 2-Azidobenzophenones to 3-Phenylanthranils. An Example of an Intramolecular 1,3-Dipolar Addition" Journal of the America Chemical Society, 94:14, Jul. 12, 1972; pp. 4952-4958.

*Primary Examiner* — Gregory D Clark
(74) *Attorney, Agent, or Firm* — Riverside Law LLP

(57) ABSTRACT

An organic electroluminescent device includes a pair of electrodes; and an organic layer between the pair of electrodes, which includes a light-emitting layer, wherein the organic layer contains a compound represented by the following formula (I); and the light-emitting layer contains a iridium complex phosphorescent material:

Formula (I)

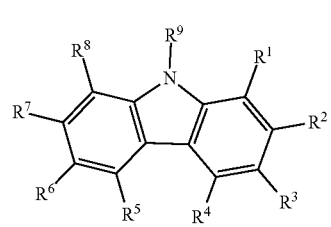

wherein $R^1$, $R^2$, $R^3$, $R^4$, $R^5$, $R^6$, $R^7$ and $R^8$ each represents a hydrogen atom or a substituent, and contiguous substituents of $R^1$ to $R^8$ may be bonded to each other to form a condensed ring; $R^9$ represents an alkyl group, an alkenyl group, an aryl group, a hetero-aryl group, or a silyl group, and each of which group may be substituted with a substituent; and at least one of $R^1$ to $R^9$ represents a deuterium atom or a substituent containing a deuterium atom.

19 Claims, No Drawings

(56) References Cited

U.S. PATENT DOCUMENTS

| | | |
|---|---|---|
| 2006/0127696 A1 | 6/2006 | Stossel |
| 2006/0182995 A1 | 8/2006 | Chang |
| 2006/0228578 A1 | 10/2006 | Ren |
| 2008/0018221 A1 | 1/2008 | Egen |
| 2008/0176102 A1 | 7/2008 | Thompson |
| 2010/0102710 A1 | 4/2010 | Cho |
| 2012/0153272 A1 | 6/2012 | Fukuzaki |
| 2014/0054564 A1 | 2/2014 | Kim |

FOREIGN PATENT DOCUMENTS

| | | |
|---|---|---|
| JP | 2005048004 | 2/2005 |
| JP | 2005048004 A | 2/2005 |
| JP | 2005123168 | 5/2005 |
| JP | 2006199699 | 8/2006 |
| JP | 2006219392 | 8/2006 |
| JP | 2006237306 | 9/2006 |
| JP | 2006523231 | 10/2006 |
| JP | 2005326156 | 5/2007 |
| JP | 2007134503 | 5/2007 |
| JP | 2008147398 | 6/2008 |
| JP | 2008521946 | 6/2008 |
| JP | 2008538858 | 11/2008 |
| JP | 2009004753 | 1/2009 |
| KR | 20060084498 | 7/2006 |
| KR | 20060111048 | 10/2006 |
| KR | 20060115951 | 11/2006 |
| WO | 0057676 A1 | 9/2000 |
| WO | 0247440 A1 | 6/2002 |
| WO | 2002060910 A1 | 8/2002 |
| WO | 2004085450 A2 | 10/2004 |
| WO | 2005124889 | 12/2005 |
| WO | 2006112582 | 10/2006 |
| WO | 2007029426 | 3/2007 |
| WO | 2007065549 | 6/2007 |
| WO | 2007069569 | 6/2007 |
| WO | 2008117889 A1 | 10/2008 |

\* cited by examiner

ORGANIC ELECTROLUMINESCENT DEVICE

CROSS-REFERENCE TO RELATED APPLICATIONS

The present application is a continuation of U.S. patent application Ser. No. 16/176,135, filed Oct. 31, 2018, now allowed, which is a continuation of U.S. patent application Ser. No. 15/142,509, filed on Apr. 29, 2016, now U.S. Pat. No. 10,128,446, which is a divisional of U.S. patent application Ser. No. 12/122,059, filed on May 16, 2008, now U.S. Pat. No. 9,359,548, which claims priority to Japanese Application Nos. JP 2007-133112, filed May 18, 2007, and JP 2008-105096, filed Apr. 14, 2008, all of which applications are incorporated by reference herein in their entireties.

BACKGROUND OF THE INVENTION

1. Field of the Invention

The present invention relates to an organic electroluminescent device capable of emitting light by converting electric energy into light (hereinafter also referred to as "organic EL device", "luminescent device" or "device"), in particular relates to an organic electroluminescent device excellent in light-emitting characteristics and durability.

2. Description of the Related Art

Various types of display devices using organic light-emitting materials (organic luminescent devices) are actively researched and developed these days. Above all, organic EL devices are attracting public attention as promising display devices for capable of emitting light of high luminance with low voltage.

Also in recent years, the increase in efficiency of the devices has been advanced by the use of phosphorescent materials. As phosphorescent materials, iridium complexes and platinum complexes are known. (Refer to U.S. Pat. No. 6,303,238, WO 00/57676 and WO 00/70655.)

A light-emitting layer comprising the combination of Ir(ppy) (iridium-tris(phenylpyridine)) as the dopant and CSP (4,4'-dicarbazolebiphenyl) as the host material is disclosed in patent document 3.

In WO 02/047440, an organic compound containing a deuterium atom is used, but there is no description in the same patent in connection with the effect in using the organic compound in combination with a phosphorescent metal complex material.

A carbazole material containing a deuterium atom having phosphorescence at ordinary temperature is used in JP-A-2005-48004 (The term "JP-A" as used herein refers to an "unexamined published Japanese patent application",), but there is no description in the same patent in connection with the effect in using the material in combination with a phosphorescent metal complex material.

SUMMARY OF THE INVENTION

The invention provides a luminescent device excellent in efficiency (electric power consumption) and durability.

The above has been achieved by the following means.
<1> An organic electroluminescent device comprising:
a pair of electrodes; and
an organic layer between the pair of electrodes, which comprises a light-emitting layer,
wherein the organic layer contains a compound represented by the following formula (I); and
the light-emitting layer contains a iridium complex phosphorescent material:

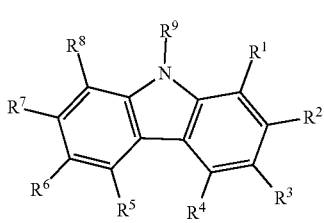

Formula (I)

wherein
$R^1$, $R^2$, $R^1$, $R^4$, $R^5$, $R^6$, $R^7$ and $R^8$ each represents a hydrogen atom or a substituent, and contiguous substituents of $R^1$ to $R^8$ may be bonded to each other to form a condensed ring;
$R^9$ represents an alkyl group, an alkenyl group, an aryl group, a hetero-aryl group, or a silyl group, and each of which group may be substituted with a substituent; and
at least one of $R^1$ to $R^9$ represents a deuterium atom or a substituent containing a deuterium atom.
<2> The organic electroluminescent device of <1>, wherein the iridium complex phosphorescent material has a maximum emission wavelength of smaller than 470 nm.
<3> The organic electroluminescent device of <1>, wherein the iridium complex phosphorescent material contains a ligand bonding to an iridium atom via a carbene carbon.
<4> The organic electroluminescent device of <3>, wherein the iridium complex phosphorescent material containing a ligand bonding to an iridium atom via a carbene carbon is represented by the following formula (II):

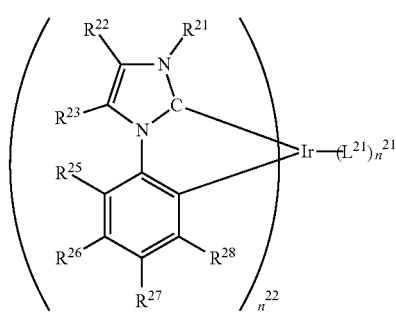

Formula (II)

wherein
$R^{21}$, $R^{22}$, $R^{23}$, $R^{25}$, $R^{26}$, $R^{27}$ and $R^{28}$ each represents a hydrogen atom or a substituent;
$L^{21}$ represents a ligand;
$n^{22}$ represents an integer of from 1 to 3;
$n^{21}$ represents an integer of from 0 to 4; and
C represents the carbene carbon coordinating to the iridium atom.
<5> The organic electroluminescent device of <4>, wherein the iridium complex phosphorescent material containing a ligand bonding to an iridium atom via a carbene carbon is represented by the following formula (III):

Formula (III)

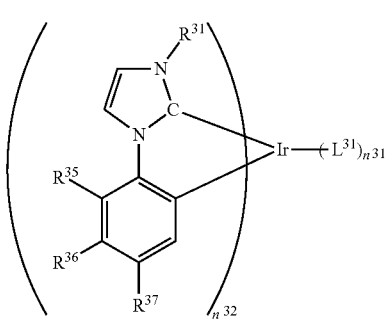

wherein
$R^{31}$ represents an alkyl group or an aryl group;
$R^{35}$, $R^{36}$ and $R^{37}$ each represents a hydrogen atom, a fluorine atom, an alkyl group, or a cyano group, and $R^{35}$ and $R^{36}$ or $R^{36}$ and $R^{37}$ may be bonded to each other to form a condensed ring structure;
$L^{31}$ represents a ligand;
$n^{32}$ represents an integer of from 1 to 3;
$n^{31}$ represents an integer of from 0 to 4; and
C represents the carbene carbon coordinating to the iridium atom.

<6> The organic electroluminescent device of <1>, wherein the iridium complex phosphorescent material contains a ligand bonding to an iridium atom via a nitrogen atom of a pyrazole structure.

<7> The organic electroluminescent device of <6>, wherein the iridium complex phosphorescent material containing a ligand bonding to an iridium atom via a nitrogen atom of a pyrazole structure is represented by the following formula (IV):

Formula (IV)

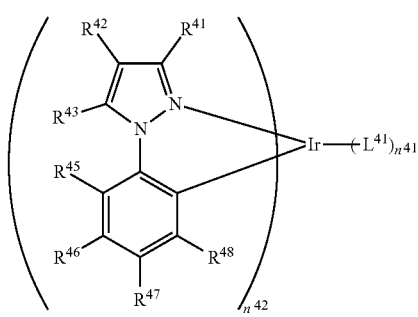

wherein
$R^{41}$, $R^{42}$, $R^{43}$, $R^{45}$, $R^{46}$, $R^{47}$ and $R^{48}$ each represents a hydrogen atom or a substituent;
$L^{41}$ represents a ligand;
$n^{42}$ represents an integer of from 1 to 3; and
$n^{41}$ represents an integer of from 0 to 4.

<8> The organic electroluminescent device of <7>, wherein the iridium complex phosphorescent material containing a ligand bonding to an iridium atom via a nitrogen atom of a pyrazole structure is represented by the following formula (V):

Formula (V)

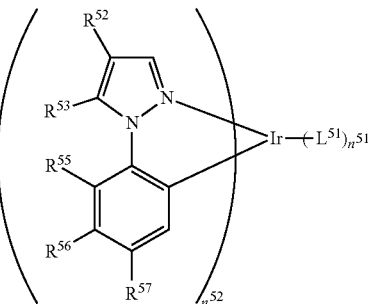

wherein
$R^{52}$ and $R^{53}$ each represents a hydrogen atom, an alkyl group, or an aryl group;
$R^{55}$, $R^{56}$ and $R^{57}$ each represents a hydrogen atom, a fluorine atom, an alkyl group, or a cyano group, and $R^{55}$ and $R^{56}$ or $R^{56}$ and $R^{57}$ may be bonded to each other to form a condensed ring structure;
$L^{51}$ represents a ligand;
$n^{52}$ represents an integer of from 1 to 3; and
$n^{51}$ represents an integer of from 0 to 4.

<9> The organic electroluminescent device of <1>, wherein the iridium complex phosphorescent material contains a ligand bonding to an iridium atom via the nitrogen atom of a pyridine structure.

<10> The organic electroluminescent device of <9>, wherein the iridium complex phosphorescent material containing a ligand bonding to an iridium atom via the nitrogen atom of a pyridine structure is represented by the following formula (VI):

Formula (VI)

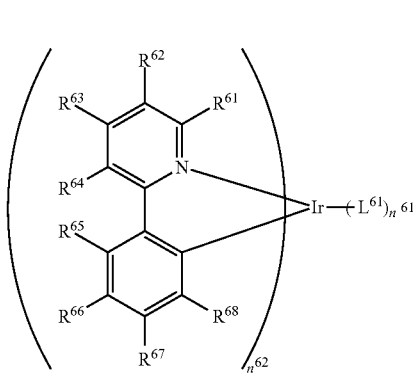

wherein
$R^{61}$, $R^{62}$, $R^{63}$, $R^{64}$, $R^{65}$, $R^{66}$, $R^{67}$ and $R^{68}$ each represents a hydrogen atom or a substituent;
$L^{61}$ represents a ligand;
$n^{62}$ represents an integer of from 1 to 3; and
$n^{61}$ represents an integer of from 0 to 4.

<11> The organic electroluminescent device of <10>, wherein the iridium complex phosphorescent material containing a ligand bonding to an iridium atom via the nitrogen atom of a pyridine structure is represented by the following formula (VII):

Formula (VII)

[Chemical structure: pyridine-phenyl ligand with Ir—(L⁷¹)ₙ₇₁, substituents R⁷³, R⁷⁵, R⁷⁶, R⁷⁷, subscript n72]

wherein
$R^{73}$ represents a hydrogen atom, an alkyl group, an amino group, or an alkoxyl group;
$R^{75}$, $R^{76}$ and $R^{77}$ each represents a hydrogen atom, a fluorine atom, a cyano group, or an alkyl group;
$L^{71}$ represents a ligand;
$n^{72}$ represents an integer of from 1 to 3; and
$n^{71}$ represents an integer of from 0 to 4.

<12> The organic electroluminescent device according to <1>, wherein
the compound represented by formula (I) is represented by the following formula (VIII):

Formula (VIII)

[Chemical structure: carbazole with substituents R⁸¹–R⁸⁸, linking group A, subscript n81]

wherein
$R^{81}$, $R^{82}$, $R^{83}$, $R^{84}$, $R^{85}$, $R^{86}$, $R^{87}$ and $R^{88}$ each represents a hydrogen atom or a substituent, and contiguous substituents of $R^{81}$ to $R^{88}$ may be bonded to each other to form a condensed ring structure;
A represents a linking group; and
$n^{81}$ represents an integer of from 2 to 6; and
the compound represented by the formula (VIII) contains at least one deuterium atom.

<13> The organic electroluminescent device of <1>, wherein
the compound represented by the formula (I) is contained in the light-emitting layer.

DETAILED DESCRIPTION OF THE INVENTION

The organic electroluminescent device of the invention (hereinafter sometimes referred to as "the device of the invention") is an organic electroluminescent device comprising a pair of electrodes and at least one organic layer (the organic layer may be a layer comprising an organic compound alone, or may be an organic layer containing an inorganic compound) including a light-emitting layer between the pair of electrodes, and any of the organic layers contains at least one compound represented by the following formula (I), and the light-emitting layer contains at least one iridium complex phosphorescent material.

The compound represented by formula (I) of the invention is excellent in chemical stability, hardly accompanied by decomposition of the material during driving of the device, and capable of preventing reduction of efficiency and reduction of duration of life of the organic electroluminescent device using the iridium complex phosphorescent material due to the decomposed product.

The compound represented by formula (I) will be described below,

Formula (I)

[Chemical structure: carbazole with substituents $R^1$ through $R^8$ on the ring carbons and $R^9$ on the nitrogen]

In formula (I), $R^1$ to $R^8$ each represents a hydrogen atom or a substituent, and contiguous substituents of $R^1$ to $R^8$ may be bonded to each other to form a condensed ring; $R^9$ represents an alkyl group, an alkenyl group, an aryl group, a hetero-aryl group, or a silyl group, and each group may be substituted with a substituent, and at least one of $R^1$ to $R^9$ represents a deuterium atom or a substituent containing a deuterium atom.

The substituents represented by $R^1$ to $R^8$ are not especially restricted. For example, an alkyl group, an alkenyl group, an alkynyl group, an aryl group, a hetero-aryl group, an amino group, an alkoxyl group, an aryloxy group, a heterocyclic oxy group, an acyl group, an alkoxycarbonyl group, an aryloxycarbonyl group, an acyloxy group, an acylamino group, an alkoxycarbonylamino group, an aryloxycarbonylamino group, a sulfonylamino group, a sulfamoyl group, a carbamoyl group, an alkylthio group, an arylthio group, a heterocyclic thio group, a sulfonyl group, a sulfinyl group, a ureido group, a phosphoric acid amido group, a hydroxyl group, a mercapto group, a halogen group, a cyano group, a sulfo group, a carboxyl group, a nitro group, a hydroxamic acid group, a sulfino group, a hydrazino group, an imino group, a heterocyclic group, a silyl group, a silyloxy group, a deuterium atom, etc., are exemplified. These substituents may further be substituted with other substituent, and these substituents may be bonded to each other to form a ring.

The alkyl group has preferably from 1 to 30 carbon atoms, more preferably from 1 to 20 carbon atoms, and especially preferably from 1 to 10 carbon atoms, and, e.g., methyl, ethyl, n-propyl, isopropyl, n-butyl, tert-butyl, n-octyl, n-nonyl, n-decyl, n-dodecyl, n-octadecyl, n-hexadecyl, cyclopropyl, cyclobutyl, cyclopentyl, cyclohexyl, cyclooctyl, 1-adamantyl, trifluoromethyl, etc., are exemplified.

The alkenyl group has preferably from 2 to 30 carbon atoms, more preferably from 2 to 20 carbon atoms, and especially preferably from 2 to 10 carbon atoms, and, e.g., vinyl, allyl, 1-propenyl, 1-isopropenyl, 1-butenyl, 2-butenyl, 3-pentenyl, etc., are exemplified.

The alkynyl has preferably from 2 to 30 carbon atoms, more preferably from 2 to 20 carbon atoms, and especially preferably from 2 to 10 carbon atoms, and, e.g., ethynyl, propargyl, 1-propynyl, 3-pentynyl, etc., are exemplified.

The aryl group has preferably from 6 to 30 carbon atoms, more preferably from 6 to 20 carbon atoms, and especially preferably from 6 to 12 carbon atoms, and, e.g., phenyl, o-methylphenyl, m-methylphenyl, p-methylphenyl, 2,6-xylyl, p-cumenyl, mesityl, naphthyl, anthranyl, etc., are exemplified.

The hetero-aryl group has preferably from 1 to 30 carbon atoms, and more preferably from 1 to 12 carbon atoms, and the hetero-atoms are, e.g., a nitrogen atom, an oxygen atom, and a sulfur atom, specifically, e.g., imidazolyl, pyrazolyl, pyridyl, pyrazyl, pyrimidyl, triazinyl, quinolyl, isoquinolyl, pyrrolyl, indolyl, furyl, thienyl, benzoxazolyl, benzimidazolyl, benzothiazolyl, carbazolyl, azepinyl, etc., are exemplified.

The amino group has preferably from 0 to 30 carbon atoms, more preferably from 0 to 20 carbon atoms, and especially preferably from 0 to 10 carbon atoms, and, e.g., amino, methylamino, dimethylamino, diethylamino, benzylamino, diphenylamino, ditolylamino, etc., are exemplified.

The alkoxyl group has preferably from 1 to 30 carbon atoms, more preferably from 1 to 20 carbon atoms, and especially preferably from 1 to 10 carbon atoms, and, e.g., methoxy, ethoxy, butoxy, 2-ethylhexyloxy, etc., are exemplified.

The aryloxy group has preferably from 6 to 30 carbon atoms, more preferably from 6 to 20 carbon atoms, and especially preferably from 6 to 12 carbon atoms, and, e.g., phenyloxy, 1-naphthyloxy, 2-naphthyloxy, etc., are exemplified.

The heterocyclic oxy group has preferably from 1 to 30 carbon atoms, more preferably from 1 to 20 carbon atoms, and especially preferably from 1 to 12 carbon atoms, and, e.g., pyridyloxy, pyrazyloxy, pyrimidyloxy, quinolyloxy, etc., are exemplified.

The acyl group has preferably from 2 to 30 carbon atoms, more preferably from 2 to 20 carbon atoms, and especially preferably from 2 to 12 carbon atoms, and, e.g., acetyl, benzoyl, formyl, pivaloyl, etc., are exemplified.

The alkoxycarbonyl group has preferably from 2 to 30 carbon atoms, more preferably from 2 to 20 carbon atoms, and especially preferably from 2 to 12 carbon atoms, and, e.g., methoxycarbonyl, ethoxycarbonyl, etc., are exemplified.

The aryloxycarbonyl group has preferably from 7 to 30 carbon atoms, more preferably from 7 to 20 carbon atoms, and especially preferably from 7 to 12 carbon atoms, and, e.g., phenyloxycarbonyl, etc., are exemplified.

The acyloxy group has preferably from 2 to 30 carbon atoms, more preferably from 2 to 20 carbon atoms, and especially preferably from 2 to 10 carbon atoms, and, e.g., acetoxy, benzoyloxy, etc., are exemplified.

The acylamino group has preferably from 2 to 30 carbon atoms, more preferably from 2 to 20 carbon atoms, and especially preferably from 2 to 10 carbon atoms, and, e.g., acetylamino, benzoylamino, etc., are exemplified.

The alkoxycarbonylamino group has preferably from 2 to 30 carbon atoms, more preferably from 2 to 20 carbon atoms, and especially preferably from 2 to 12 carbon atoms, and, e.g., methoxycarbonylamino, etc., are exemplified.

The aryloxycarbonylamino group has preferably from 7 to 30 carbon atoms, more preferably from 7 to 20 carbon atoms, and especially preferably from 7 to 12 carbon atoms, and, e.g., phenyloxycarbonylamino, etc., are exemplified.

The sulfonylamino group has preferably from 1 to 30 carbon atoms, more preferably from 1 to 20 carbon atoms, and especially preferably from 1 to 12 carbon atoms, and, e.g., methanesulfonylamino, benzenesulfonylamino, etc., are exemplified.

The sulfamoyl group has preferably from 0 to 30 carbon atoms, more preferably from 0 to 20 carbon atoms, and especially preferably from 0 to 12 carbon atoms, and, e.g., sulfamoyl, methylsulfamoyl, dimethylsulfamoyl, phenylsulfamoyl, etc., are exemplified.

The carbamoyl group has preferably from 1 to 30 carbon atoms, more preferably from 1 to 20 carbon atoms, and especially preferably from 1 to 12 carbon atoms, and, e.g., carbamoyl, methylcarbamoyl, diethylcarbamoyl, phenylcarbamoyl, etc., are exemplified.

The alkylthio group has preferably from 1 to 30 carbon atoms, more preferably from 1 to 20 carbon atoms, and especially preferably from 1 to 12 carbon atoms, and, e.g., methylthio, ethylthio, etc., are exemplified.

The arylthio group has preferably from 6 to 30 carbon atoms, more preferably from 6 to 20 carbon atoms, and especially preferably from 6 to 12 carbon atoms, and, e.g., phenylthio, etc., are exemplified.

The heterocyclic thio group has preferably from 1 to 30 carbon atoms, more preferably from 1 to 20 carbon atoms, and especially preferably from 1 to 12 carbon atoms, and, e.g., pyridylthio, 2-benzimidazolylthio, 2-benzoxazolylthio, 2-benzothiazolylthio, etc., are exemplified.

The sulfonyl group has preferably from 1 to 30 carbon atoms, more preferably from 1 to 20 carbon atoms, and especially preferably from 1 to 12 carbon atoms, and, e.g., mesyl, tosyl, trifluoromethanesulfonyl, etc., are exemplified.

The sulfinyl group has preferably from 1 to 30 carbon atoms, more preferably from 1 to 20 carbon atoms, and especially preferably from 1 to 12 carbon atoms, and, e.g., methanesulfinyl, benzenesulfinyl, etc., are exemplified.

The ureido group has preferably from 1 to 30 carbon atoms, more preferably from 1 to 20 carbon atoms, and especially preferably from 1 to 12 carbon atoms, and, e.g., ureido, methylureido, phenylureido, etc., are exemplified.

The phosphoric acid amido group has preferably from 1 to 30 carbon atoms, more preferably from 1 to 20 carbon atoms, and especially preferably from 1 to 12 carbon atoms, and, e.g., diethylphosphoric acid amido, phenylphosphoric acid amido, etc., are exemplified.

As the halogen atoms, e.g., a fluorine atom, a chlorine atom, a bromine atom, an iodine atom, etc., are exemplified.

The heterocyclic group has preferably from 1 to 30 carbon atoms, and more preferably from 1 to 12 carbon atoms, and the hetero-atoms are, e.g., a nitrogen atom, an oxygen atom, and a sulfur atom, specifically, e.g., piperidyl, morpholino, pyrrolidyl, etc., are exemplified.

The silyl group has preferably from 3 to 40 carbon atoms, more preferably from 3 to 30 carbon atoms, and especially preferably from 3 to 24 carbon atoms, and, e.g., trimethylsilyl, triethylsilyl, triisopropylsilyl, dimethyl-tert-butylsilyl, dimethylphenylsilyl, diphenyl-tert-butylsilyl, triphenylsilyl, tri-1-naphthylsilyl, tri-2-naphthylsilyl, etc., are exemplified.

The silyloxy group has preferably from 3 to 40 carbon atoms, more preferably from 3 to 30 carbon atoms, and especially preferably from 3 to 24 carbon atoms, and, e.g., trimethylsilyloxy, triphenylsilyloxy, etc., are exemplified.

As the substituents represented by $R^1$ to $R^8$, a deuterium atom, an alkyl group, an aryl group, a hetero-aryl group, a halogen group, a cyano group, and a silyl group are preferred, a deuterium atom, an alkyl group, a hetero-aryl group, a halogen group, a cyano group, and a silyl group are more preferred, and a deuterium atom, an alkyl group, a hetero-aryl group, and a silyl group are especially preferred.

These substituents may further be substituted with other substituent, and these substituents may be bonded to each other to form a ring.

As the alkyl groups represented by R' to $R^8$, the preferred are methyl, ethyl, n-propyl, isopropyl, n-butyl, tert-butyl, n-octyl, cyclopropyl, cyclopentyl, cyclohexyl, 1-adamantyl, and trifluoromethyl, the more preferred are methyl, isopropyl, tert-butyl, n-octyl, cyclopentyl, cyclohexyl, 1-adamantyl, and trifluoromethyl, and the especially preferred are tert-butyl, cyclohexyl, 1-adamantyl, and trifluoromethyl. These substituents may further be substituted with other substituent, and these substituents may be bonded to each other to form a ring.

As the hetero-aryl groups represented by $R^1$ to $R^8$, the preferred are imidazolyl, pyrazolyl, pyridyl, quinolyl, isoquinolyl, pyrrolyl, indolyl, Daryl, thienyl, benzoxazolyl, benzimidazolyl, benzothiazolyl, carbazolyl, and azepinyl, the more preferred are imidazolyl, pyrazolyl, quinolyl, indolyl, furyl, thienyl, benzimidazolyl, carbazolyl, and azepinyl, and the especially preferred are indolyl, furyl, thienyl, benzimidazolyl, carbazolyl, and azepinyl. These substituents may further be substituted with other substituent, or may form a condensed ring structure, or these substituents may be bonded to each other to form a ring.

As the silyl groups represented by $R^1$ to $R^8$, the preferred are trimethylsilyl, triethylsilyl, triisopropylsilyl, dimethyl-tert-butylsilyl, dimethylphenylsilyl, methyldiphenylsilyl, diphenyl-tert-butylsilyl, and triphenylsilyl, the more preferred are trimethylsilyl, triisopropylsilyl, dimethyl-tert-butylsilyl, diphenyl-tert-butylsilyl, and triphenylsilyl, and the especially preferred are trimethylsilyl, dimethyl-tert-butylsilyl, and triphenylsilyl. These substituents may further be substituted with other substituent, and these substituents may be bonded to each other to form a ring.

As the substituents represented by $R^2$ and $R^7$, the preferred are an alkyl group, an aryl group, a silyl group, and a deuterium atom, the more preferred are an alkyl group, a silyl group and a deuterium atom, and the especially preferred are a tert-butyl group, an adamantyl group, a trimethylsilyl group, a triphenylsilyl group, and a deuterium atom.

As the substituents represented by $R^3$ and $R^6$, the preferred are an alkyl group, an aryl group, a silyl group, and a deuterium atom, the more preferred are an alkyl group, a silyl group and a deuterium atom, and the especially preferred are a tert-butyl group, an adamantyl group, a trimethylsilyl group, a triphenylsilyl group, and a deuterium atom.

The specific examples of the combinations of substituents represented by $R^1$ to $R^8$ are shown below, but the invention is not restricted to these compounds. In the structural formulae, D represents a deuterium atom.

For example, in formula (a-0), all of $R^1$ to $R^5$ represent a hydrogen atom, in formula (a-1), all of $R^1$, $R^2$, $R^4$, $R^5$, $R^7$ and $R^8$ represent a hydrogen atom, and $R^3$ and $R^6$ represent a deuterium atom, and in formula (a-4), all of $R^1$ to $R^8$ represent a deuterium atom.

Incidentally, formulae (a-0) to (k-0) (not containing a deuterium atom) do not satisfy formula (I), but formulae other than the above satisfy formula (I).

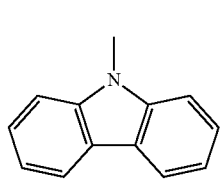

a-0

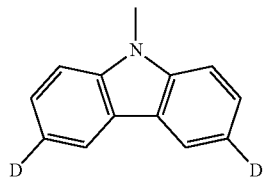

a-1

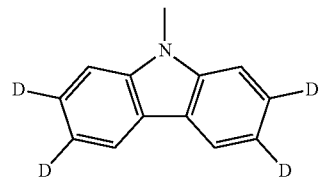

a-2

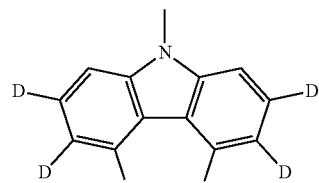

a-3

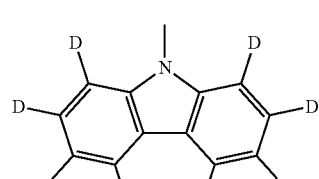

a-4

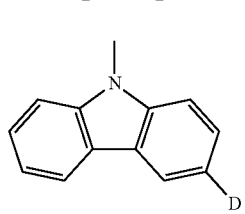

a-5

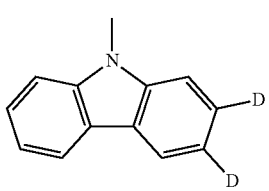

a-6

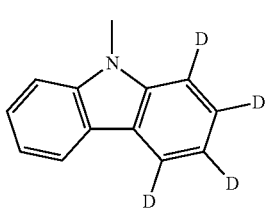

a-7 b-0

-continued
b-1
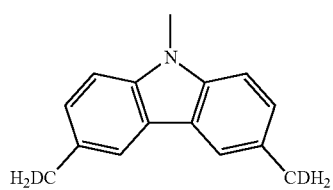
b-2
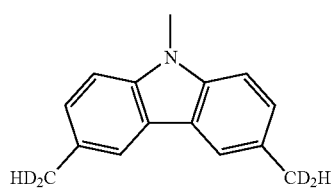
b-4
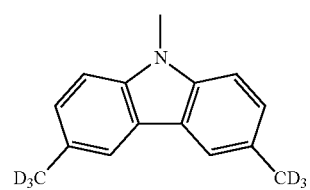
c-0
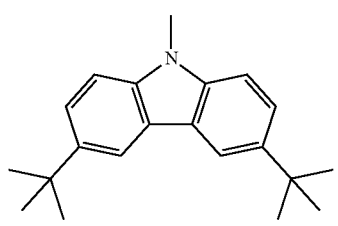
c-1
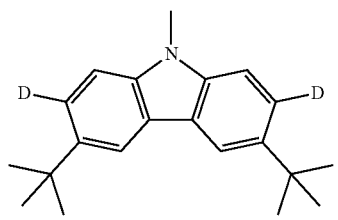
c-2
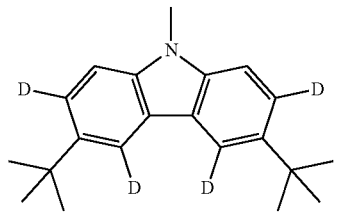
c-3
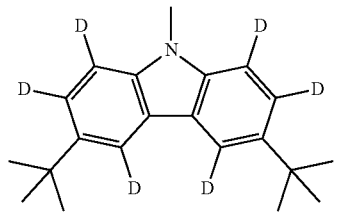
-continued
c-4
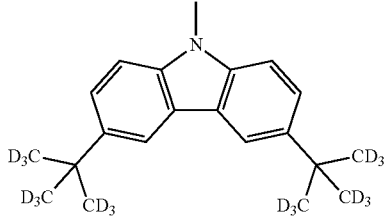
c-5
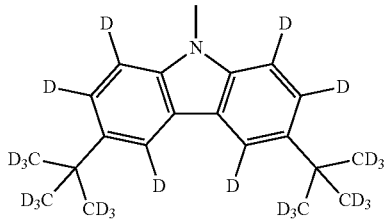
d-0
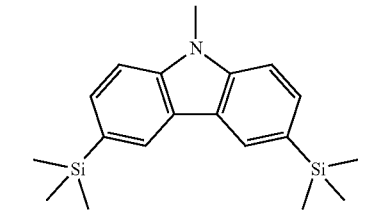
d-1
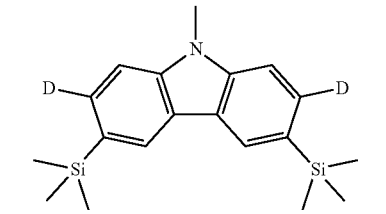
d-2
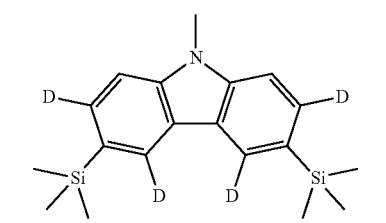
d-3
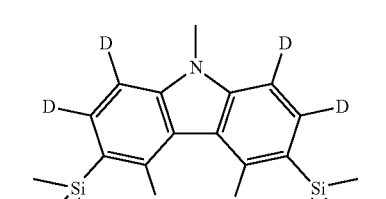
d-4
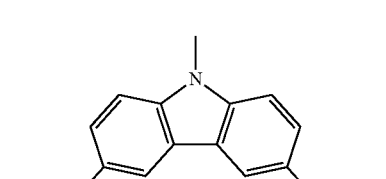

-continued
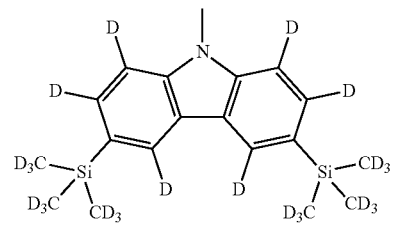
d-5
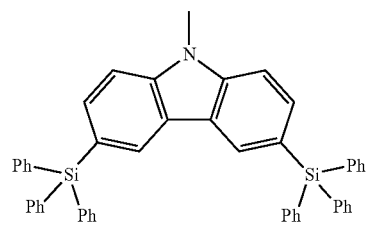
e-0
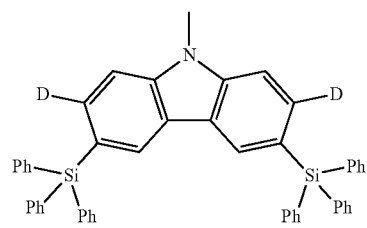
e-1
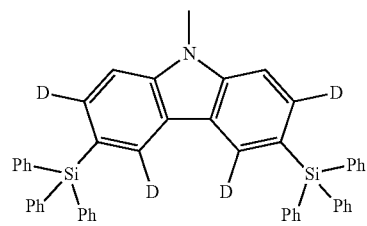
e-2
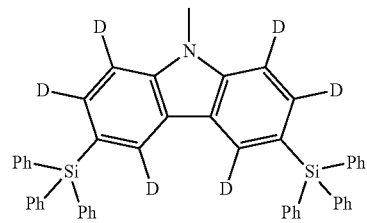
e-3
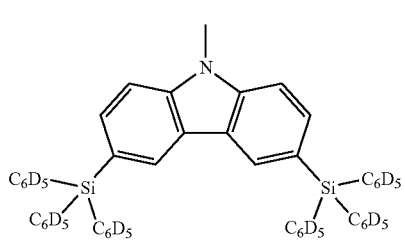
e-4
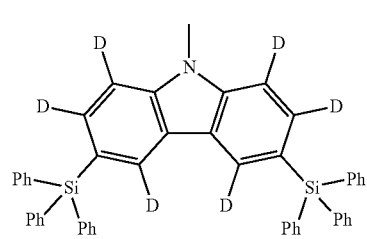
e-5
-continued
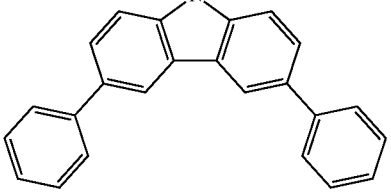
f-0
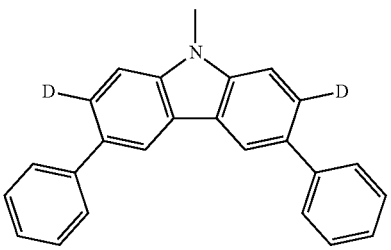
f-1
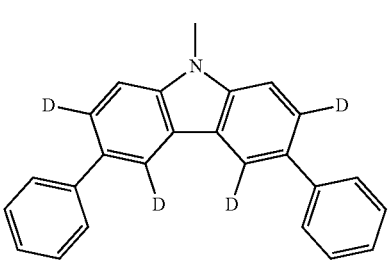
f-2
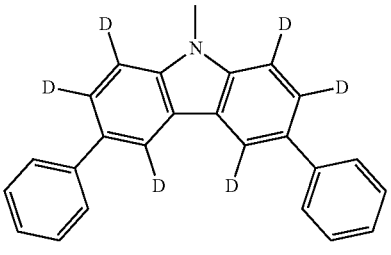
f-3
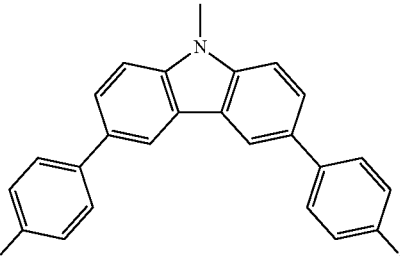
f-4
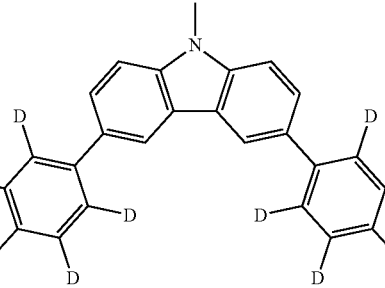
f-5 f-6
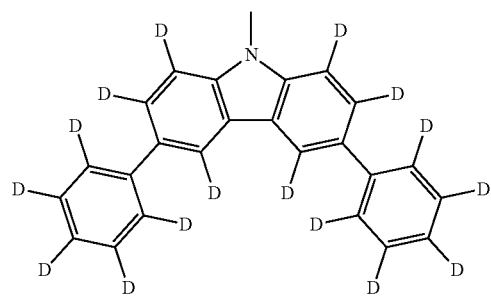
g-0
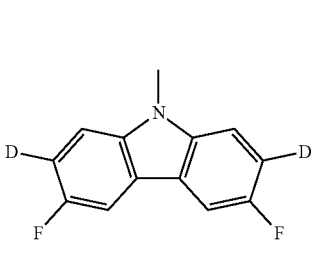
g-1
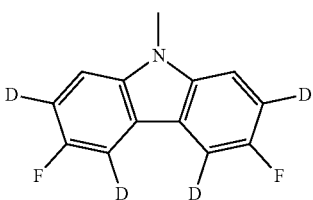
g-2
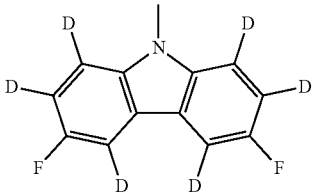
g-3
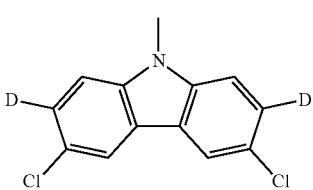
h-0
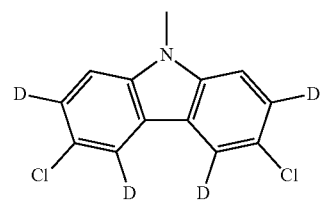
h-1
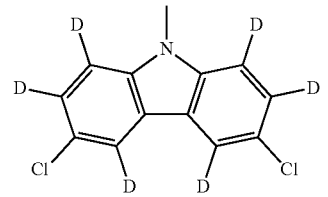
h-2
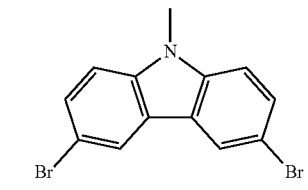
h-3
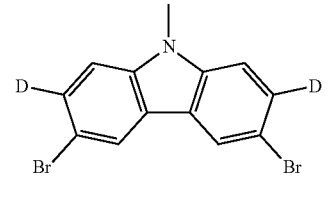
i-0
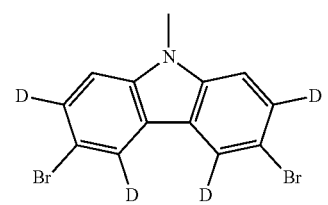
i-1
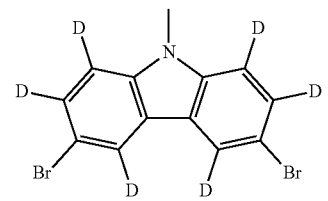
i-2
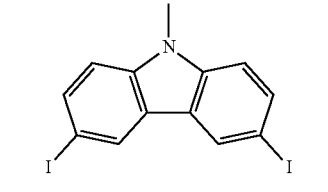
i-3
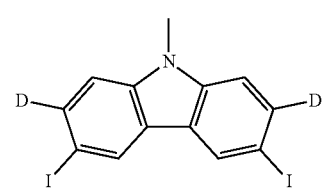
j-0
j-1

-continued

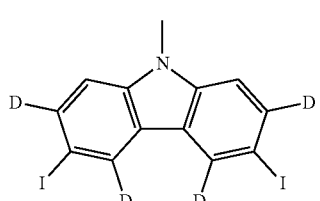
j-2

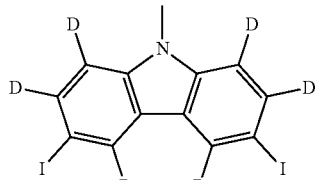
j-3

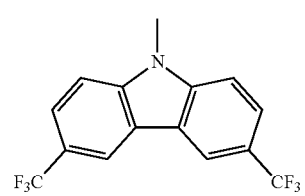
k-0

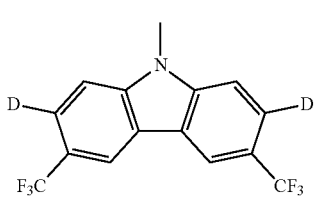
k-1

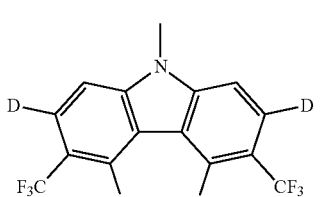
k-2

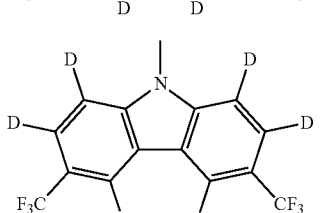
k-3

$R^9$ represents an alkyl group, an alkenyl group, an aryl group, a hetero-aryl group, or a silyl group, preferably an aryl group, a hetero-aryl group, or a silyl group, more preferably an aryl group or a hetero-aryl group, and especially preferably represents an aryl group.

As the aryl group represented by $R^9$, the preferred are phenyl, o-methylphenyl, 2,6-xylyl, and mesityl, the more preferred are phenyl and mesityl, and the especially preferred is a phenyl group. These substituents may form a condensed ring structure, and these substituents may be bonded to each other to form a ring, e.g., biphenyl, naphthyl, anthranyl, phenanthryl, pyrenyl, naphthacenyl, etc., are exemplified. These substituents may further be substituted with other substituent.

A plurality of structures comprising carbazole and $R^1$ to $R^8$ may be bonded to $R^9$, preferably from 1 to 6 structures, more preferably from 1 to 3 structures, and especially preferably from 1 to 2 structures may be bonded to $R^9$.

The specific examples of the substituents represented by $R^9$ to which one structure comprising carbazole and $R^1$ to $R^8$ is bonded are shown below, however, the invention is not restricted to these compounds. In the following formulae, is a part where the nitrogen atom of the carbazole is to be bonded. Incidentally, the combinations of (a-0) to (k-0) (not containing a deuterium atom) with (1A-0) to (1Q-0) (not containing a deuterium atom) do not satisfy formula (I), but similar combinations of both groups other than the above satisfy formula (I).

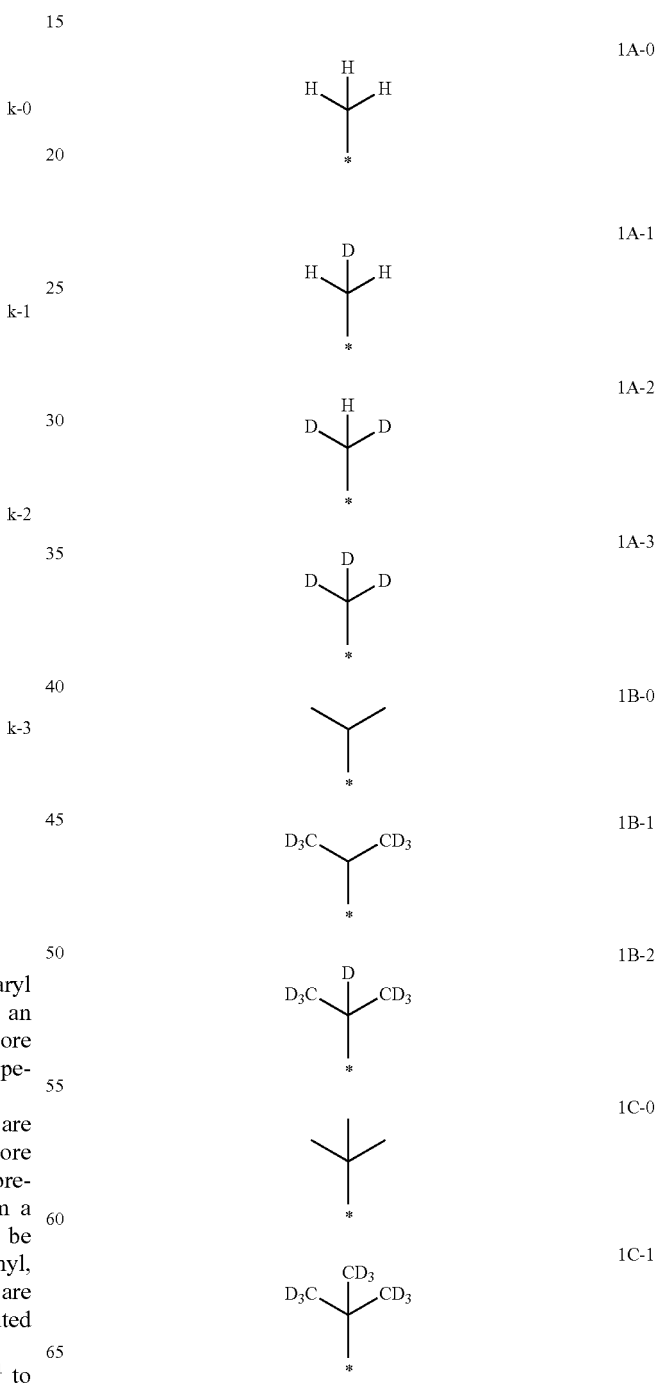

-continued
1D-0
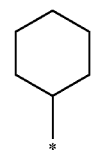
1D-1
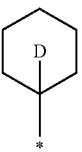
1D-2
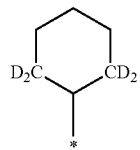
1D-3
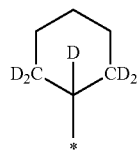
1D-4
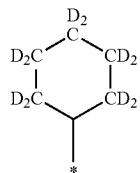
1D-5
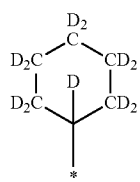
1E-0
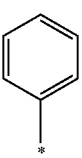
1E-1
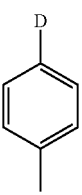
1E-2
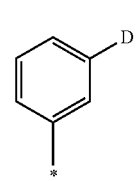
-continued
1E-3
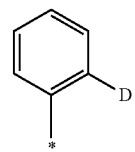
1E-4
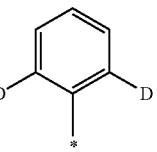
1E-5
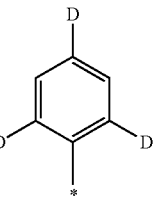
1E-6
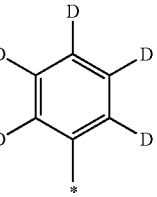
1F-0
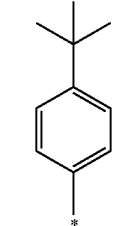
1F-1
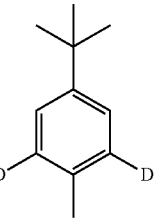
1F-2
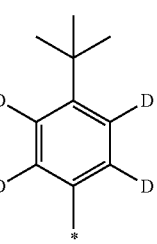

21
-continued
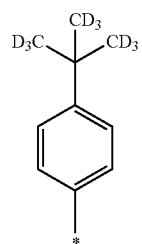 1F-3
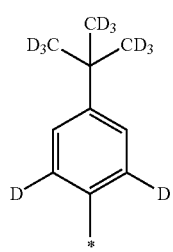 1F-4
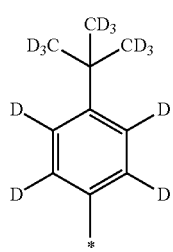 1F-5
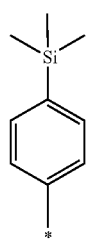 1G-0
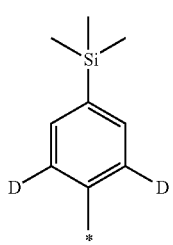 1G-1
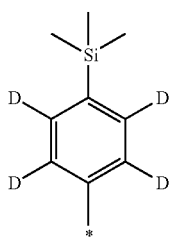 1G-2
22
-continued
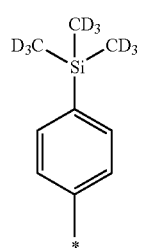 1G-3
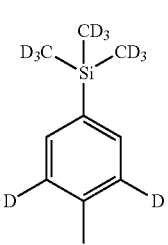 1G-4
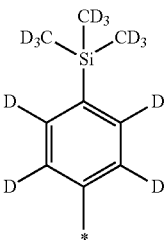 1G-5
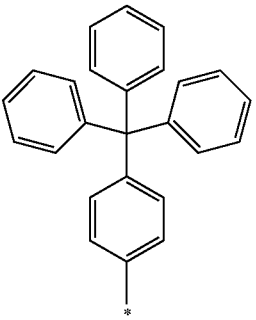 1H-0
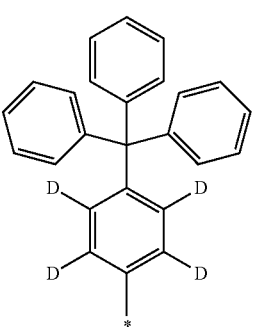 1H-1

-continued
1H-2
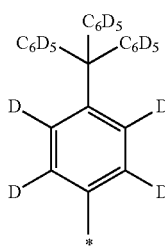
1I-0
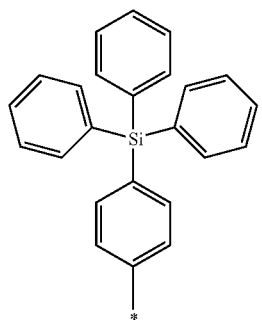
1I-1
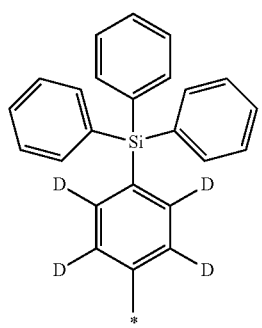
1I-2
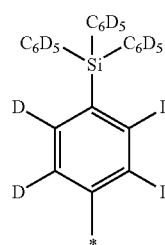
1J-0
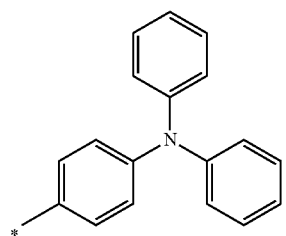
1J-1
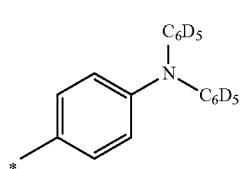
-continued
1J-2
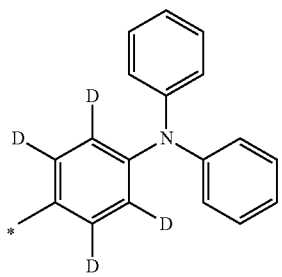
1J-3
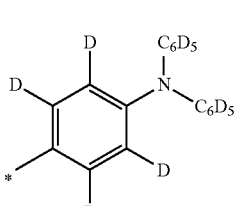
1K-0
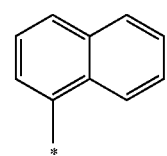
1K-1
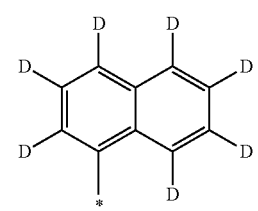
1L-0
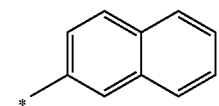
1L-1
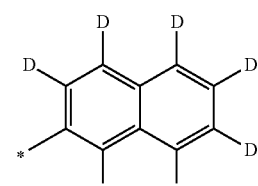
1M-0
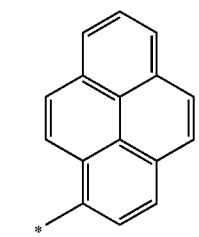

1M-1

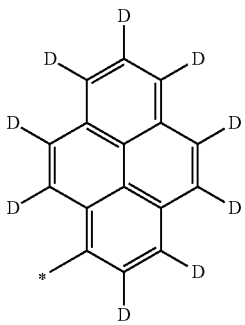

1N-0

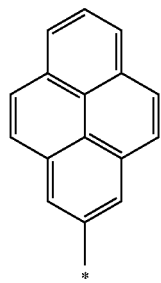

1N-1

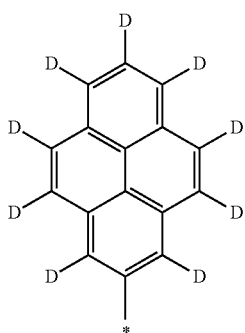

1O-0

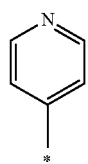

1O-1

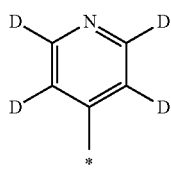

1P-0

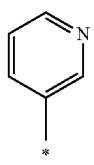

1P-1

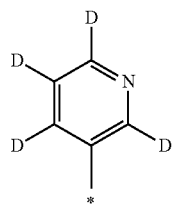

1Q-0

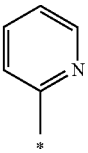

1Q-1

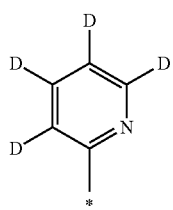

The specific examples of the substituents represented by $R^9$ to which two structures comprising carbazole and $R^1$ to $R^8$ are bonded are shown below, however, the invention is not restricted to these compounds. In the following formulae, * is the part to which the nitrogen atom of the carbazole is to be bonded. Incidentally, the combinations of the above (a-0) to (k-0) (not containing a deuterium atom) and the following (2A-0) to (2M-0) (not containing a deuterium atom) do not satisfy formula (I), but similar combinations of both groups other than the above satisfy formula (I).

2A-0

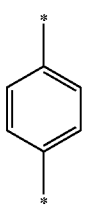

2A-1

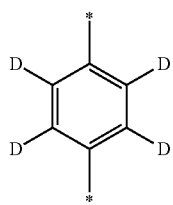

2B-0

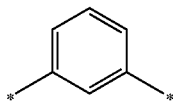

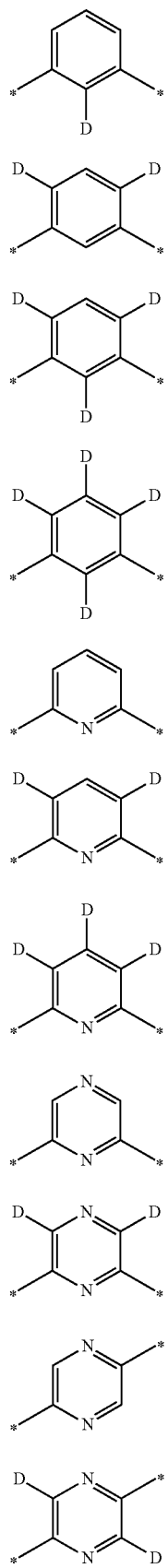
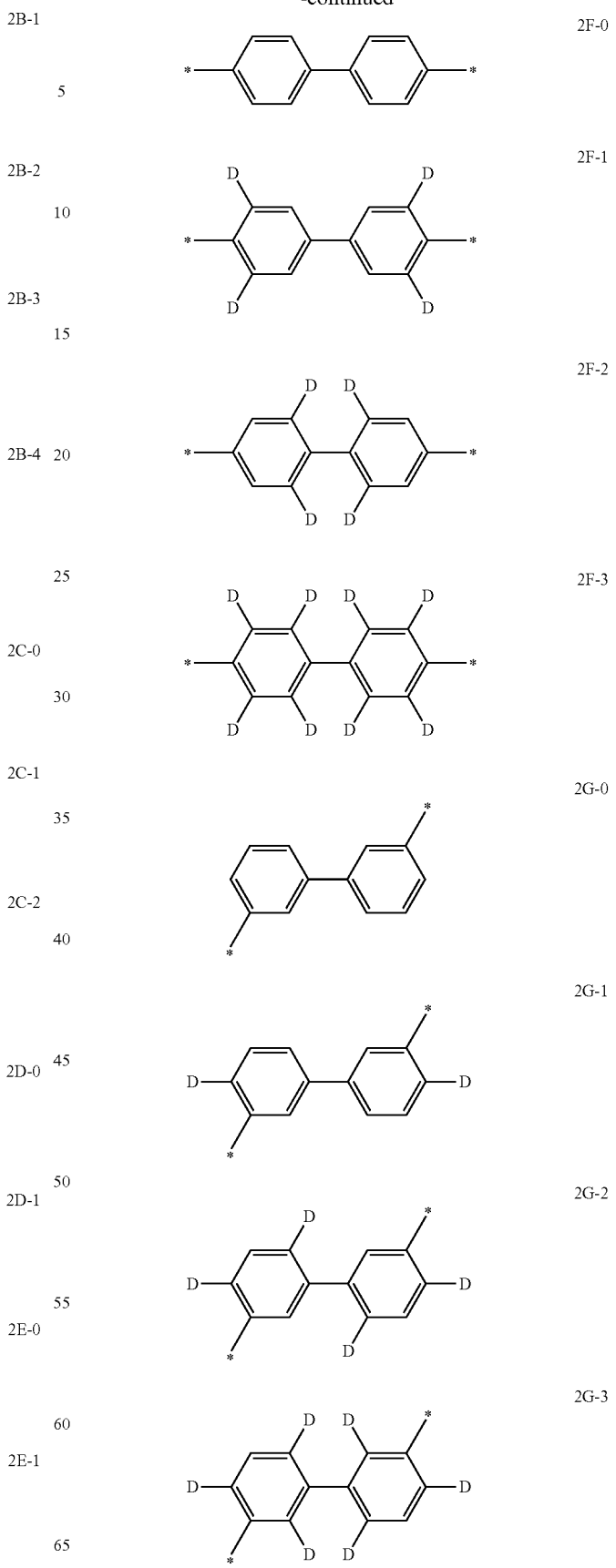

2H-0
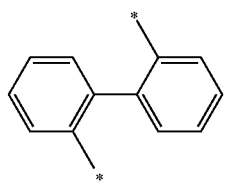
2H-1
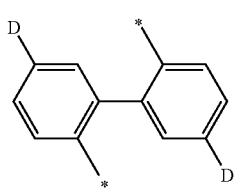
2H-2
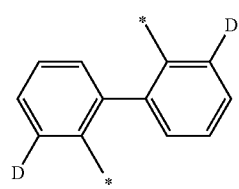
2H-3
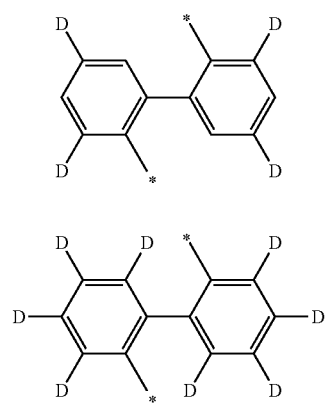
2H-4
2I-0
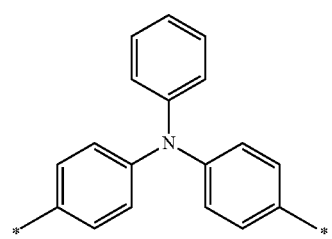
2I-1
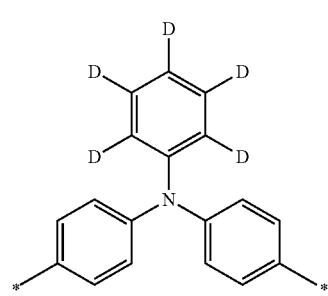
2I-2
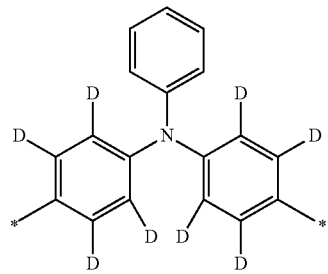
2I-3
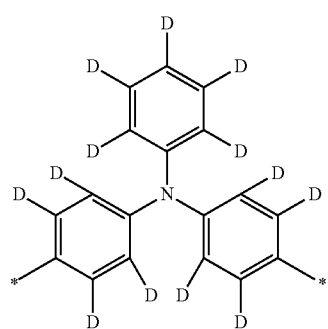
2J-0
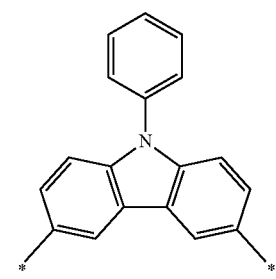
2J-1
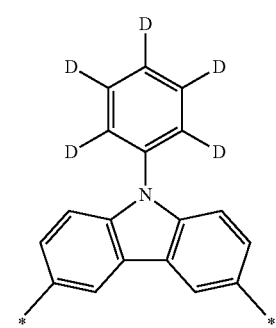
2J-2
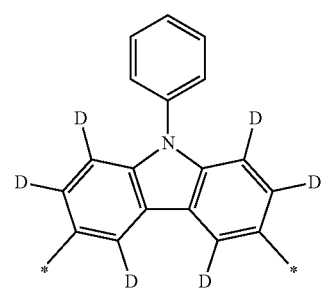

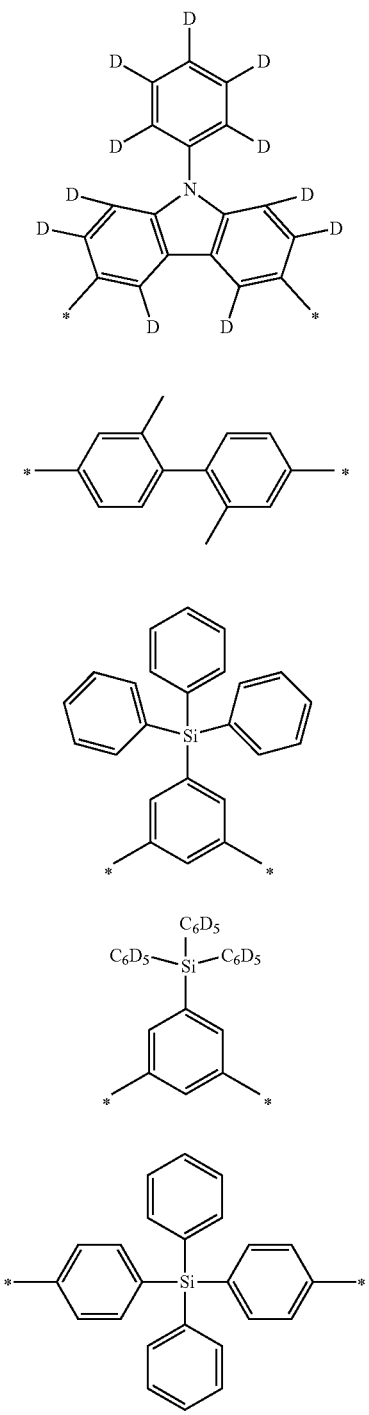
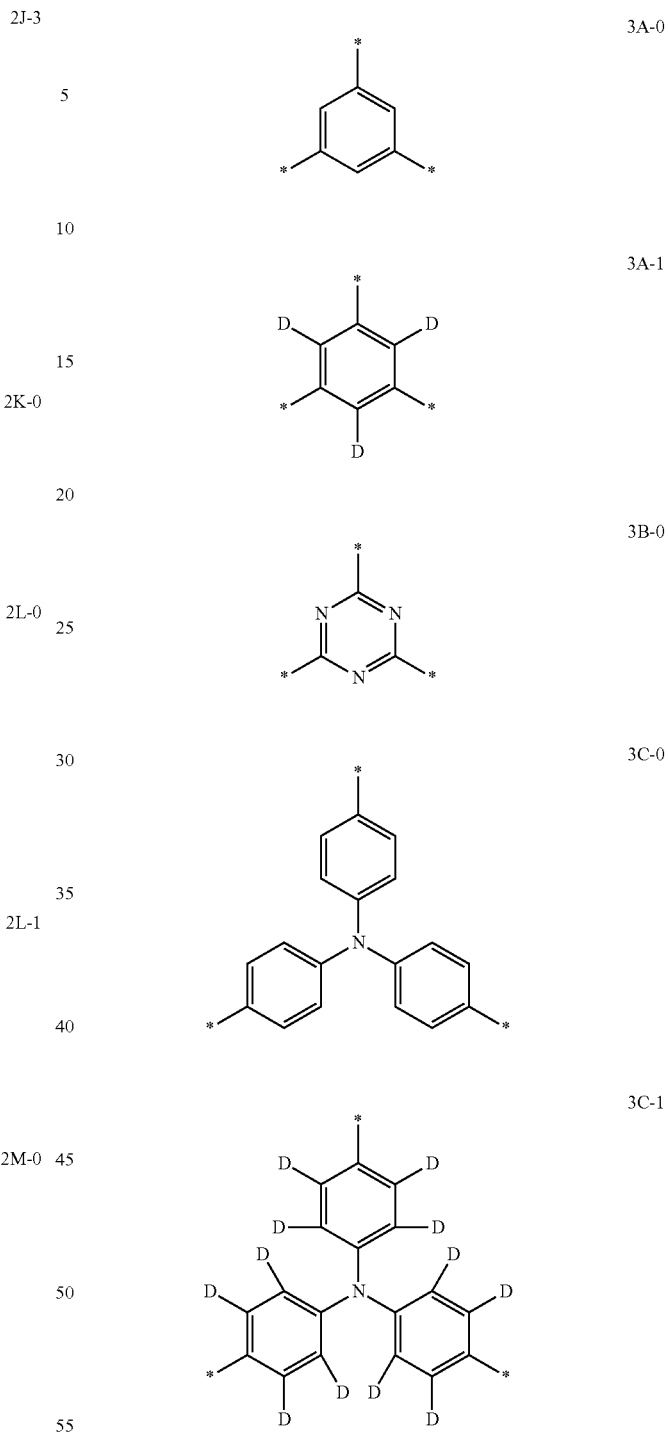

The specific examples of the substituents represented by $R^9$ to which three structures comprising carbazole and $R^1$ to $R^8$ are bonded are shown below, however, the invention is not restricted to these compounds. In the following formulae, is the part to which the nitrogen atom of the carbazole is to be bonded. Incidentally, the combinations of the above (a-0) to (k-0) (not containing a deuterium atom) and the following (3A-0) to (3C-0) (not containing a deuterium atom) do not satisfy formula (I), but similar combinations of both groups other than the above satisfy formula (I).

The specific examples of the substituents represented by $R^9$ to which four structures comprising carbazole and $R^1$ to $R^8$ are bonded are shown below, however, the invention is not restricted to these compounds. In the following formulae, * is the part to which the nitrogen atom of the carbazole is to be bonded. Incidentally, the combinations of the above (a-0) to (k-0) (not containing a deuterium atom) and the following (4A-0) to (4C-0) (not containing a deuterium atom) do not satisfy formula (I), but similar combinations of both groups other than the above satisfy formula (I).

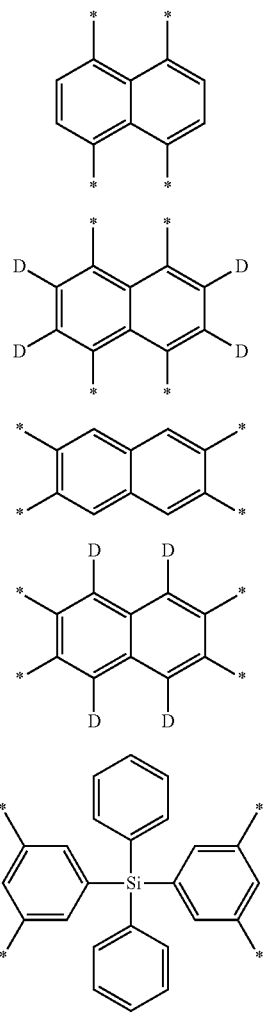

4A-0

4A-1

4B-0

4B-1

4C-0

The specific example of the substituent represented by $R^9$ to which six structures comprising carbazole and $R^1$ to $R^8$ are bonded is shown below, however, the invention is not restricted to the compound. In the following formula, * is the part to which the nitrogen atom of the carbazole is to be bonded. Incidentally, the combinations of the above (a-0) to (k-0) (not containing a deuterium atom) and the following (6A-0) do not satisfy formula (I), but similar combinations of both groups other than the above satisfy formula (I).

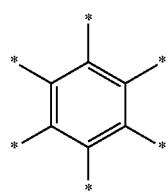

6A-0

In formula (I), at least one of $R^1$ to $R^9$ represents a deuterium atom or a substituent containing a deuterium atom.

In the invention, the fact that at least one of $R^1$ to $R^9$ represents a deuterium atom or a substituent containing a deuterium atom means the ratio of the deuterium atom to the hydrogen atom (atom number of the deuterium atom/atom number of the hydrogen atom) at the position where the deuterium atom is bonded is included in the range of from 100/0 to 1/99.

This means that, as to the compound represented by formula (I), in those the structures of which are the same except for the hydrogen atom and the deuterium atom, those containing the hydrogen atom and those containing the deuterium atom are mixed within the above range at the specific position.

In formula (I), the proportion of the deuterium atom to the hydrogen atom (atom number of deuterium atoms/atom number of hydrogen atoms) is preferably contained in the range of from 100/0 to 1/99, more preferably in the range of from 100/0 to 50/50, and especially preferably in the range of from 100/0 to 80/20.

The range of the proportion of the deuterium atom to the hydrogen atom is preferably from 100/0 to 5/95, more preferably from 100/0 to 50/50, and especially preferably from 100/0 to 80/20.

As for $R^1$ to $R^8$, preferably one or more of $R^1$ to $R^8$ represent a deuterium atom, more preferably two or more of $R^1$ to $R^8$ represent a deuterium atom, and especially preferably all of $R^1$ to $R^8$ represent a deuterium atom.

As for $R^1$ to $R^8$, those that represent a deuterium atom are preferably $R^2$ to $R^7$, more preferably $R^2$, $R^3$, $R^6$ and $R^7$, and especially preferably $R^3$ and $R^6$ represent a deuterium atom.

The compound represented by formula (I) is especially preferably a compound represented by formula (VIII). The compound represented by formula (VIII) will be described below.

Formula (VIII)

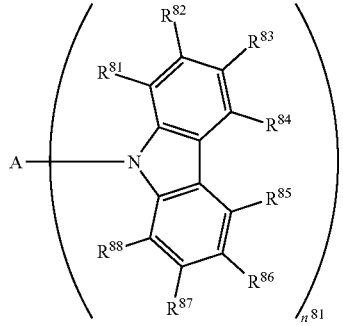

In formula (VIII), $R^{81}$ to $R^{88}$ each represents a hydrogen atom or a substituent, and contiguous substituents of $R^{81}$ to $R^{88}$ may be bonded to each other to form a condensed ring; A represents a linking group; and $n^{81}$ represents an integer of from 2 to 6. The compound represented by formula (VIII) contains at least one deuterium atom.

$R^{81}$ to $R^{88}$ respectively have the same meaning as $R^1$ to $R^8$ described above, and the preferred ranges are also the same. Here, the corresponding relationship between $R^{81}$ to $R^{88}$ and $R^1$ to $R^8$ means that the number of units of the former is in corresponding relationship with the number of the latter group. Other similar corresponding relationship has the same meaning.

$n^{81}$ is preferably from 2 to 4, more preferably 2 or 3, and especially preferably 2.

The linking group represented by A is preferably alkylene, arylene, hetero-arylene, or silylene, more preferably arylene or hetero-arylene, and especially preferably arylene. These linking groups may further be substituted with, e.g., the substituent represented by R.

The linking group represented by A also includes those described above in (2A-0) to (6A-0) (those not containing a deuterium atom and those containing a deuterium atom).

The arylene is preferably phenylene, naphthylene, biphenylene, or terphenylene, more preferably phenylene or biphenylene, and especially preferably phenylene.

The phenylene is preferably 1,2,3,4,5,6-hexa-substituted phenylene, 1,2,4,5-tetra-substituted phenylene, 1,3,5-tri-substituted phenylene, 1,2-di-substituted phenylene, 1,3-di-substituted phenylene, or 1,4-di-substituted phenylene, more preferably 1,2-di-substituted phenylene, 1,3-di-substituted phenylene, or 1,4-di-substituted phenylene, and especially preferably 1,3-di-substituted phenylene or 1,4-di-substituted phenylene. In the case of tri-substitution or higher substitution, the substituent represented by $R^1$ may be substituted besides carbazole.

In the compound represented by formula (VIII), to contain a deuterium atom means that the ratio of the deuterium atom to the hydrogen atom (atom number of deuterium atoms/atom number of hydrogen atoms) at the position where the deuterium atom is bonded is included in the range of from 100/0 to 1/99.

The range of the ratio of the deuterium atom to the hydrogen atom is preferably from 100/0 to 5/95, more preferably from 100/0 to 50/50, and especially preferably from 100/0 to 80/20.

The compound represented by formula (I) of the invention may be a low molecular weight compound, or may be an oligomer compound, or may be a polymer compound having the structure represented by formula (I) in the main chain or side chain (mass average molecular weight (in terms of polystyrene) is preferably from 1,000 to 5,000,000, more preferably from 2,000 to 1,000,000, and still more preferably from 3,000 to 100,000). The compound represented by formula (I) is preferably a low molecular weight compound.

In the case where the compound represented by formula (I) of the invention is an oligomer compound, or a polymer compound having the structure represented by formula (I) in the main chain or side chain, and when the structure is contained in the main chain, it is preferred that two or more of $R^1$ to $R^9$ are contained, more preferably two or more of $R^3$, $R^6$ and $R^9$ are contained, and especially preferably $R^3$ and $R^6$ are contained. When the structure is contained in the side chain, it is preferred that any of $R^1$ to $R^9$ is contained, more preferably any of $R^3$, $R^6$ and $R^9$ is contained, and especially preferably $R^9$ is contained.

In the invention, the use of the compound represented by formula (I) of the invention is not restricted, and may be contained in any layer of the organic layers. The compound represented by formula (I) of the invention is preferably contained in any of a light-emitting layer, a hole injecting layer, a hole transporting layer, an electron transporting layer, an electron injecting layer, an exciton blocking layer, and a charge blocking layer, or two or more of these layers.

The compound represented by formula (I) of the invention is preferably contained in a light-emitting layer, a hole-injecting layer or a hole-transporting layer in view of having charge of injection and transportation of positive holes, and especially preferably contained in a light-emitting layer from the viewpoint of the stability of the material to the excitation state generating by recombination of the positive holes and electrons.

It is preferred in the invention for the compound represented by formula (I) to be contained in either a light-emitting layer or the layer contiguous to the light-emitting layer, and the compound represented by formula (I) may be contained in both layers of a light-emitting layer and the layer contiguous to the light-emitting layer.

It is preferred that the compound represented by formula (I) of the invention is contained in a light-emitting layer in an amount of from 1 to 100 mass %, more preferably from 50 to 100 mass %, and still more preferably from 80 to 100 mass %.

When the compound represented by formula (I) of the invention is contained in layers other than a light-emitting layer, it is preferred for the compound to be contained in an amount of from 1 to 100 mass %, more preferably from 50 to 100 mass %, and still more preferably from 80 to 100 mass %.

The specific examples of the compounds represented by formula (I) are shown below, but the invention is not restricted to these compounds.

For example, exemplified compound (1-1) shows the combination of (a-1) and (2F-0), and exemplified compound (1-6) shows the combination of (a-4) and (2F-3).

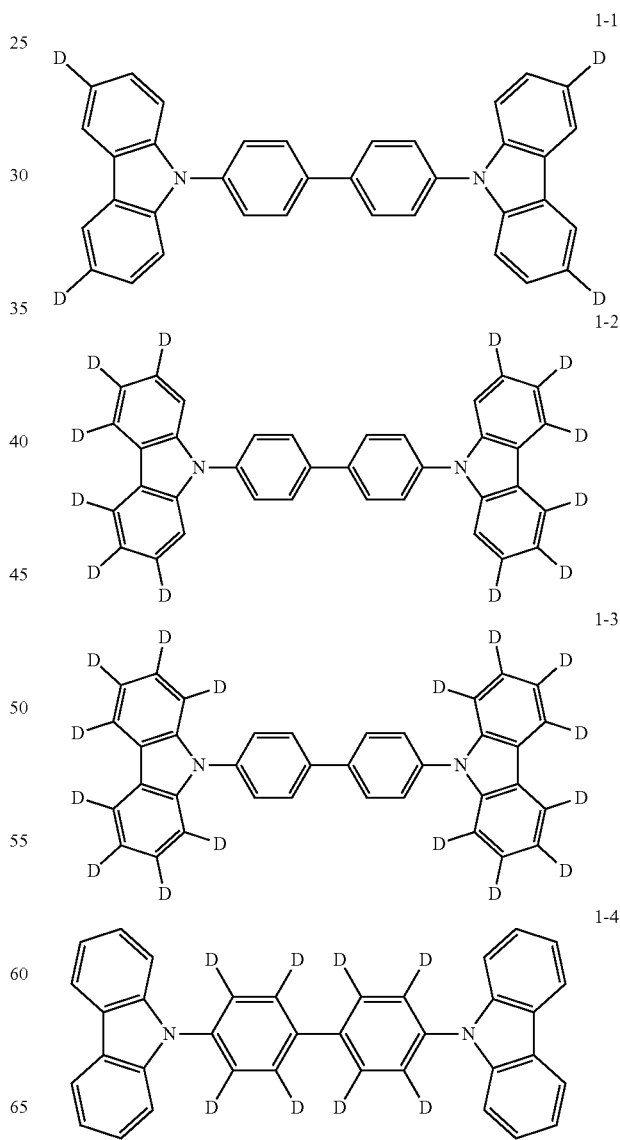

1-5
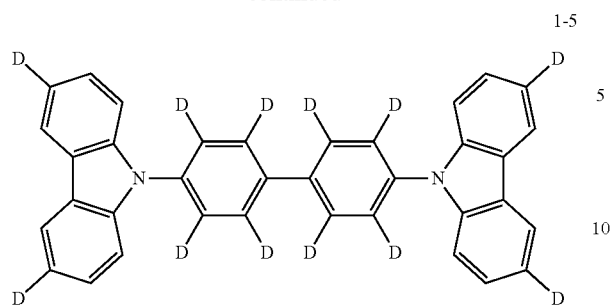
1-6
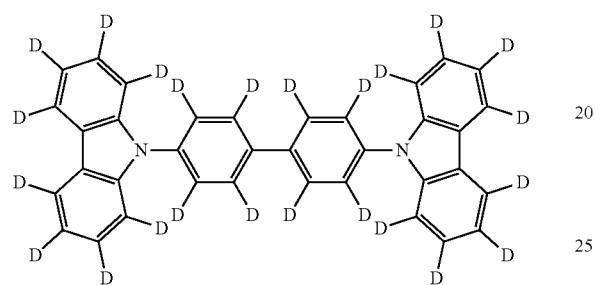
2-1
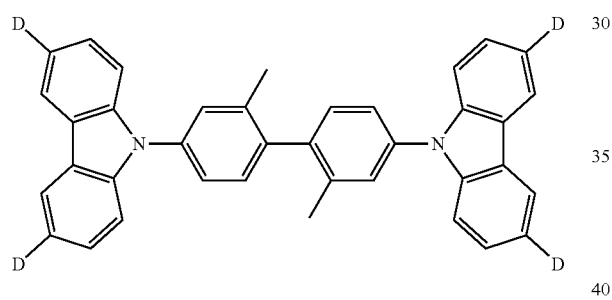
2-2
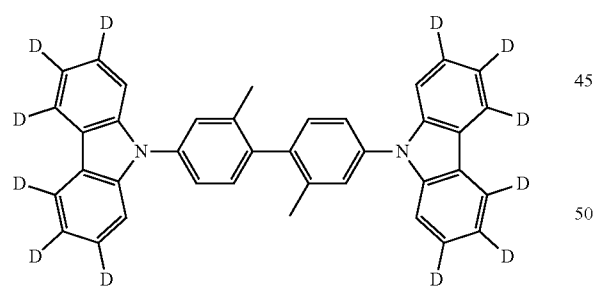
2-3
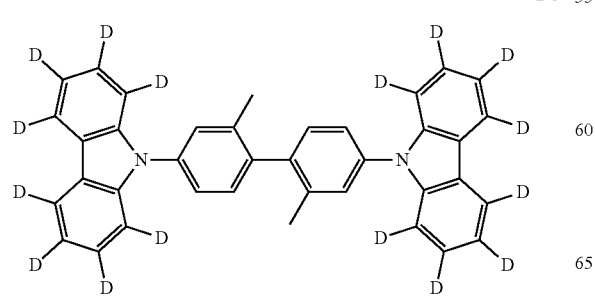
2-4
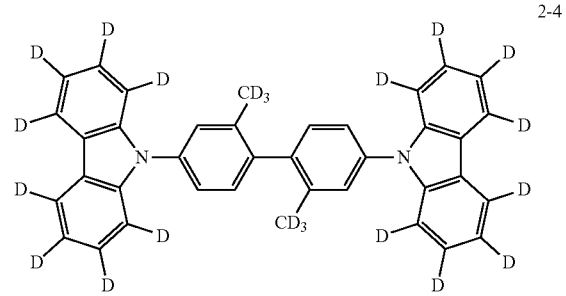
2-5
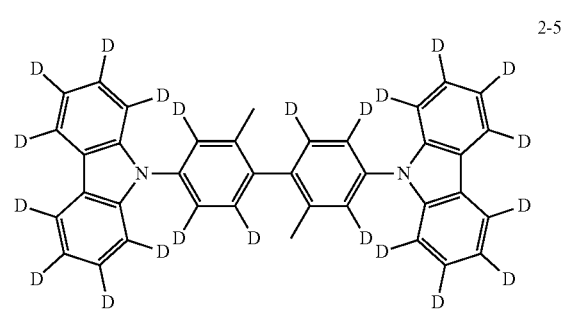
2-6
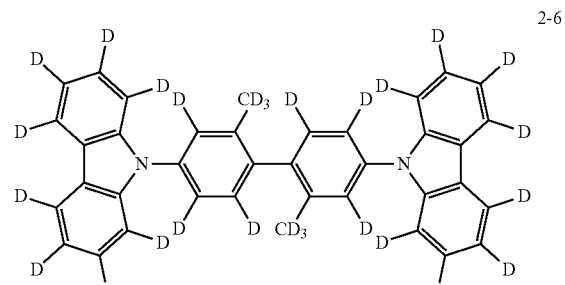
3-1
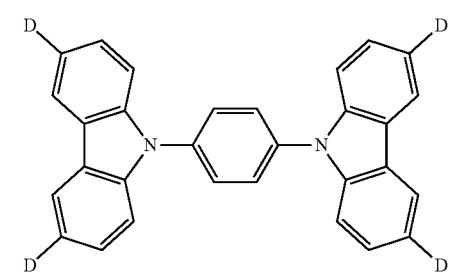
3-2
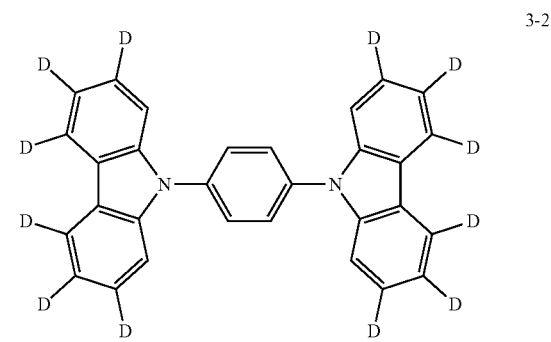

3-3 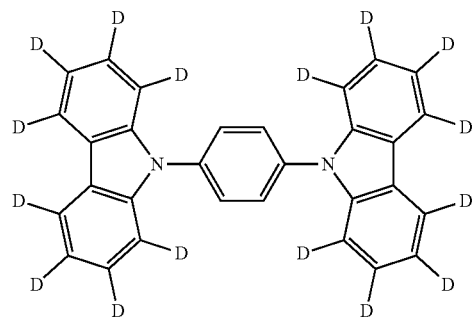
3-4 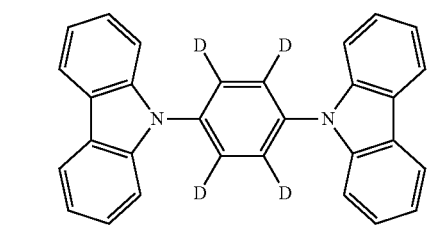
3-5 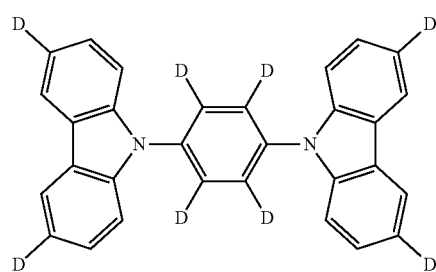
3-6 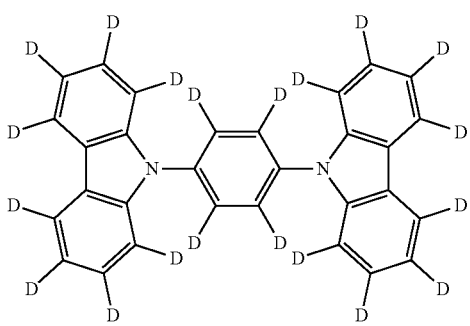
4-1 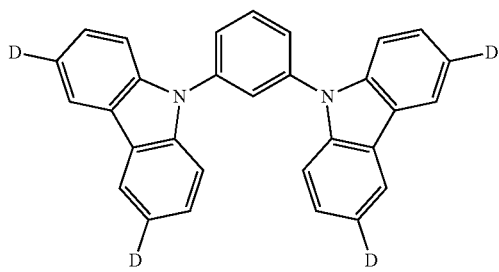
4-2 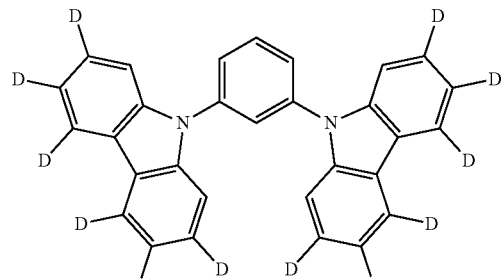
4-3 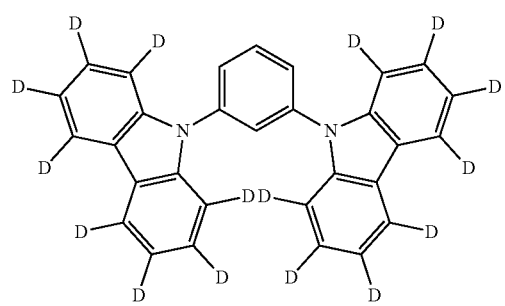
4-4 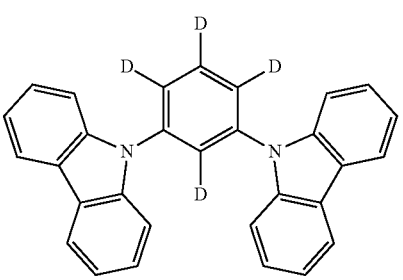
4-5 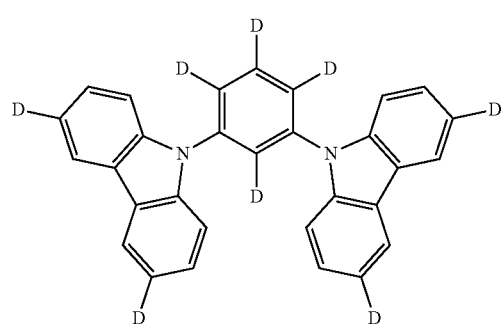
4-6 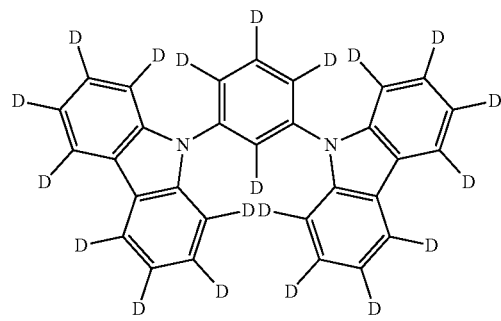

-continued
5-1
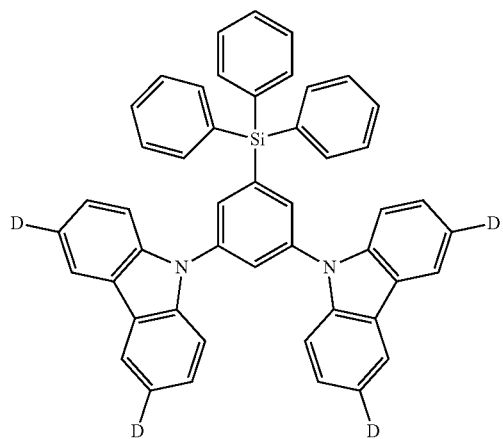
5-2
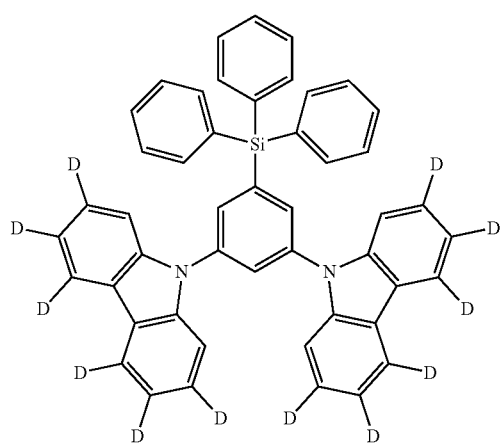
5-3
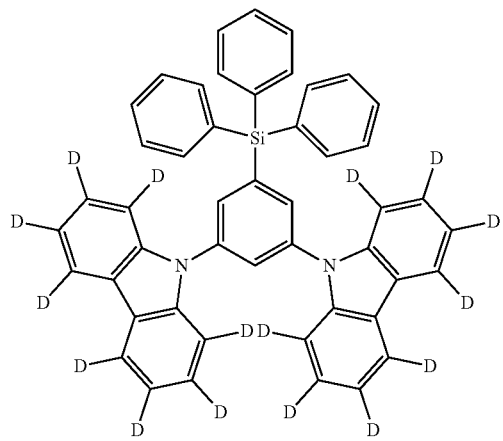
5-4
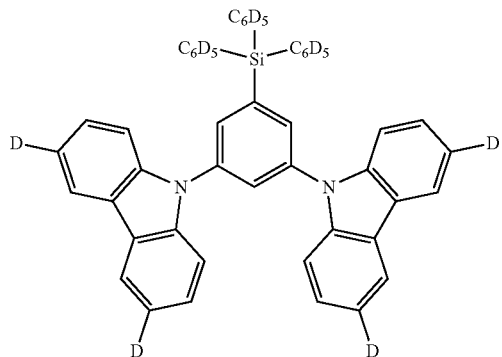
5-5
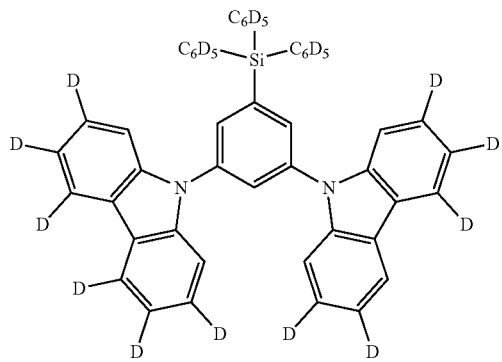
5-6
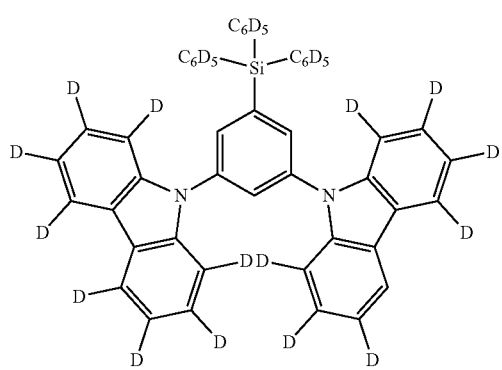
6-1
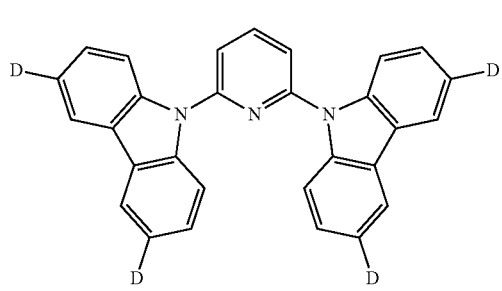

6-2
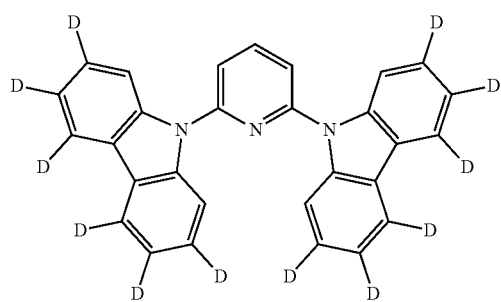
6-3
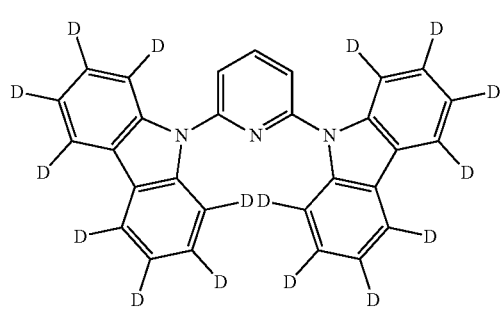
6-4
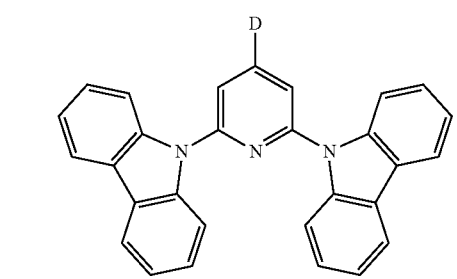
6-5
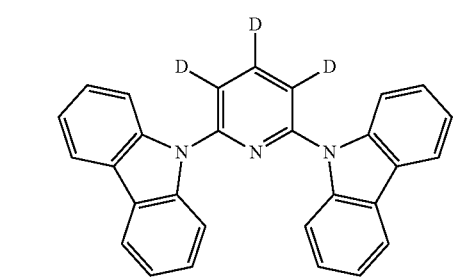
6-6
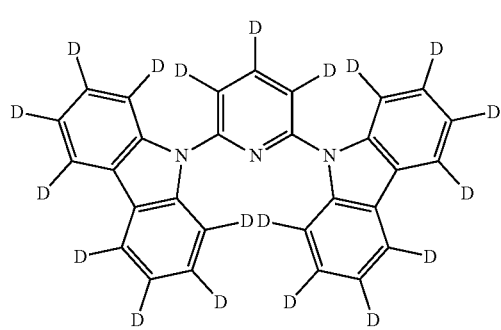
7-1
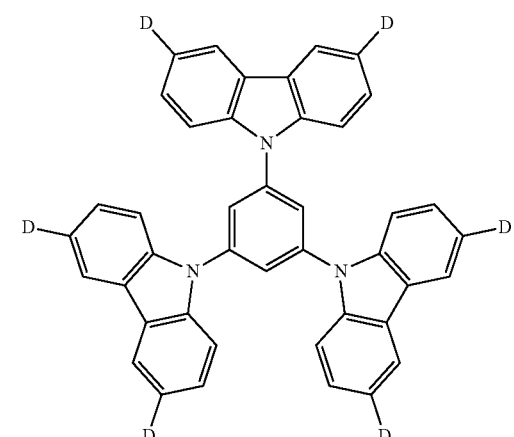
7-2
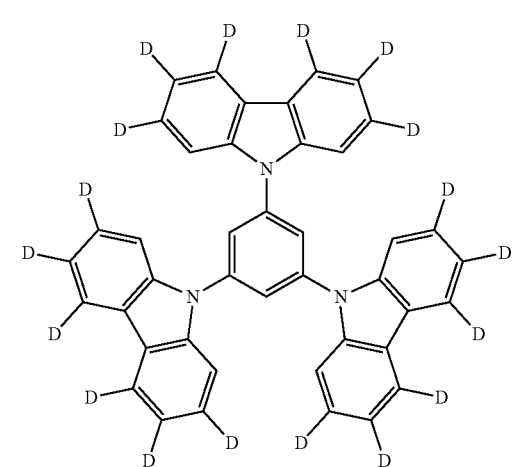
7-3
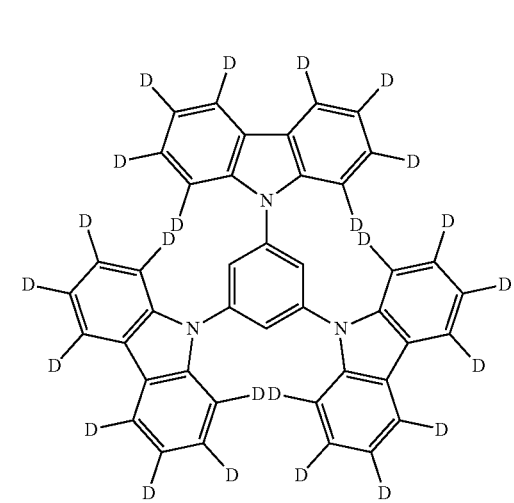

45
-continued
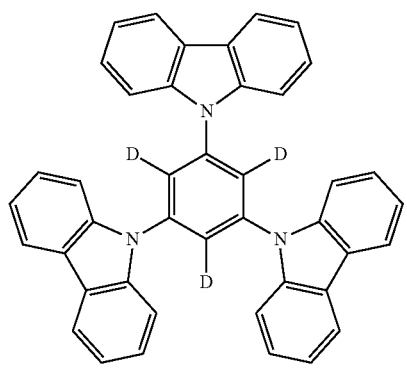
7-4
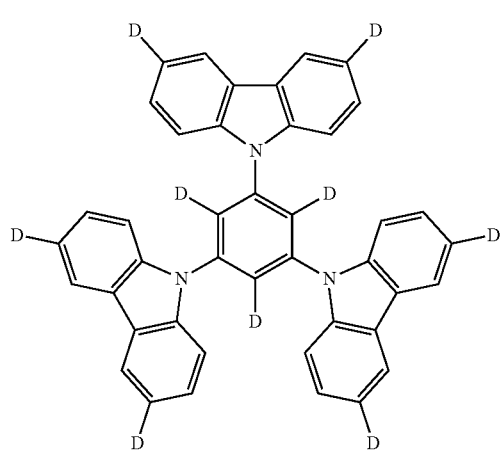
7-5
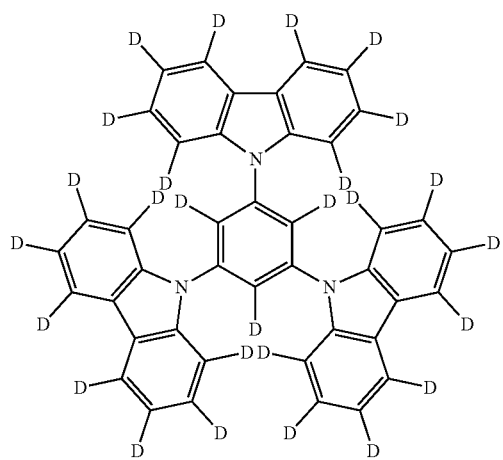
7-6
46
-continued
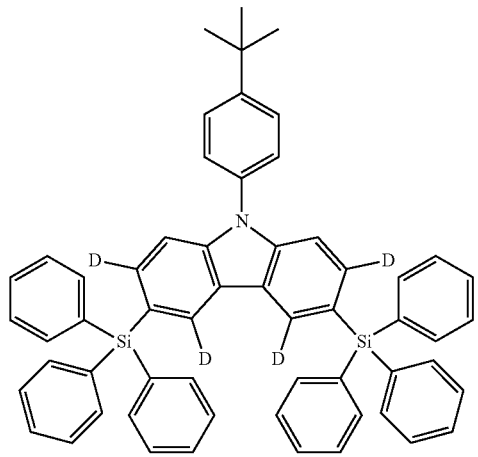
8-1
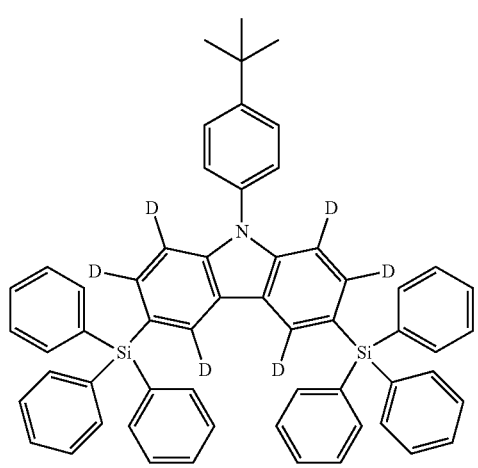
8-2
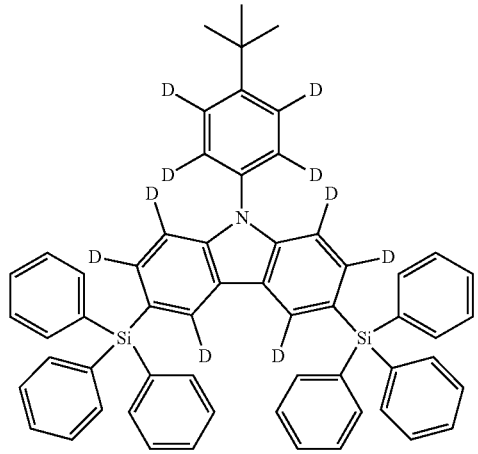
8-3

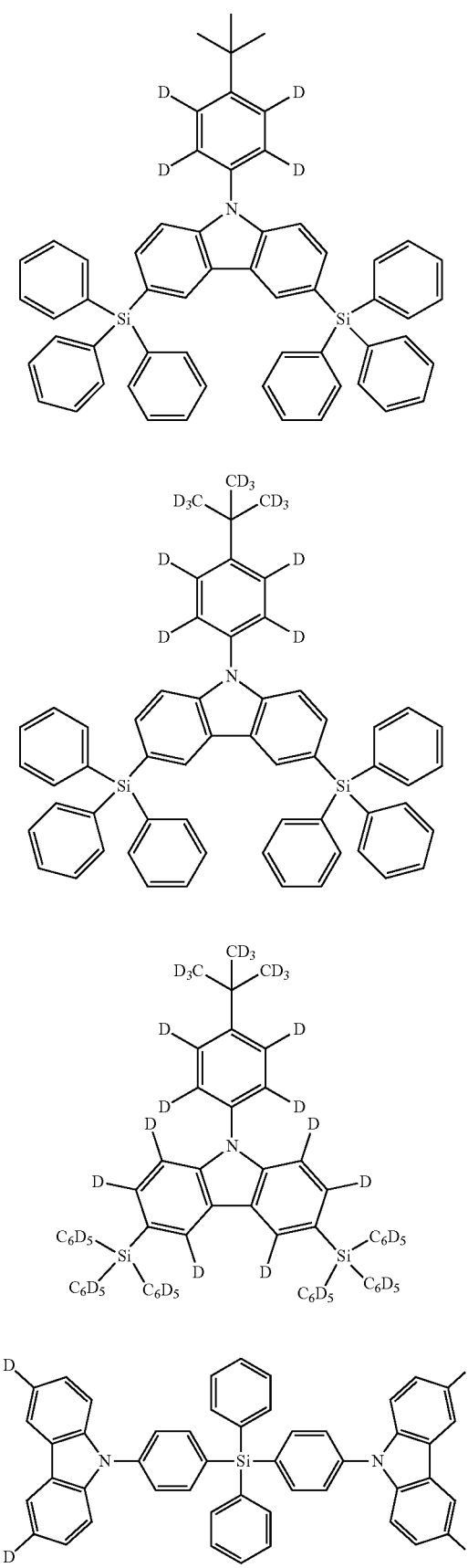

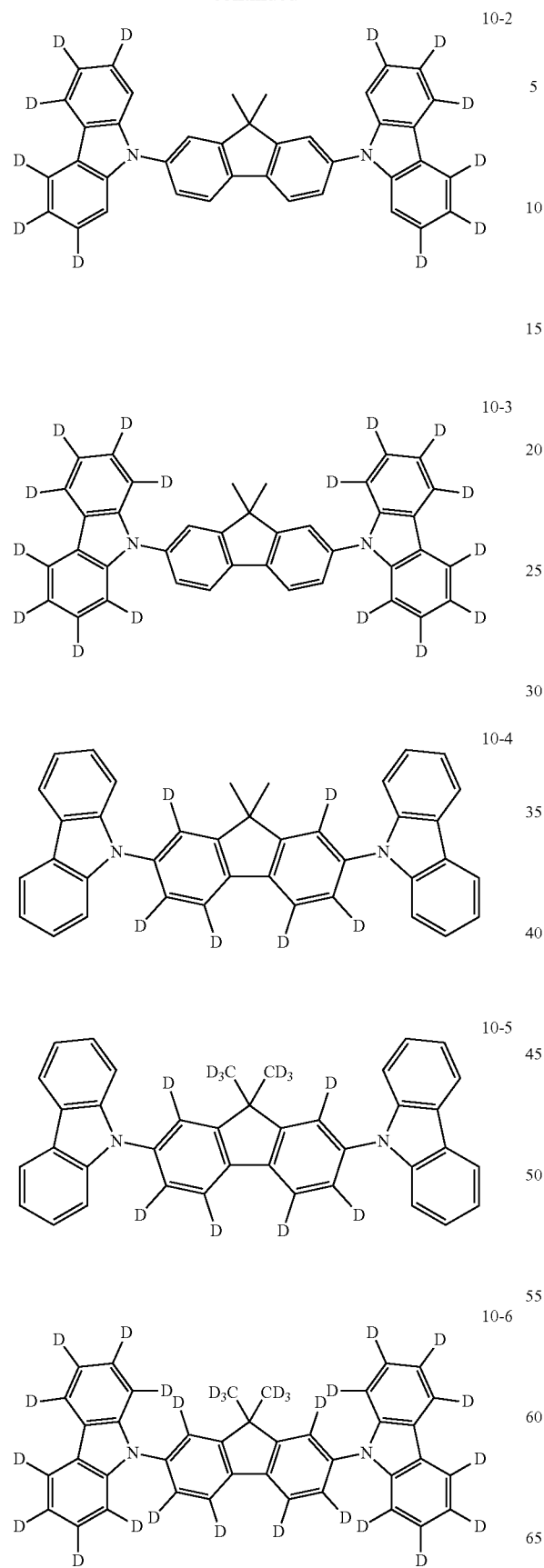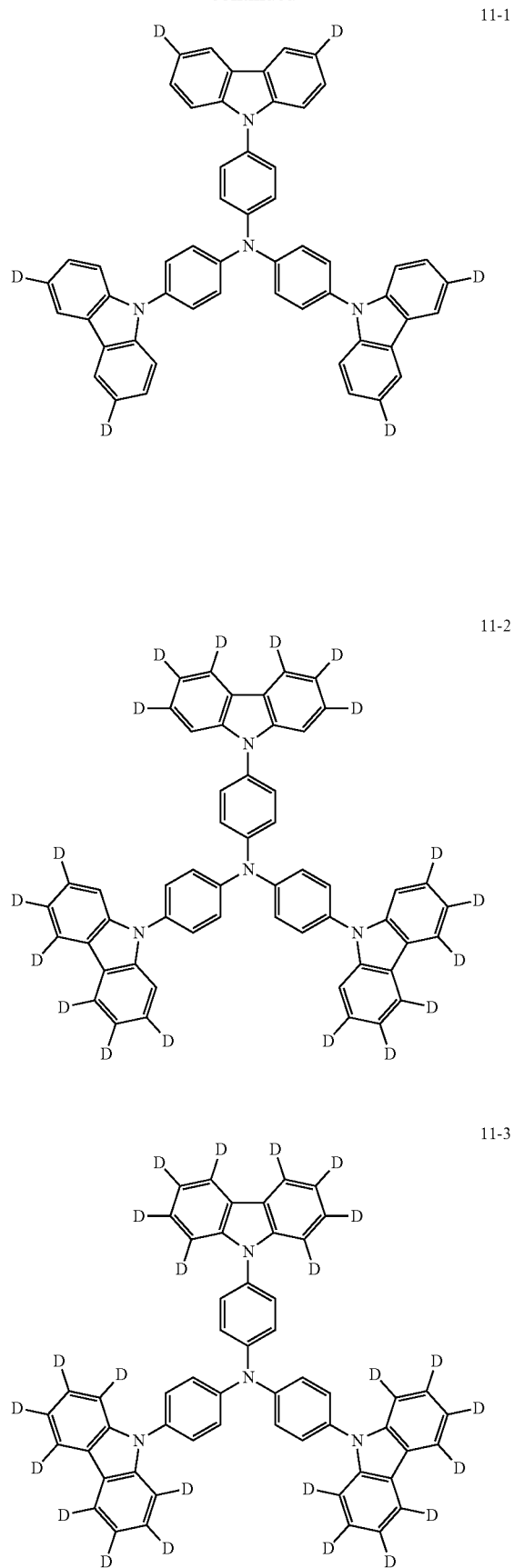

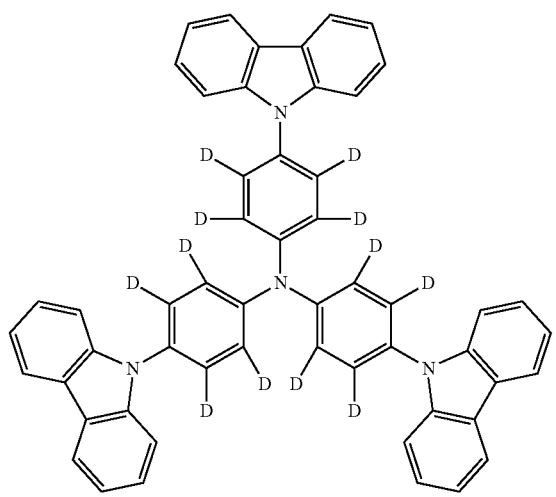
11-4
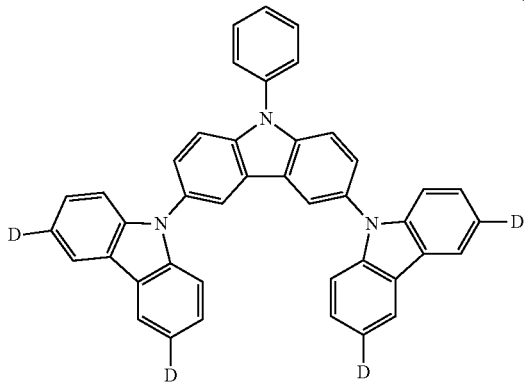
12-1
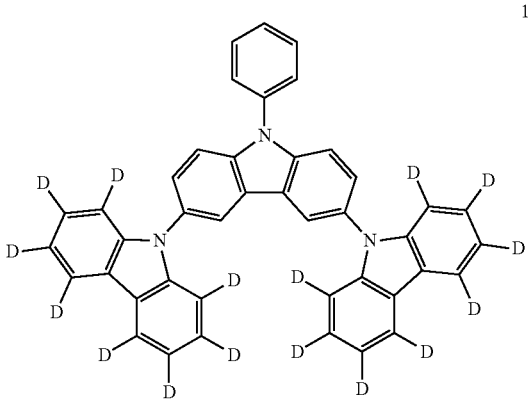
12-2
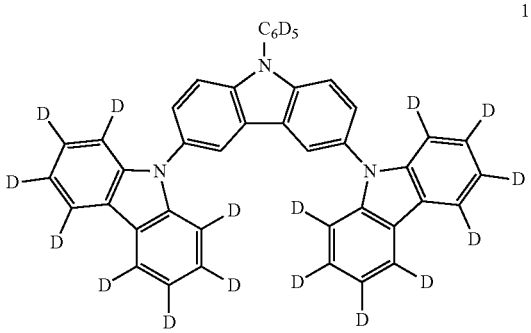
12-3
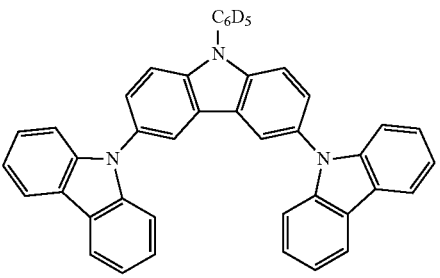
12-4

12-5
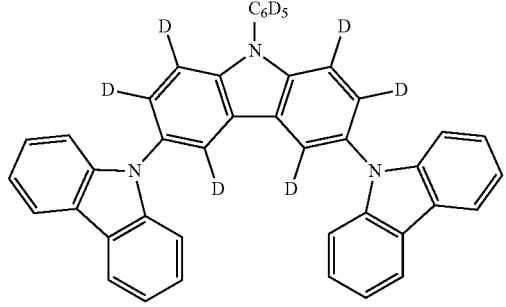
12-6
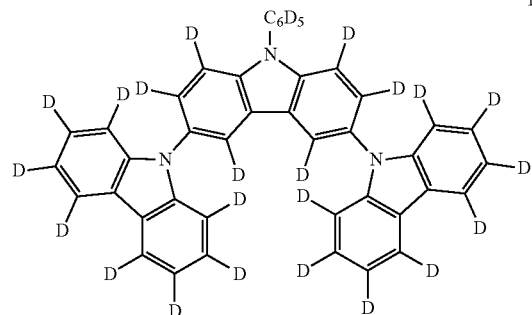
14-1
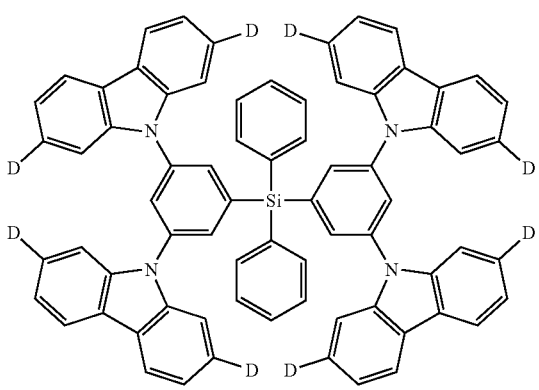
14-2
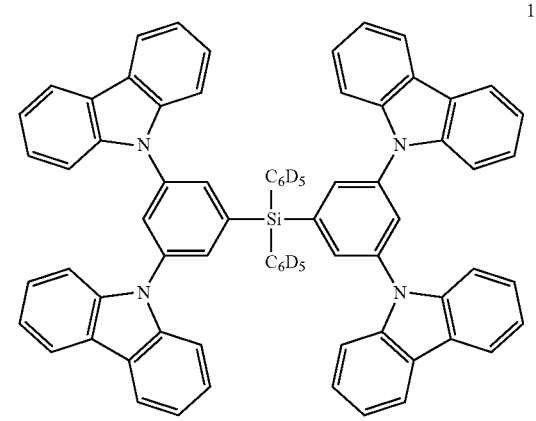
14-3
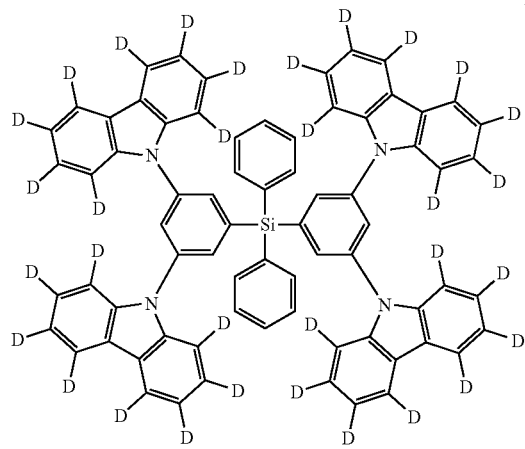
14-4
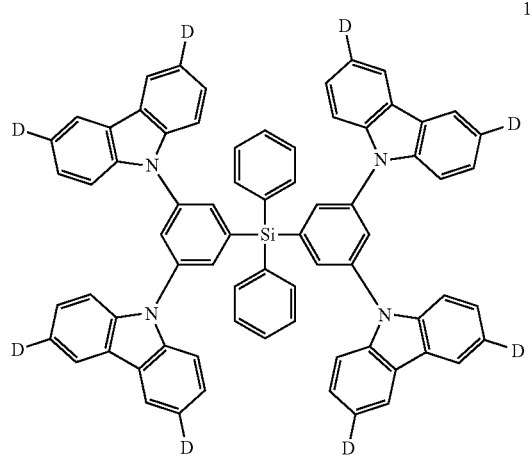
14-5
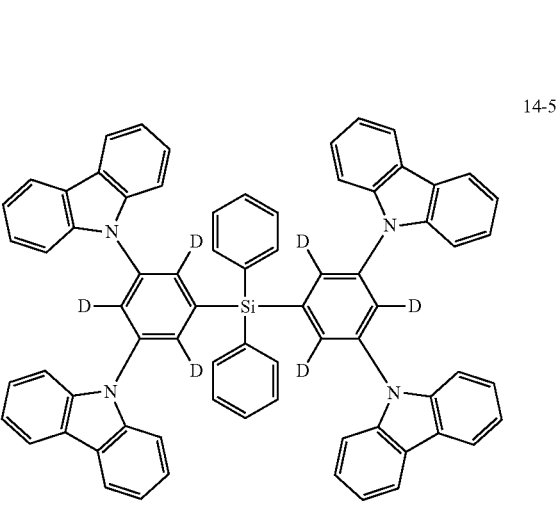

14-6
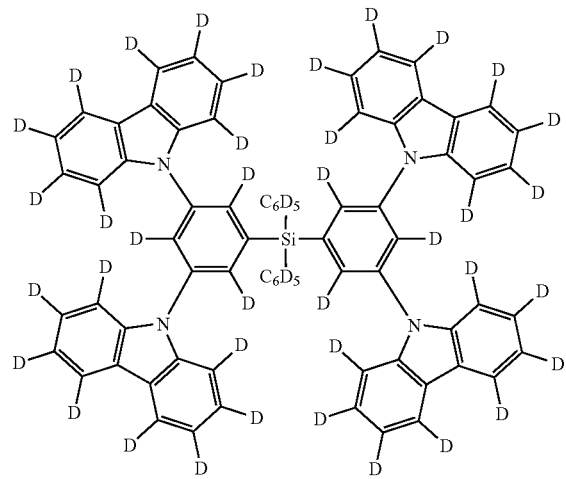
15-1
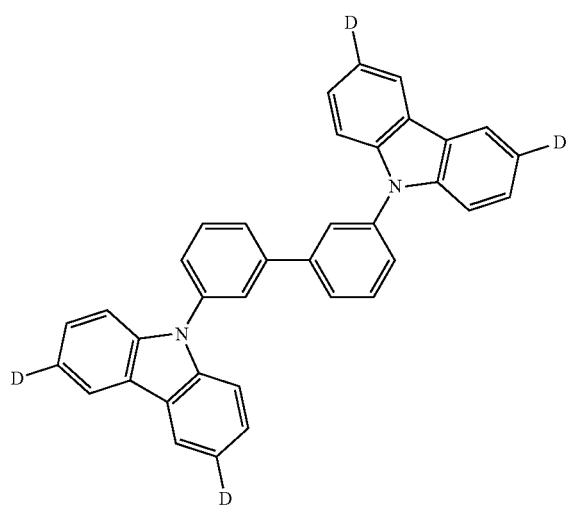
15-2
15-3
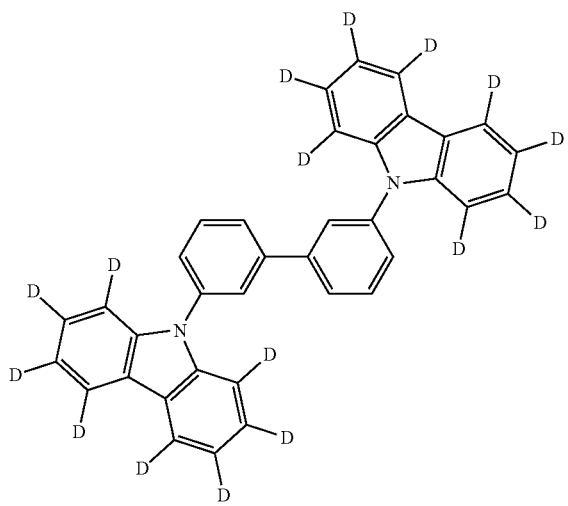
15-4
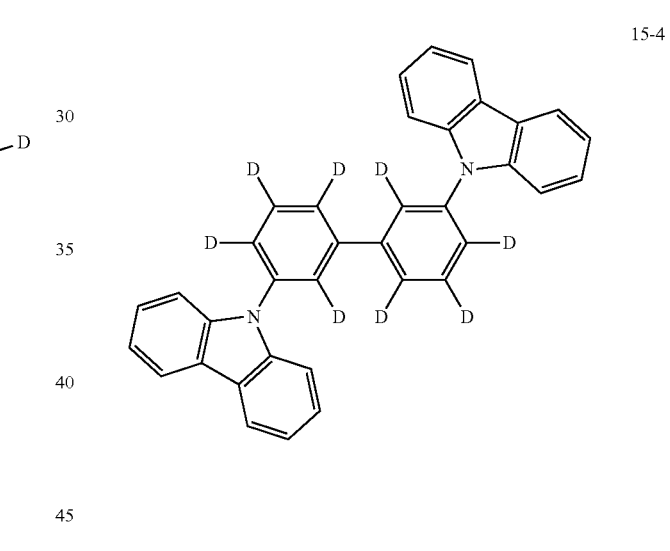
15-5
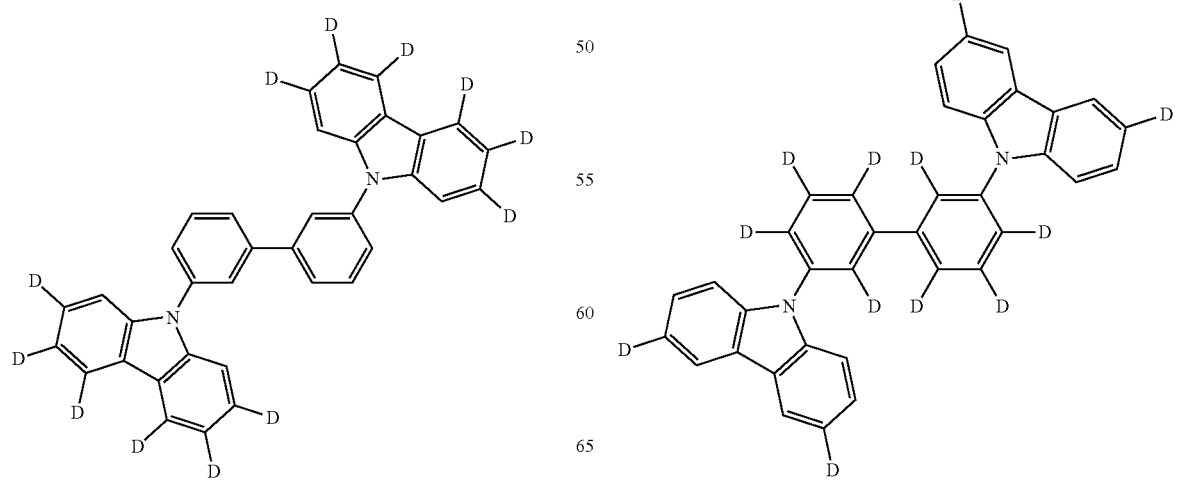

15-6

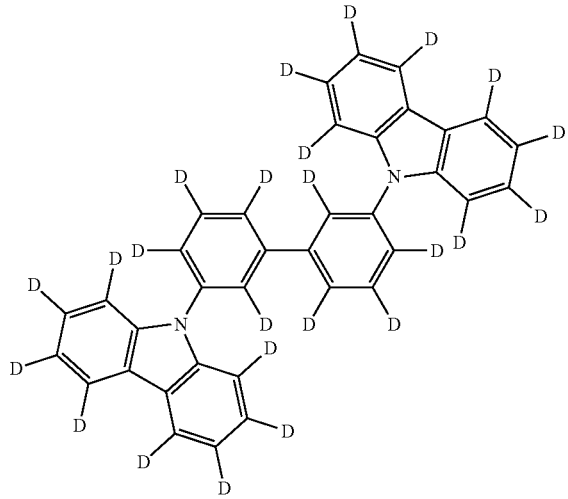

The specific examples of a polymer compound and an oligomer compound containing the compound represented by formula (I) are shown below, but the invention is not restricted to these compounds. The polymer compound may be a homopolymer compound or may be a copolymer, and the copolymer may be any of a random copolymer, an alternating copolymer, and a block copolymer. In the formulae, m/n means the molar ratio of each monomer contained in the polymer, and m is an integer of from 1 to 100, n is from 0 to 99, and the sum of m and n is 100.

13-1

13-2

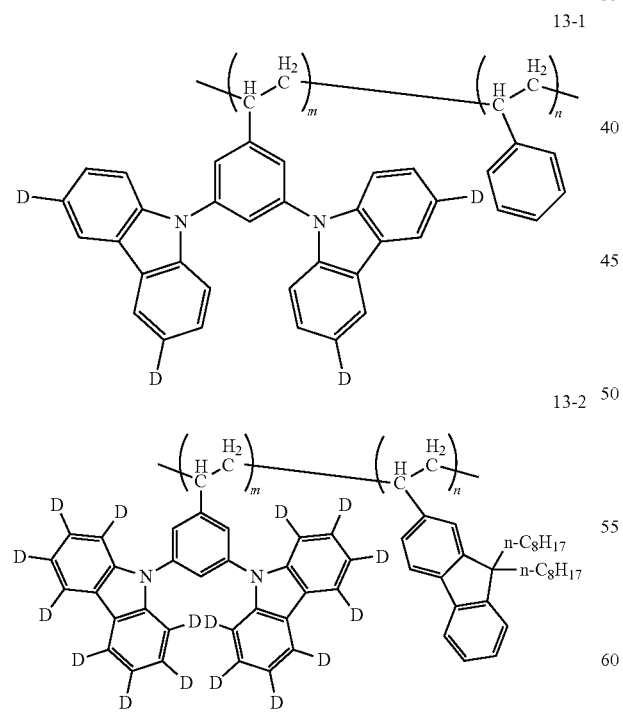

The compound containing a deuterium atom represented by formula (I) can be synthesized according to various known methods. For example, the hydrogen atoms in the compound represented by formula (I) can be converted to deuterium atoms using the methods disclosed in JP-A-2004-11400 and JP-A-2004-46066. Further, the compound containing a deuterium atom represented by formula (I) of the invention can be synthesized with materials containing deuterium atoms. As the materials containing deuterium atoms, specifically bibromobenzene-d5 (CAS No. 4165-57-5), methyl iodide-d3 (CAS No. 865-50-9), resorcinol-d6 that can be synthesized according to the method described in J. Am. Chem. Soc., Vol. 126, No. 40, item 13033-03043 (2004), and sulfonic acid esters thereof are exemplified.

As the light-emitting material, an iridium complex phosphorescent material is used in the invention, but other phosphorescent materials may be used in combination.

By the use of an iridium complex phosphorescent material, the effect of the improvement of efficiency and durability can be obtained.

As iridium complex phosphorescent materials, an iridium complex containing a ligand bonding to an iridium atom via carbene, an iridium complex containing a ligand bonding to an iridium atom via the nitrogen atom of a pyrazole structure, and an iridium complex containing a ligand bonding to an iridium atom via the nitrogen atom of a pyridine structure are very preferred, an iridium complex containing a ligand bonding to an iridium atom via carbene and an iridium complex containing a ligand bonding to an iridium atom via the nitrogen atom of a pyrazole structure are more preferred, and an iridium complex containing a ligand bonding to an iridium atom via the nitrogen atom of a pyrazole structure is especially preferred.

That a ligand and an iridium atom bond together means that the bond between the ligand and the iridium atom may be any of a covalent bond, a coordinate bond and an ionic bond.

As the carbenes to coordinate to an iridium atom, carbon monoxide, an isonitrile group and carbon carbenes stabilized with a hetero atom are exemplified.

As the iridium complex phosphorescent material containing a ligand bonding to an iridium atom via carbene, an iridium complex represented by the following formula (II) is preferred.

Formula (II) will be described below.

Formula (II)

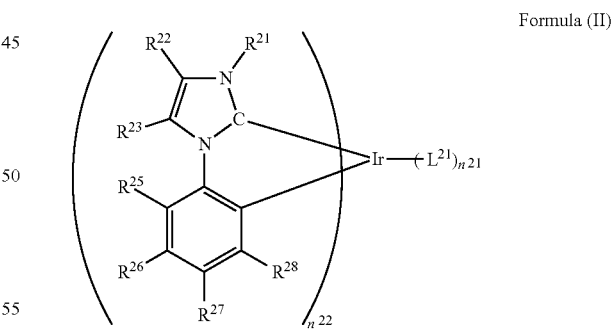

In formula (II), $R^{21}$ to $R^{23}$ and $R^{25}$ to $R^{28}$ each represents a hydrogen atom or a substituent; $L^{21}$ represents a ligand; $n^{22}$ represents an integer of from 1 to 3; $n^{21}$ represents an integer of from 0 to 4; and C represents a carbene carbon coordinating to iridium.

$R^{21}$ to $R^{23}$ and $R^{25}$ to $R^{28}$ each represents a hydrogen atom or a substituent. The examples of the substituent include, e.g., an alkyl group (preferably having from 1 to 30 carbon atoms, more preferably from 1 to 20 carbon atoms, and especially preferably from 1 to 10 carbon atoms, e.g., methyl, ethyl, isopropyl, tert-butyl, n-octyl, n-decyl, n-hexadecyl, cyclopropyl, cyclopentyl, cyclohexyl, etc., are exemplified), an alkenyl group (preferably having from 2 to 30 carbon atoms, more preferably from 2 to 20 carbon atoms, and especially preferably from 2 to 10 carbon atoms, e.g., vinyl, allyl, 2-butenyl, 3-pentenyl, etc., are exemplified), an alkynyl group (preferably having from 2 to 30 carbon atoms, more preferably from 2 to 20 carbon atoms, and especially preferably from 2 to 10 carbon atoms, e.g., propargyl, 3-pentynyl, etc., are exemplified), an aryl group (preferably having from 6 to 30 carbon atoms, more preferably from 6 to 20 carbon atoms, and especially preferably from 6 to 12 carbon atoms, e.g., phenyl, p-methylphenyl, naphthyl, anthranyl, etc., are exemplified), an amino group (preferably having from 0 to 30 carbon atoms, more preferably from 0 to 20 carbon atoms, and especially preferably from 0 to 10 carbon atoms, e.g., amino, methylamino, dimethylamino, diethylamino, dibenzylamino, diphenylamino, ditolylamino, etc., are exemplified), an alkoxyl group (preferably having from 1 to 30 carbon atoms, more preferably from 1 to 20 carbon atoms, and especially preferably from 1 to 10 carbon atoms, e.g., methoxy, ethoxy, butoxy, 2-ethylhexyloxy, etc., are exemplified), an acyloxy group (preferably having from 6 to 30 carbon atoms, more preferably from 6 to 20 carbon atoms, and especially preferably from 6 to 12 carbon atoms, e.g., phenyloxy, 1-naphthyloxy, 2-naphthyloxy, etc., are exemplified), a heterocyclic oxy group (preferably having from 1 to 30 carbon atoms, more preferably from 1 to 20 carbon atoms, and especially preferably from 1 to 12 carbon atoms, e.g., pyridyloxy, pyrazyloxy, pyrimidyloxy, quinolyloxy, etc., are exemplified), an acyl group (preferably having from 2 to 30 carbon atoms, more preferably from 2 to 20 carbon atoms, and especially preferably from 2 to 12 carbon atoms, e.g., acetyl, benzoyl, formyl, pivaloyl, etc., are exemplified), an alkoxycarbonyl group (preferably having from 2 to 30 carbon atoms, more preferably from 2 to 20 carbon atoms, and especially preferably from 2 to 12 carbon atoms, e.g., methoxycarbonyl, ethoxycarbonyl, etc., are exemplified), an aryloxycarbonyl group (preferably having from 7 to 30 carbon atoms, more preferably from 7 to 20 carbon atoms, and especially preferably from 7 to 12 carbon atoms, e.g., phenyloxycarbonyl, etc., are exemplified), an acyloxy group (preferably having from 2 to 30 carbon atoms, more preferably from 2 to 20 carbon atoms, and especially preferably from 2 to 10 carbon atoms, e.g., acetoxy, benzoyloxy, etc., are exemplified), an acylamino group (preferably having from 2 to 30 carbon atoms, more preferably from 2 to 20 carbon atoms, and especially preferably from 2 to 10 carbon atoms, e.g., acetylamino, benzoylamino, etc., are exemplified), an alkoxycarbonylamino group (preferably having from 2 to 30 carbon atoms, more preferably from 2 to 20 carbon atoms, and especially preferably from 2 to 12 carbon atoms, e.g., methoxycarbonyl-amino, etc., are exemplified), an aryloxycarbonylamino group (preferably having from 7 to 30 carbon atoms, more preferably from 7 to 20 carbon atoms, and especially preferably from 7 to 12 carbon atoms, e.g., phenyloxycarbonylamino, etc., are exemplified), a sulfonylamino group (preferably having from 1 to 30 carbon atoms, more preferably from 1 to 20 carbon atoms, and especially preferably from 1 to 12 carbon atoms, e.g., methanesulfonylamino, benzenesulfonylamino, etc., are exemplified), a sulfamoyl group (preferably having from 0 to 30 carbon atoms, more preferably from 0 to 20 carbon atoms, and especially preferably from 0 to 12 carbon atoms, e.g., sulfamoyl, methylsulfamoyl, dimethylsulfamoyl, phenylsulfamoyl, etc., are exemplified), a carbamoyl group (preferably having from 1 to 30 carbon atoms, more preferably from 1 to 20 carbon atoms, and especially preferably from 1 to 12 carbon atoms, e.g., carbamoyl, methylcarbamoyl, diethylcarbamoyl, phenylcarbamoyl, etc., are exemplified), an alkylthio group (preferably having from 1 to 30 carbon atoms, more preferably from 1 to 20 carbon atoms, and especially preferably from 1 to 12 carbon atoms, e.g., methylthio, ethylthio, etc., are exemplified), an arylthio group (preferably having from 6 to 30 carbon atoms, more preferably from 6 to 20 carbon atoms, and especially preferably from 6 to 12 carbon atoms, e.g., phenylthio, etc., are exemplified), a heterocyclic thio group (preferably having from 1 to 30 carbon atoms, more preferably from 1 to 20 carbon atoms, and especially preferably from 1 to 12 carbon atoms, e.g., pyridylthio, 2-benzimizolylthio, 2-benzoxazolylthio, 2-benzo-thiazolylthio, etc., are exemplified), a sulfonyl group (preferably having from 1 to 30 carbon atoms, more preferably from 1 to 20 carbon atoms, and especially preferably from 1 to 12 carbon atoms, e.g., mesyl, tosyl, etc., are exemplified), a sulfinyl group (preferably having from 1 to 30 carbon atoms, more preferably from 1 to 20 carbon atoms, and especially preferably from 1 to 12 carbon atoms, e.g., methanesulfinyl, benzenesulfinyl, etc., are exemplified), a ureido group (preferably having from 1 to 30 carbon atoms, more preferably from 1 to 20 carbon atoms, and especially preferably from 1 to 12 carbon atoms, e.g., ureido, methylureido, phenylureido, etc., are exemplified), a phosphoric acid amido group (preferably having from 1 to 30 carbon atoms, more preferably from 1 to 20 carbon atoms, and especially preferably from 1 to 12 carbon atoms, e.g., diethylphosphoric acid amido, phenylphosphoric acid amido, etc., are exemplified), a hydroxy group, a mercapto group, a halogen atom (e.g., a fluorine atom, a chlorine atom, a bromine atom, an iodine atom), a cyano group, a sulfo group, a carboxyl group, a nitro group, a hydroxamic acid group, a sulfino group, a hydrazino group, an imino group, a heterocyclic group (preferably having from 1 to 30 carbon atoms, and more preferably from 1 to 12 carbon atoms, and as the hetero atoms, e.g., a nitrogen atom, an oxygen atom, a sulfur atom are exemplified, specifically, e.g., imidazolyl, pyridyl quinolyl, furyl, thienyl, piperidyl, morpholino, benzoxazolyl, benzimidazolyl, benzothiazolyl, carbazolyl, azepinyl, etc., are exemplified), a silyl group (preferably having from 3 to 40 carbon atoms, more preferably from 3 to 30 carbon atoms, and especially preferably from 3 to 24 carbon atoms, e.g., trimethylsilyl, triphenylsilyl, etc., are exemplified), a silyloxy group (preferably having from 3 to 40 carbon atoms, more preferably from 3 to 30 carbon atoms, and especially preferably from 3 to 24 carbon atoms, e.g., trimethylsilyloxy, triphenylsilyloxy, etc., are exemplified). The substituents above may be further substituted.

$R^{21}$ and $R^{22}$, or $R^{22}$ and $R^{23}$ may be bonded to each other to form a cyclic structure.

The substituent represented by $R^{21}$ is preferably an alkyl group, an aryl group or a hetero-aryl group, more preferably an alkyl group or an aryl group, and especially preferably a methyl group, a tert-butyl group, a phenyl group, a mesityl group, or a 2-o-xylyl group.

The substituent represented by $R^{22}$ and $R^{23}$ is preferably an alkyl group, an aryl group or a hetero-aryl group, more preferably an alkyl group or an aryl group, and especially preferably a methyl group, a tert-butyl group, or a phenyl group.

The substituent represented by $R^{25}$ to $R^{27}$ is preferably an alkyl group, an aryl group, a hetero-aryl group, a halogen group, or a cyano group, more preferably an alkyl group, an aryl group, a halogen group, or a cyano group, and especially preferably a methyl group, a tert-butyl group, a phenyl group, a fluorine atom, or a cyano group.

$L^{21}$ represents a ligand. As the examples of ligands, the ligands described, for example, in H. Yersin, Photochemistry and Photo-physics of Coordination Compounds, Springer-Verlag (1987), and Akio Yamamoto, Yuki Kinzoku Kagaku-Kiso to Oyo—(Organic Metal Chemistry—Elements and Applications), Shokabo Publishing Co. (1982) are exemplified. The preferred ligands are halogen ligands (preferably a chlorine ligand, a fluorine ligand), nitrogen-containing heterocyclic ligands (e.g., bipyridyl, phenanthroline, phenylpyridine, pyrazolylpyridine, benzimidazolylpyridine, phenylpyrazole, picolinic acid, dipicolinic acid, etc.), diketone ligands, nitrile ligands, CO ligands, isonitrile ligands, phosphorus ligands (e.g., phosphine derivatives, phosphorous acid ester derivatives, phosphinine derivatives, etc.), and carboxylic acid ligands (e.g., acetic acid ligands, etc.), and the more preferred ligands are nitrogen-containing heterocyclic ligands (e.g., bipyridyl, phenanthroline, phenylpyridine, pyrazolylpyridine, benzimidazolylpyridine, and phenylpyrazole).

As the nitrogen-containing heterocyclic rings in the nitrogen-containing heterocyclic ligands, a pyridine ring, a pyrazine ring, a pyrimidine ring, a pyridazine ring, a pyrrole ring, a pyrazole ring, an imidazole ring, a triazole ring, a thiazole ring, an oxazole ring, an oxadiazole ring, a thiadiazole ring, and an azaphosphinine ring are preferred, a pyridine ring, a pyrrole ring, a pyrazole ring, and an imidazole ring are more preferred, and a pyridine ring, a pyrazole ring, and an imidazole ring are still more preferred.

The nitrogen-containing heterocyclic ligands may have a substituent. As the examples of the substituents, the groups as described in $R^{11}$ above are exemplified, e.g., an alkyl group, an aryl group, an alkoxyl group, a fluorine atom, a cyano group, and a substituted amino group are preferred.

$n^{22}$ is preferably 2 or 3, and especially preferably 3. When $n^{21}$ is 2 or 3, a plurality of $L^{21}$ may be the same or different. When $n^{22}$ is 2 or 3, the ligand whose number is determined by $n^{22}$ may be the same or different.

The iridium complex phosphorescent material containing a ligand bonding to an iridium atom via carbene represented by formula (II) is more preferably an iridium complex phosphorescent material represented by the following formula (III).

Formula (III) will be described below.

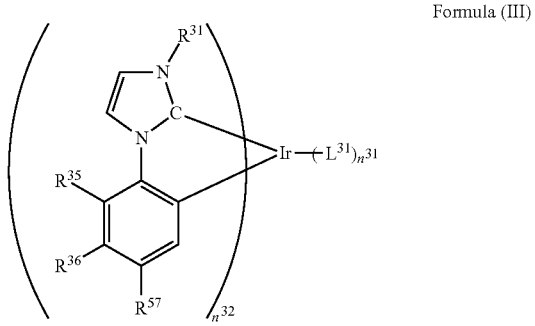

Formula (III)

In formula (III), $R^{31}$ represents an alkyl group or an aryl group; $R^{35}$, $R^{36}$ and $R^{37}$ each represents a hydrogen atom, a fluorine atom, an alkyl group, or a cyano group. $R^{35}$ and $R^{36}$ or $R^{36}$ and $R^{37}$ may be bonded to each other to form a condensed ring structure. $L^{31}$ represents a ligand, $n^{32}$ represents an integer of from 1 to 3, $n^{31}$ represents an integer of from 0 to 4, and C represents a carbene carbon coordinating to iridium.

$R^{31}$ represents an alkyl group or an aryl group, and more preferably represents an alkyl group.

As the alkyl group represented by $R^{31}$, a methyl group, an ethyl group, a tert-butyl group, and a cyclohexyl group are preferred, a methyl group and a tert-butyl group are more preferred, and a methyl group is especially preferred.

As the aryl group represented by $R^{31}$, a phenyl group, a p-methylphenyl group, a 2-xylyl group, a 5-xylyl group, a mesityl group, a 1-naphthyl group, a 2-naphthyl group, and an anthranyl group are preferred, a phenyl group, a p-methylphenyl group, a 2-xylyl group, a 5-xylyl group, and a mesityl group are more preferred, and a phenyl group is especially preferred.

$R^{35}$ and $R^{25}$, $R^{36}$ and $R^{26}$, $R^{37}$ and $R^{27}$ respectively have the same meaning.

$R^{35}$ preferably represents a hydrogen atom, a fluorine atom, an alkyl group, or a cyano group, more preferably a hydrogen atom, a fluorine atom, or a cyano group, and especially preferably represents a fluorine atom.

$R^{36}$ preferably represents a hydrogen atom, a fluorine atom, an alkyl group, or a cyano group, more preferably a hydrogen atom, a fluorine atom, or a cyano group, and especially preferably represents a cyano group.

$R^{37}$ preferably represents a hydrogen atom, a fluorine atom, an alkyl group, or a cyano group, more preferably a fluorine atom or a cyano group, and especially preferably represents a cyano group.

As the alkyl groups represented by $R^{35}$, $R^{36}$ and $R^{37}$, a methyl group, an ethyl group, a tert-butyl group, a cyclohexyl group, a trifluoromethyl group, and a perfluorobutyl group are preferred, a methyl group, a tert-butyl group, a trifluoromethyl group, and a perfluorobutyl group are more preferred, and a trifluoromethyl group is especially preferred.

As the benzo-condensed ring structure formed by $R^{35}$ and $R^{36}$, or $R^{36}$ and $R^{37}$ by bonding to each other, dibenzofuranyl, dibenzothiophenyl, N-phenylcarbazolyl, N-methylcarbazolyl, 9,9-dimethylfluorenyl, N-phenylindolyl, N-methylindolyl, benzothienyl, and 1,1-dimethylindenyl are preferred, dibenzofuryl, dibenzothiophenyl, N-phenylcarbazolyl, N-methylcarbazolyl, and 9,9-dimethylfluorenyl are more preferred, and dibenzofuranyl is especially preferred.

A dibenzofuranyl structure or a dibenzothiophenyl structure formed by $R^{35}$ and $R^{36}$, or $R^{36}$ and $R^{37}$, by bonding to each other is preferably a structure bonding to an oxygen atom or a sulfur atom at the position of $R^{35}$ or $R^{37}$, and especially preferably a structure bonding to an oxygen atom or a sulfur atom at the position of $R^{35}$.

$L^{31}$ has the same meaning as that of $L^{21}$, and the preferred range is also the same.

$n^{31}$ and $n^{21}$, and $n^{32}$ and $n^{22}$ respectively have the same meaning, and the preferred ranges are also the same.

The iridium complex phosphorescent material containing a ligand bonding to an iridium atom via the nitrogen atom of a pyrazole structure is preferably an iridium complex represented by the following formula (IV).

Formula (IV) will be described below.

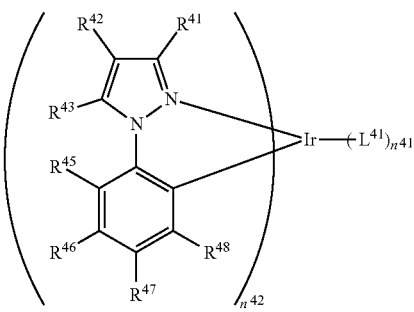

Formula (IV)

In formula (IV), $R^{41}$, $R^{42}$, $R^{43}$, $R^{45}$, $R^{46}$, $R^{47}$ and $R^{48}$ each represents a hydrogen atom or a substituent; $L^{41}$ represents a ligand; $n^{42}$ represents an integer of from 1 to 3; and $n^{41}$ represents an integer of from 0 to 4.

$R^{41}$ to $R^{43}$ and $R^{45}$ to $R^{48}$ have the same meanings as those of $R^{21}$ to $R^{23}$ and $R^{25}$ to $R^{28}$ respectively.

The substituent represented by $R^{41}$ to $R^{43}$ is preferably an alkyl group, an aryl group, or a hetero-aryl group, more preferably an alkyl group or an aryl group, and especially preferably a methyl group, a tert-butyl group, or a phenyl group.

The substituent represented by $R^{45}$ to $R^{47}$ is preferably an alkyl group, an aryl group, a hetero-aryl group, a halogen group, or a cyano group, more preferably an alkyl group, an aryl group, a halogen group, or a cyano group, and especially preferably a methyl group, a tert-butyl group, a phenyl group, a fluorine atom, or a cyano group.

$R^{45}$ and $R^{46}$, or $R^{46}$ and $R^{47}$, may be bonded to each other to form a cyclic structure.

$L^{41}$ has the same meaning as that of $L^{21}$, and the preferred range is also the same.

$n^{41}$ and $n^{21}$, and $n^{42}$ and $n^{22}$, respectively have the same meaning, and the preferred ranges are also the same.

The iridium complex phosphorescent material containing a ligand bonding to an iridium atom via the nitrogen atom of a pyrazole structure represented by formula (IV) is more preferably an iridium complex phosphorescent material represented by the following formula (V).

Formula (V) will be described below.

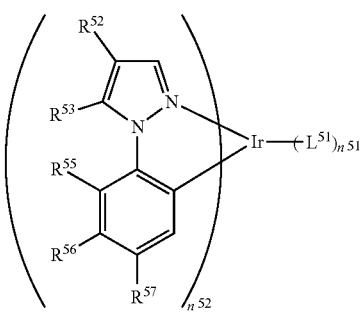

Formula (V)

In formula (V), $R^{52}$ and $R^{53}$ each represents a hydrogen atom, an alkyl group, or an aryl group; $R^{55}$, $R^{56}$ and $R^{57}$ each represents a hydrogen atom, a fluorine atom, an alkyl group, or a cyano group, and $R^{55}$ and $R^{56}$, or $R^{56}$ and $R^{57}$, may be bonded to each other to form a condensed ring structure; $L^{51}$ represents a ligand; $n^{52}$ represents an integer of from 1 to 3; and $n^{51}$ represents an integer of from 0 to 4.

$R^{52}$ and $R^{53}$ each preferably represents a hydrogen atom, an alkyl group, or an aryl group, more preferably a hydrogen atom, a methyl group, a tert-butyl group, or a phenyl group, and especially preferably represents a hydrogen atom.

$R^{55}$ and $R^{35}$, $R^{56}$ and $R^{36}$, $R^{57}$ and $R^{37}$ respectively have the same meaning, and the preferred ranges are also the same.

$L^{51}$ has the same meaning as that of $L^{21}$, and the preferred range is also the same.

$n^{51}$ and $n^{21}$, and $n^{52}$ and $n^{22}$ respectively have the same meaning, and the preferred ranges are also the same.

The iridium complex phosphorescent material containing a ligand bonding to an iridium atom via the nitrogen atom of a pyridine structure is preferably an iridium complex represented by the following formula (VI).

Formula (VI) will be described below.

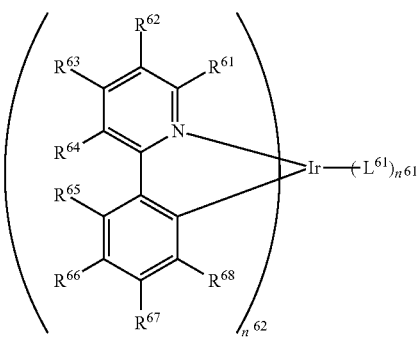

Formula (VI)

In formula (VI), $R^{61}$ to $R^{68}$ each represents a hydrogen atom, or a substituent; $L^{61}$ represents a ligand; $n^{62}$ represents an integer of from 1 to 3; and $n^{61}$ represents an integer of from 0 to 4.

$R^{61}$ to $R^{63}$ and $R^{65}$ to $R^{68}$ have the same meanings as those of $R^{21}$ to $R^{23}$ and $R^{25}$ to $R^{28}$ respectively. $R^{64}$ has the same meaning as that of $R^{23}$.

The substituent represented by $R^{61}$ to $R^{64}$ is preferably an alkyl group, an alkoxyl group, an aryloxy group, a hetero aryloxy group, or a substituted amino group, more preferably an alkyl group, an alkoxyl group, an aryloxy group, or a substituted amino group, and especially preferably a methyl group, a tert-butyl group, a methoxy group, a phenoxy group, a dimethylamino group, or a diphenylamino group.

$R^{61}$ and $R^{62}$, or $R^{62}$ and $R^{63}$, or $R^{63}$ and $R^{64}$, may be bonded to each other to form a cyclic structure.

The substituent represented by $R^{65}$ to $R^{68}$ is preferably an alkyl group, an aryl group, a hetero aryl group, a halogen atom, or a cyano group, more preferably an alkyl group, an aryl group, a halogen atom, or a cyano group, and especially preferably a methyl group, a tert-butyl group, a phenyl group, a fluorine atom, or a cyano group.

$R^{65}$ and $R^{66}$, or $R^{66}$ and $R^{67}$, or $R^{67}$ and $R^{68}$, may be bonded to each other to form a cyclic structure.

$L^{61}$ has the same meaning as that of $L^{21}$, and the preferred range is also the same.

$n^{61}$ and $n^{21}$, and $n^{62}$ and $n^{22}$ respectively have the same meaning, and the preferred ranges are also the same.

The iridium complex phosphorescent material containing a ligand bonding to an iridium atom via the nitrogen atom of a pyridine structure represented by formula (VI) is more preferably an iridium complex phosphorescent material represented by the following formula (VII).

Formula (VII) will be described below.

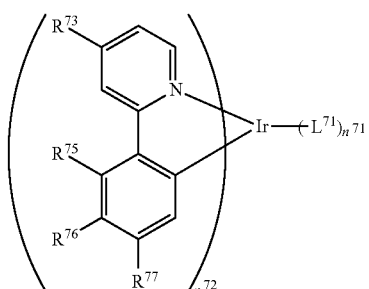

Formula (VII)

In formula (VII), $R^{73}$ represents a hydrogen atom, an alkyl group, an amino group or an alkoxyl group; $R^{75}$ to $R^{77}$ each represents a hydrogen atom, a fluorine atom, or an alkyl group; $L^{71}$ represents a ligand; $n^{72}$ represents an integer of from 1 to 3; and $n^{71}$ represents an integer of from 0 to 4.

$R^{73}$ preferably represents an alkyl group, an amino group, or an alkoxyl group, more preferably a methyl group, a tert-butyl group, a dimethylamino group, a diphenylamino group, a methoxy group, a tert-butoxy group, or a phenoxy group, and especially preferably represents a methoxy group.

$R^{75}$ preferably represents a hydrogen atom, a fluorine atom, an alkyl group, or a cyano group, more preferably a hydrogen atom, a fluorine atom, or a cyano group, and especially preferably represents a fluorine atom.

$R^{76}$ preferably represents a hydrogen atom, a fluorine atom, an alkyl group, or a cyano group, more preferably a hydrogen atom, a fluorine atom, or a cyano group, and especially preferably represents a cyano group.

$R^{77}$ preferably represents a hydrogen atom, a fluorine atom, an alkyl group, or a cyano group, more preferably a fluorine atom, or a cyano group, and especially preferably represents a fluorine atom.

The alkyl group represented by $R^{75}$, $R^{76}$ and $R^{77}$ is preferably a methyl group, an ethyl group, a tert-butyl group, a cyclohexyl group, a trifluoromethyl group, or a perfluorobutyl group, more preferably a methyl group, a tert-butyl group, a trifluoromethyl group, or a perfluorobutyl group, and especially preferably a trifluoromethyl group.

$L^{71}$ has the same meaning as that of $L^{21}$, and the preferred range is also the same.

$n^{71}$ and $n^{21}$, and $n^{72}$ and $n^{22}$ respectively have the same meaning, and the preferred ranges are also the same.

The maximum emission wavelength of an iridium complex phosphorescent material is the wavelength giving the greatest emission strength in the maximum value of emission spectrum. The maximum emission wavelength is preferably from 450 to 470 nm, more preferably from 450 to 465 nm, and especially preferably from 450 to 460 nm.

As iridium complex phosphorescent materials, the compounds described in WO 00/70655, WO 01/41512, WO 02/5645, JP-A-2002-117978, WO 04/085450, WO 06/121811, WO 05/019373, WO 05/113704, WO 04/016711, and Coordination Chemistry Reviews, 250 (2006) 2093-2126 are exemplified.

The specific examples of iridium complex phosphorescent materials are shown below. However, the invention is not restricted to these compounds.

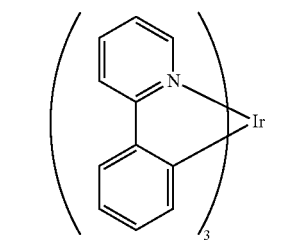

Ir-1-1

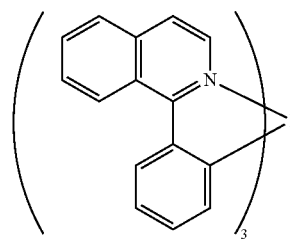

Ir-1-2

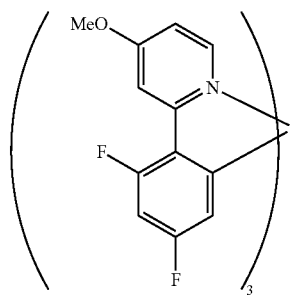

Ir-1-3

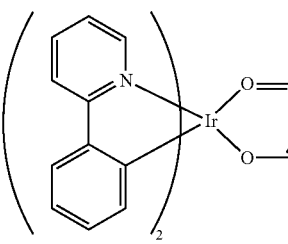

Ir-1-4

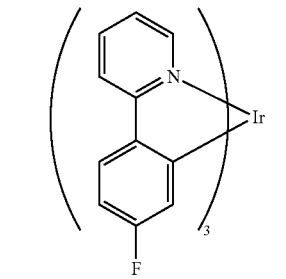

Ir-1-5

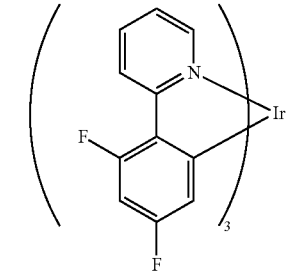

Ir-1-6

Ir-1-7
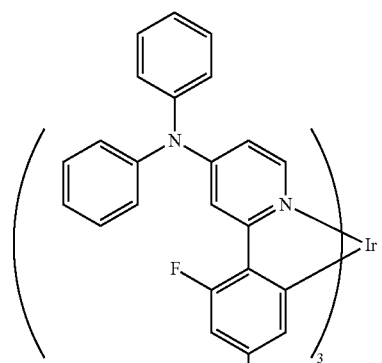
Ir-1-8
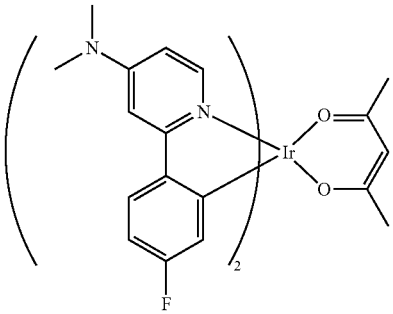
Ir-1-9
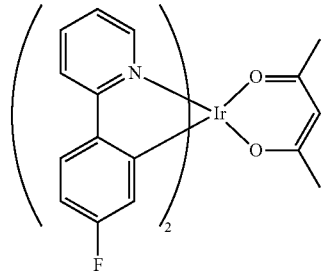
Ir-1-10
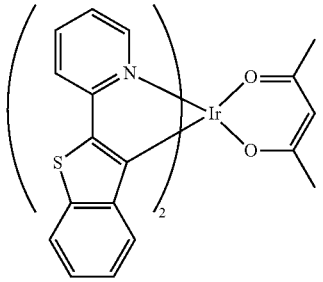
Ir-1-11
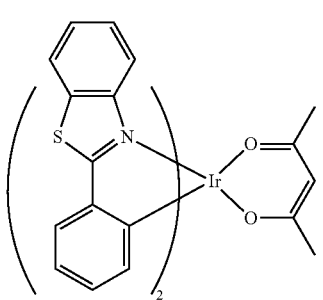
Ir-1-12
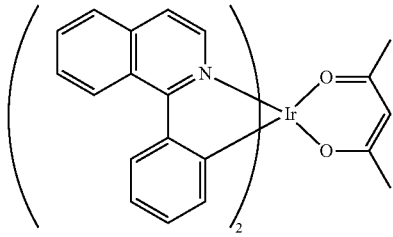
Ir-1-13
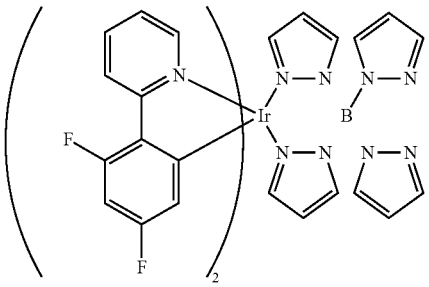
Ir-1-14
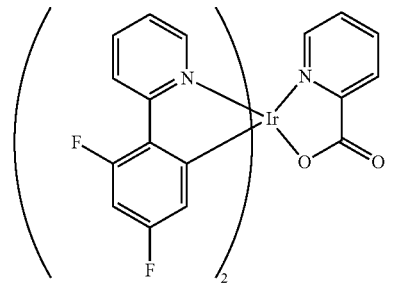
Ir-1-15
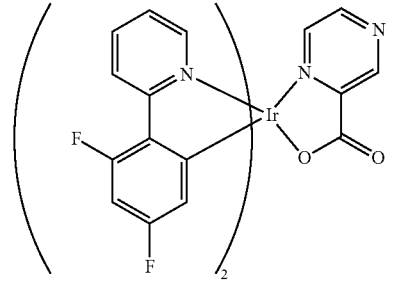
Ir-1-16
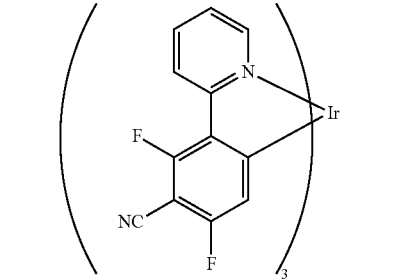

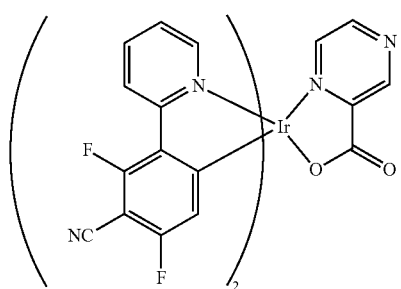
Ir-1-17
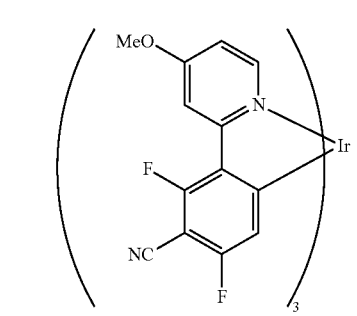
Ir-1-18
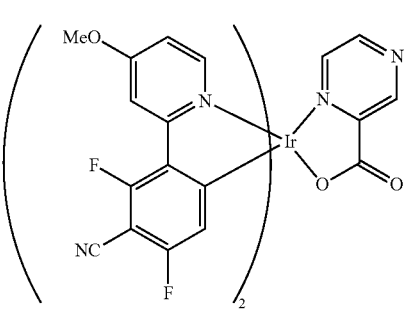
Ir-1-19
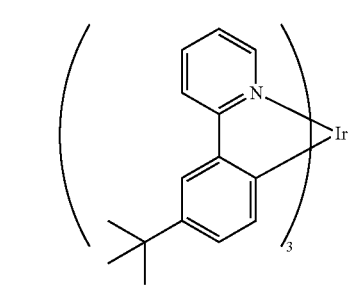
Ir-1-20
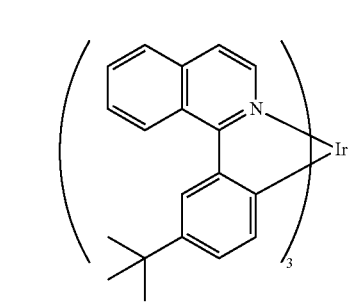
Ir-1-21
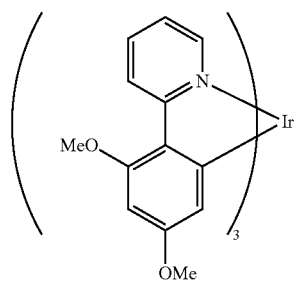
Ir-1-22
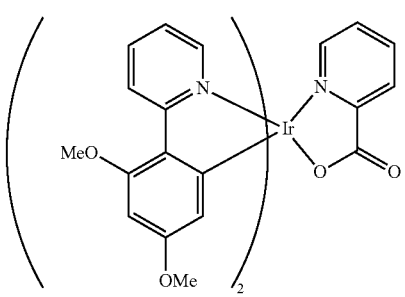
Ir-1-23
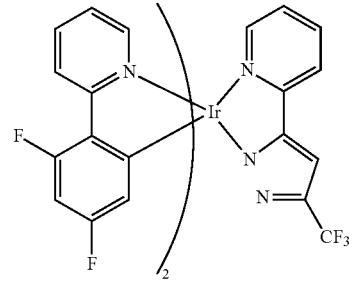
Ir-1-24
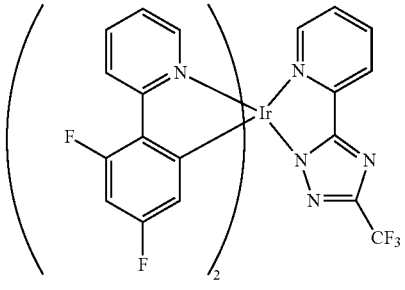
Ir-1-25
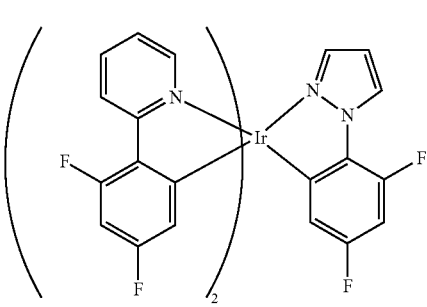
Ir-1-26

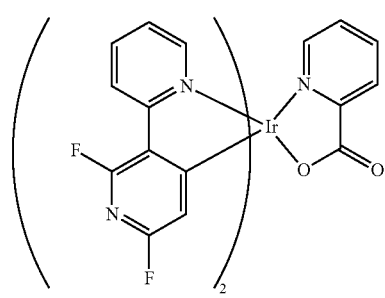
Ir-1-27
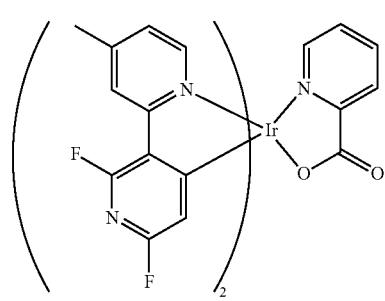
Ir-1-28
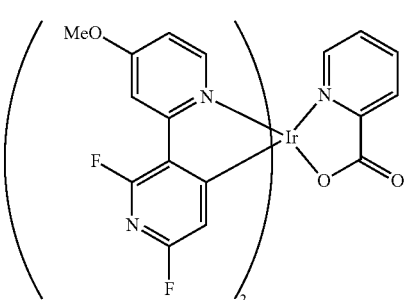
Ir-1-29
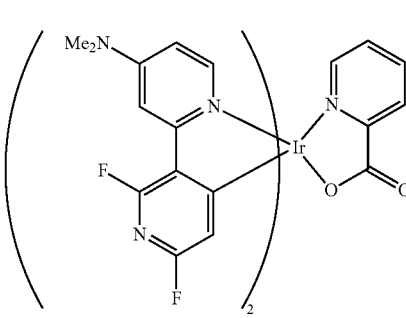
Ir-1-30
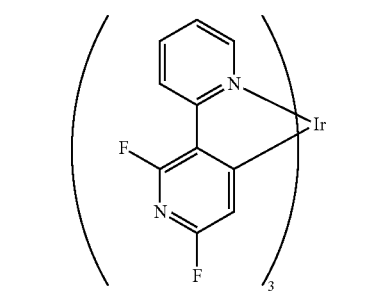
Ir-1-31
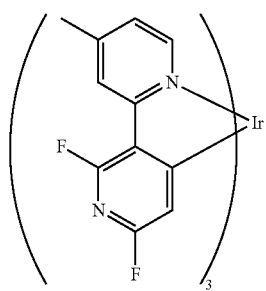
Ir-1-32
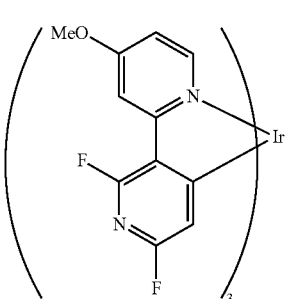
Ir-1-33
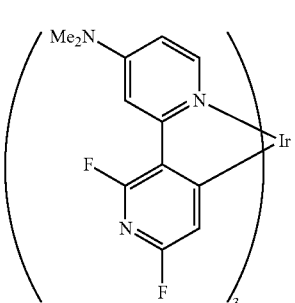
Ir-1-34
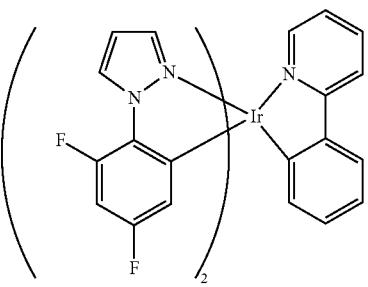
Ir-2-1
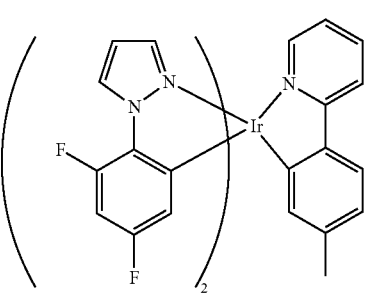
Ir-2-2

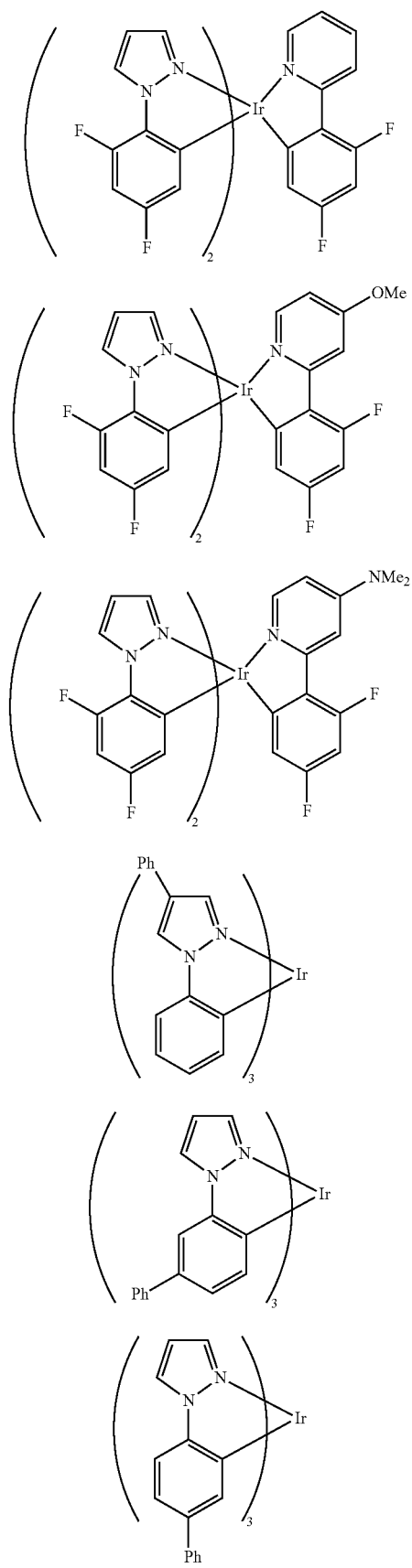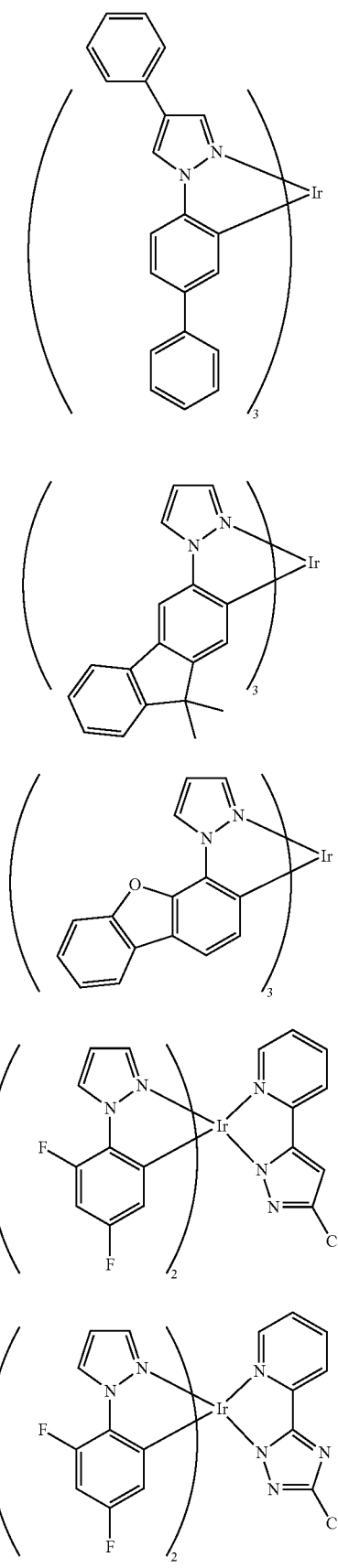

-continued
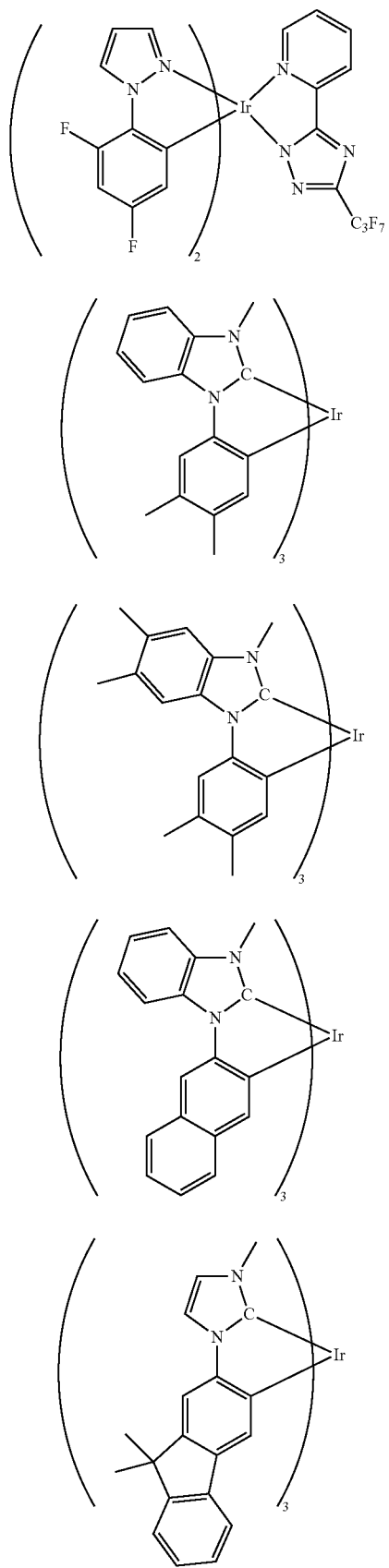
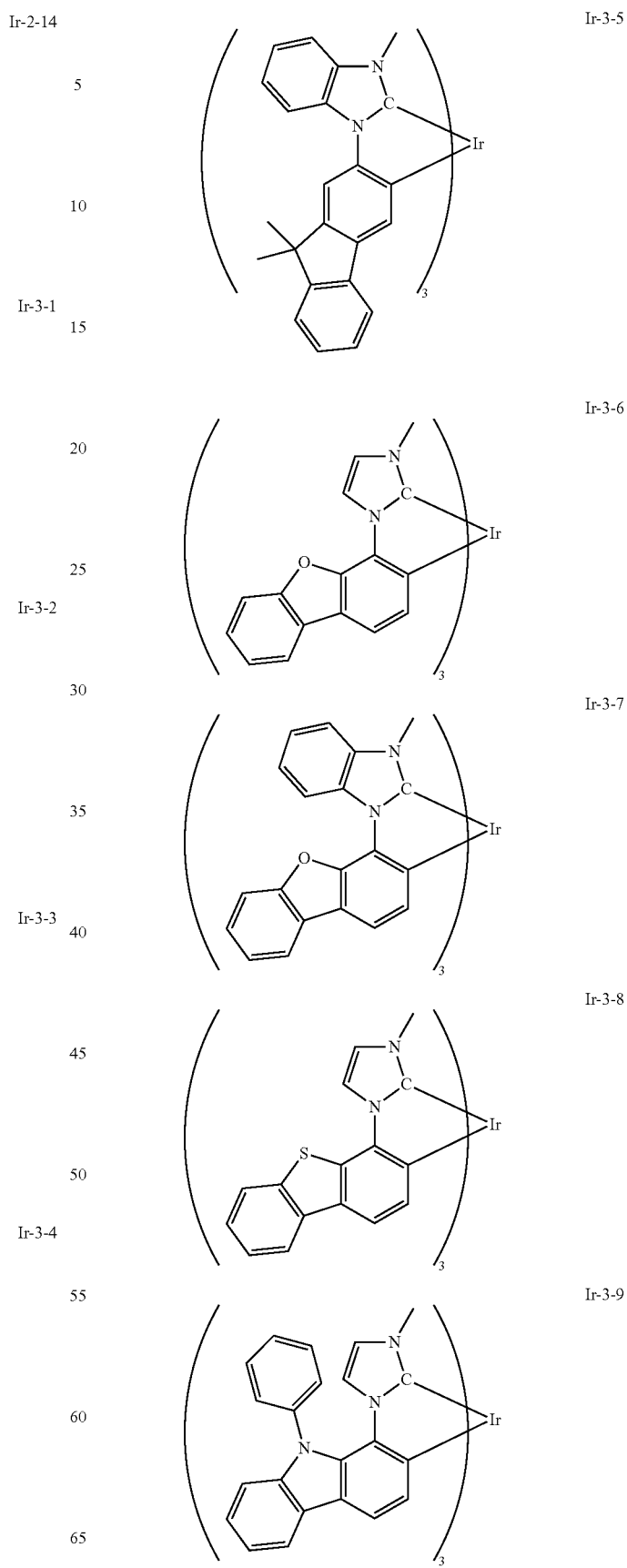

Ir-3-10
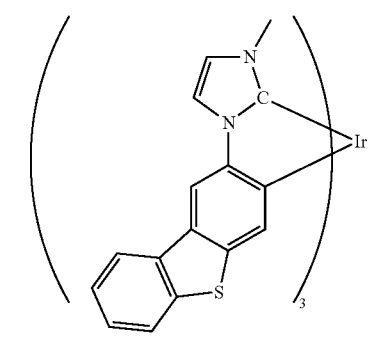
Ir-3-11
Ir-3-12
Ir-3-13
Ir-3-14
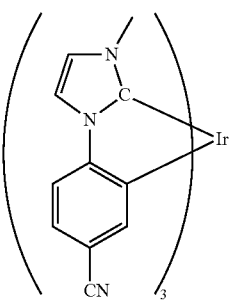
Ir-3-15
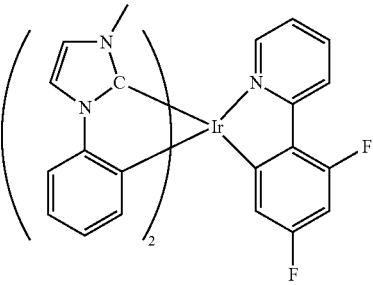
Ir-3-16
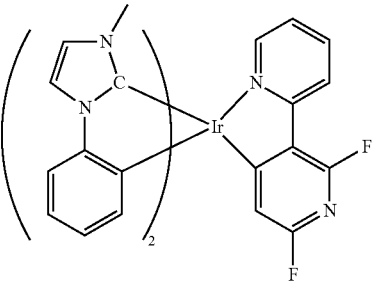
Ir-3-17
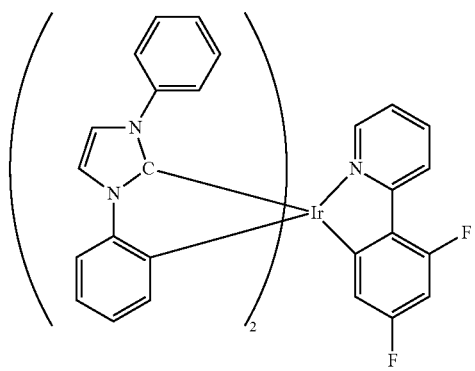
Ir-3-18
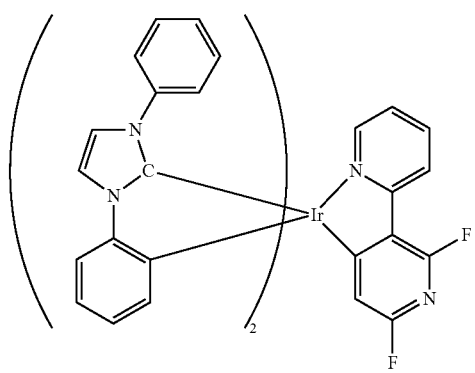

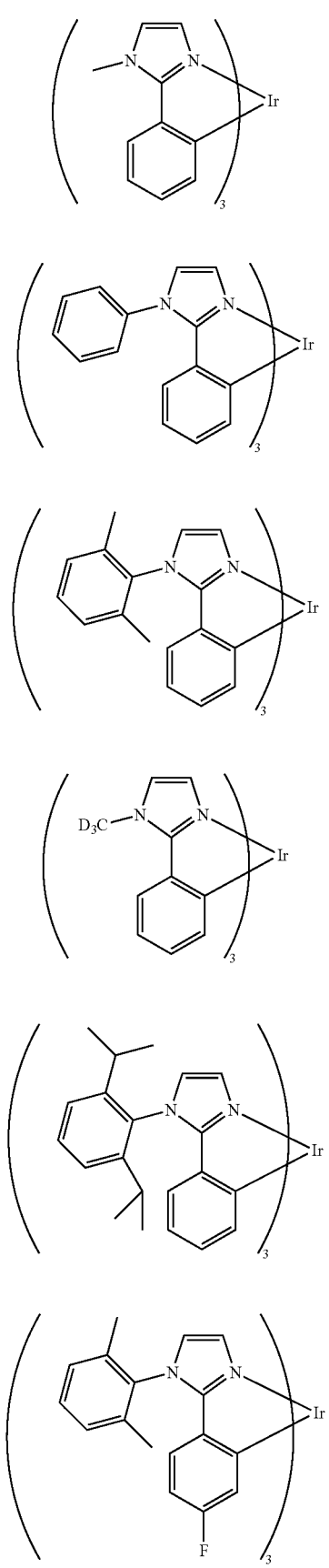

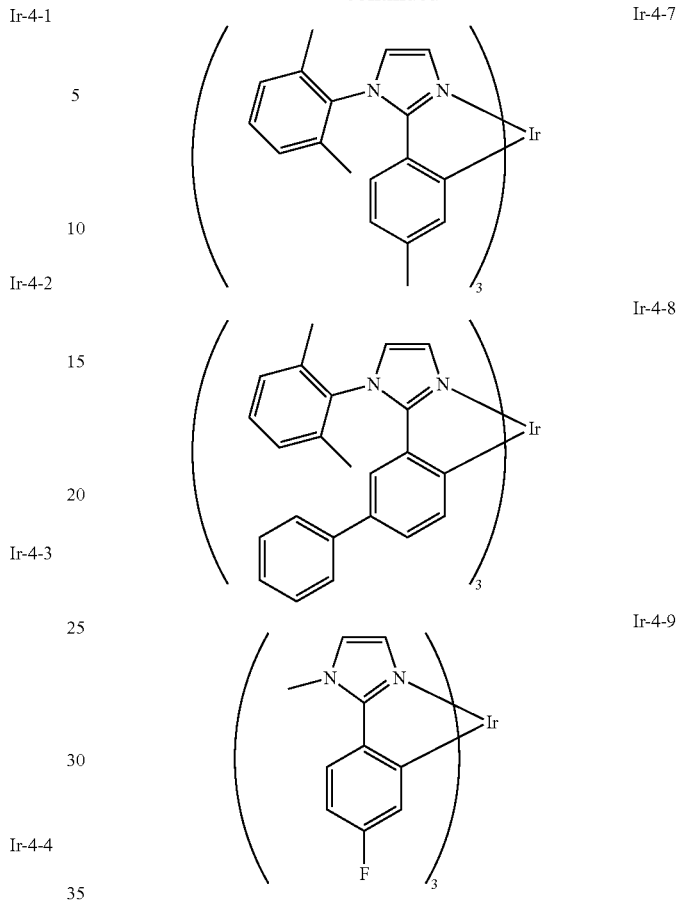

The complex compounds exemplified above can be manufactured, for example, according to the process shown below.

The above metal complex compounds can be synthesized according to various methods, for example, the method described in G. R. Newkome et al., Journal of Organic Chemistry, 53, 786 (1988), p. 789, line 53, left column to line 7, right column, the method described on p. 790, line 18 to line 38, left column, p. 790, line 19 to line 30, right column, and combinations of these methods, and H. Lexy et at, Chemische Berichte 113, 2749 (1980), p. 2752, lines 26 to 35.

For example, the compound can be obtained by room temperature or lower or by heating a ligand or a dissociated product thereof, and a metal compound in the presence of a solvent (e.g., a halogen-based solvent, an alcohol-based solvent, an ether-based solvent, an ester-based solvent, a ketone-based solvent, a nitrile-based solvent, an amide-based solvent, a sulfone-based solvent, a sulfoxide-based solvent, and water are exemplified), or in the absence of a solvent, in the presence of a base (inorganic or organic various bases, e.g., sodium methoxide, potassium t-butoxylate, triethylamine, and potassium carbonate are exemplified), or in the absence of a base.

In the invention, it is preferred to use an iridium complex as a light-emitting material, but an iridium complex may be used in layers other than a light-emitting layer.

An iridium complex is contained in a light-emitting layer in the proportion of generally from 0.1 to 50 mass % based on the amount of all the compounds constituting the light-emitting layer, but from the viewpoint of durability and external quantum efficiency, the amount is preferably from 1 to 50 mass %, and more preferably from 2 to 40 mass %.

Each component constituting the device of the invention will be described in detail below.

Organic Electroluminescent Device:

The device of the invention will be described in detail below.

The luminescent device in the invention comprises a substrate having thereon a cathode and an anode, and organic layers (the organic layers may be organic layers comprising an organic compound alone, or may be organic layers containing an inorganic compound) including an organic light-emitting layer (hereinafter sometimes referred to as merely "a light-emitting layer") between the electrodes. Accordingly, the organic layer in the invention may have the constitution comprising a light-emitting layer alone. From the properties of the luminescent device, it is preferred that at least one electrode of the anode and cathode is transparent.

As the embodiment of lamination of the organic layers in the invention, lamination is preferably in order of a hole transporting layer, a light-emitting layer, and an electron transporting layer from the anode side. Further, a charge blocking layer may be provided between a hole transporting layer and a light-emitting layer, or between a light-emitting layer and an electron transporting layer. A hole injecting layer may be provided between the anode and a hole transporting layer, and an electron injecting layer may be provided between the cathode and an electron transporting layer. Each layer may be divided into a plurality of secondary layers.

The constituents of the luminescent device of the invention are described in detail below.

Substrate:

The substrate for use in the invention is preferably a substrate that does not scatter or attenuate the light emitted from the organic layers. The specific examples of the materials of the substrate include inorganic materials, e.g., yttria stabilized zirconia (YSZ), glass, etc., and organic materials, such as polyester, e.g., polyethylene terephthalate, polybutylene phthalate, polyethylene naphthalate, etc., polystyrene, polycarbonate, polyether sulfone, polyallylate, polyimide, polycycloolefin, norbornene resin, poly(chlorotrifluoroethylene), etc.

When glass is used as a substrate, non-alkali glass is preferably used as the material for reducing elution of ions from the glass. Further, when soda lime glass is used, it is preferred to provide a barrier coat such as silica. In the case of organic materials, materials excellent in heat resistance, dimensional stability, solvent resistance, electrical insulating properties and processability are preferably used.

The shape, structure and size of a substrate are not especially restricted, and these can be arbitrarily selected in accordance with the intended use and purpose of the luminescent device. In general, a substrate is preferably in a plate-like shape. The structure of a substrate may be a single layer structure or may be a lamination structure, and may consist of a single member or may be formed of two or more members.

A substrate may be colorless and transparent, or may be colored and transparent, but from the point of not scattering or attenuating the light emitted from an organic light-emitting layer, a colorless and transparent substrate is preferably used.

A substrate can be provided with a moisture permeation preventing layer (a gas bather layer) on the front surface or rear surface.

As the materials of the moisture permeation preventing layer (the gas barrier layer), inorganic materials such as silicon nitride and silicon oxide are preferably used. The moisture permeation preventing layer (the gas barrier layer) can be formed, for example, by a high frequency sputtering method.

When a thermoplastic substrate is used, if necessary, a hard coat layer and an undercoat layer may further be provided.

Anode:

An anode is generally sufficient to have the function of the electrode to supply positive holes to an organic layer. The shape, structure and size of an anode are not especially restricted, and these can be arbitrarily selected from known materials of electrode in accordance with the intended use and purpose of the luminescent device. As stated above, an anode is generally provided as a transparent anode.

As the materials of anode, for example, metals, alloys, metal oxides, electrically conductive compounds, and mixtures of these materials are preferably exemplified. The specific examples of the materials of anode include electrically conductive metal oxides, e.g., tin oxide doped with antimony or fluorine (ATO, FTO), tin oxide, zinc oxide, indium oxide, indium tin oxide (ITO), indium zinc oxide (IZO), etc., metals, e.g., gold, silver, chromium, nickel, etc., mixtures or laminates of these metals with electrically conductive metal oxides, inorganic electrically conductive substances, e.g., copper iodide, copper sulfide, etc., organic electrically conductive materials, e.g., polyaniline, polythiophene, polypyrrole, etc., laminates of these materials with ITO, etc. Of these materials, electrically conductive metal oxides are preferred, and ITO is especially preferred in view of productivity, high conductivity, transparency and the like.

An anode can be formed on the substrate in accordance with various methods arbitrarily selected from, for example, wet methods, e.g., a printing method, a coating method, etc., physical methods, e.g., a vacuum deposition method, a sputtering method, an ion plating method, etc., and chemical methods, e.g., a CVD method, a plasma CVD method, etc., taking the suitability with the material to be used in the anode into consideration. For example, in the case of selecting ITO as the material of an anode, the anode can be formed according to a direct current or high frequency sputtering method, a vacuum deposition method, an ion plating method, etc.

In the device in the invention, the position of the anode to be formed is not especially restricted and can be formed anywhere. The position can be arbitrarily selected in accordance with the intended use and purpose of the luminescent device, but preferably provided on the substrate. In this case, the anode may be formed on the entire surface of one side of the substrate, or may be formed at a part.

As patterning in forming an anode, patterning may be performed by chemical etching such as by photo-lithography, may be carried out by physical etching by laser, may be performed by vacuum deposition or sputtering on a superposed mask, or a lift-off method and a printing method may be used.

The thickness of an anode can be optionally selected in accordance with the materials of the anode, so that cannot be regulated unconditionally, but the thickness is generally from 10 nm to 50 μm or so, and is preferably from 50 nm to 20 μm.

The value of resistance of an anode is preferably $10^3$ Ω/□ or less, and more preferably $10^2$ Ω/□ or less. In the case where an anode is transparent, the anode may be colorless and transparent, or colored and transparent. For the coupling out of emission from the transparent anode side, transmittance is preferably 60% or more, and more preferably 70% or more.

In connection with transparent anodes, description is found in Yutaka Sawada supervised, Tomei Denkyoku-Maku no Shintenkai (New Development in Transparent Electrode Films), CMC Publishing Co., Ltd. (1999), and the description therein can be referred to. In the case of using a plastic substrate low in heat resistance, a transparent anode film formed with ITO or IZO at a low temperature of 150° C. or less is preferred.

Cathode:

A cathode is generally sufficient to have the function of the electrode to supply electrons to an organic layer. The form, structure and size of a cathode are not especially restricted, and these can be arbitrarily selected from known materials of electrode in accordance with the intended use and purpose of the luminescent device.

As the materials of cathode, for example, metals, alloys, metal oxides, electrically conductive compounds, and mixtures of these materials are exemplified. The specific examples of the materials of cathode include alkali metals (e.g., Li, Na, K, Cs, etc.), alkaline earth metals (e.g., Mg, Ca, etc.), gold, silver, lead, aluminum, sodium-potassium alloy, lithium-aluminum alloy, magnesium-silver alloy, indium, rare earth metals, e.g., ytterbium, etc. These materials may be used by one kind alone, but from the viewpoint of the compatibility of stability and an electron injecting property, two or more kinds of materials are preferably used in combination.

As the materials constituting a cathode, alkali metals and alkaline earth metals are preferred of these materials in the point of an electron injecting property, and materials mainly comprising aluminum are preferred for their excellent preservation stability.

The materials mainly comprising aluminum mean aluminum alone, alloys of aluminum with 0.01 to 10 mass % of alkali metal or alkaline earth metal, or mixtures of these (e.g., lithium-aluminum alloy, magnesium-aluminum alloy, etc.).

The materials of a cathode are disclosed in detail in JP-A-2-15595 and JP-A-5-121172, and the materials described in these patents can also be used in the invention.

A cathode can be formed by known methods with no particular restriction. For example, a cathode can be formed according to wet methods, e.g., a printing method, a coating method, etc., physical methods, e.g., a vacuum deposition method, a sputtering method, an ion plating method, etc., and chemical methods, e.g., a CVD method, a plasma CVD method, etc., taking the suitability with the material constituting the cathode into consideration. For example, in the case of selecting metals as the material of a cathode, the cathode can be formed with one or two or more kinds of materials at the same time or in order by a sputtering method, etc.

Patterning in forming a cathode may be performed by chemical etching such as a method by photo-lithography, may be carried out by physical etching such as a method by laser, may be performed by vacuum deposition or sputtering on a superposed mask, or a lift-off method and a printing method may be used.

The position of the cathode to be formed is not especially restricted and can be formed anywhere in the invention. The cathode may be formed on the entire surface of the organic layer, or may be formed at a part.

A dielectric layer comprising fluoride or oxide of alkali metal or alkaline earth metal may be inserted between the cathode and the organic layer in a thickness of from 0.1 to 5 nm. The dielectric layer can be regarded as one kind of an electron injecting layer. The dielectric layer can be formed, for example, according to a vacuum deposition method, a sputtering method, an ion plating method, etc.

The thickness of a cathode can be optionally selected in accordance with the materials of the cathode, so that cannot be regulated unconditionally, but the thickness is generally from 10 nm to 5 μm or so, and is preferably from 50 urn to 1 μm.

A cathode may be transparent or opaque. A transparent cathode can be formed by forming a thin film of the materials of the cathode in a thickness of from 1 to 10 nm, and further laminating transparent conductive materials such as ITO and IZO.

Organic Layer:

Organic layers in the invention will be described below.

The device of the invention has at least one organic layer including a light-emitting layer. As organic layers other than the organic light-emitting layer, as described above, a hole transporting layer, an electron transporting layer, a charge blocking layer, a hole injecting layer and an electron injecting layer are exemplified.

Formation of Organic Layers:

In the device of the invention, each layer constituting the organic layers can be preferably formed by any of dry film-forming methods such as a vacuum deposition method, a sputtering method, etc., a transfer method, and a printing method.

Light-Emitting Layer

The light-emitting layer is a layer having functions to receive, at the time of electric field application, positive holes from the anode, the hole-injecting layer or the hole-transporting layer, and receive electrons from the cathode, the electron-injecting layer or the electron-transporting layer, and offer the field of recombination of the positive holes and electrons to emit light. The light-emitting layer may comprise one layer, or may be two or more layers, and in the ease of comprising two or more layers, each layer may emit light in different luminescent color.

The light-emitting layer in the invention may consist of a light-emitting material alone, or may comprise a mixed layer of a host material and a light-emitting material.

Here, the host material means a material other than a light-emitting material of the materials constituting a light-emitting layer, and having at least one function of a function of dispersing a light-emitting material and maintaining the dispersion in the light-emitting layer, a function of receiving positive holes from an anode and a hole transporting layer, a function of receiving electrons from a cathode and an electron transporting layer, a function of transporting at least one of positive holes and electrons, a function of offering the place of recombination of positive holes and electrons, a function of shifting the energy of exciton generated by recombination to the light-emitting material, and a function of transporting at least one of positive holes and electrons to the light-emitting material.

The host material is preferably a charge-transporting material. The host material may be used by one kind alone, or two or more kinds may be used. For example, the constitution of the mixture of an electron-transporting host material and a hole-transporting host material is exemplified. Further, a material not having a charge-transporting property and not emitting light may be contained in the light-emitting layer.

As the host material contained in the light-emitting layer in the invention, for example, those having a carbazole structure, those having a diarylamine structure, those having a pyridine structure, those having a pyrazine structure, those having a triazine structure, those having an arylsilane structure, and materials described later in the items of hole-injecting layer, hole-transporting layer, electron-injecting layer, and electron-transporting layer are exemplified.

The examples of fluorescent materials that can be used in the invention include benzoxazole derivatives, benzimidazole derivatives, benzothiazole derivatives, styrylbenzene derivatives, polyphenyl derivatives, diphenylbutadiene derivatives, tetraphenylbutadiene derivatives, naphthalimide derivatives, coumarin derivatives, condensed aromatic compounds, perinone derivatives, oxadiazole derivatives, oxazine derivatives, aldazine derivatives, pyraridine derivatives, cyclopentadiene derivatives, bisstyrylanthracene derivatives, quinacridone derivatives, pyrrolopyridine derivatives, thiadiazolopyridine derivatives, cyclopentadiene derivatives, styrylamine derivatives, diketopyrrolopyrrole derivatives, aromatic dimethylidyne compounds, various metal complexes represented by metal complexes of 8-quinolinol derivatives and metal complexes of pyrromethene derivatives, polymer compounds such as polythiophene, polyphenylene, polyphenylenevinylene, etc., and compounds such as organic silane derivatives.

The examples of phosphorescent materials that can be used alone or in combination in the invention include complexes containing a transition metal atom or a lanthanoid atom.

The transition metal atoms are not especially restricted, but preferably ruthenium, rhodium, palladium, tungsten, rhenium, osmium, iridium and platinum are exemplified, and rhenium, iridium and platinum are more preferred.

As lanthanoid atoms, lanthanum, cerium, praseodymium, neodymium, samarium, europium, gadolinium, terbium, dysprosium, holmium, erbium, thulium, ytterbium, and lutetium are exemplified. Of these lanthanoid atoms, neodymium, europium and gadolinium are preferred.

As the examples of ligands of complexes, the ligands described, for example, in G. Wilkinson et al., Comprehensive Coordination Chemistry, Pergamon Press (1987), H. Yersin, Photochemistry and Photophysics of Coordination Compounds, Springer-Verlag (1987), and Akio Yamamoto, Yuki Kinzoku Kagaku-Kiso to Oyo-(Organic Metal Chemistry—Elements and Applications), Shokabo Publishing Co. (1982) are exemplified.

As the specific examples of ligands, halogen ligands (preferably a chlorine ligand), nitrogen-containing heterocyclic ligands (e.g., phenylpyridine, benzoquinoline, quinolinol, bipyridyl, phenanthroline, etc.), diketone ligands (e.g., acetylacetone, etc.), carboxylic acid ligands (e.g., acetic acid ligand, etc.), carbon monoxide ligands, isonitrile ligands, and cyano ligands are preferably exemplified, and more preferably nitrogen-containing heterocyclic ligands are exemplified. These complexes may have one transition metal atom in a compound, or may be what is called polynuclear complexes having two or more transition metal atoms. They may contain dissimilar metal atoms at the same time.

As the specific examples of the light-emitting materials that can be used in combination with the iridium complex phosphorescent materials, for example, the following compounds are exemplified, but the invention is not restricted thereto.

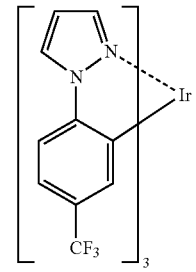

D-1

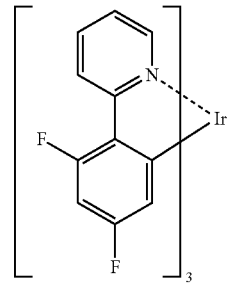

D-2

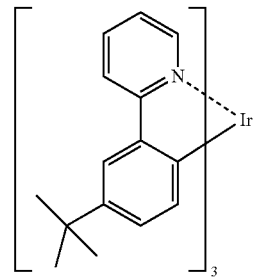

D-3

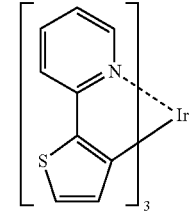

D-4

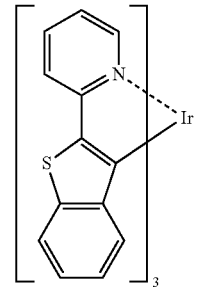

D-5

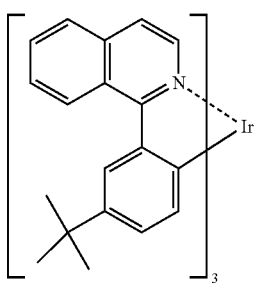 D-6
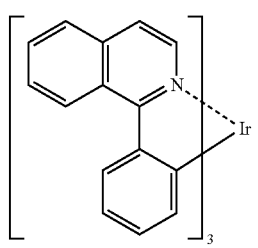 D-7
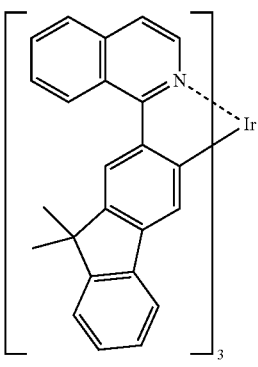 D-8
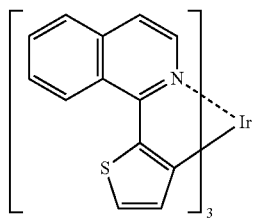 D-9
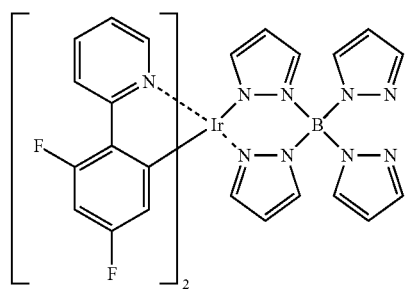 D-10
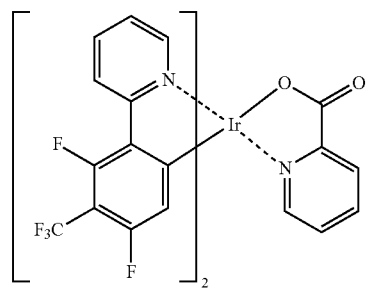 D-11
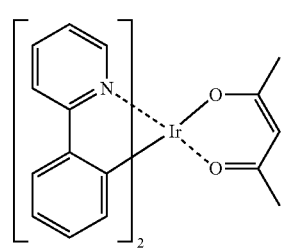 D-12
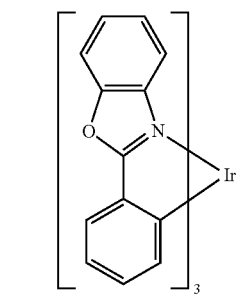 D-13
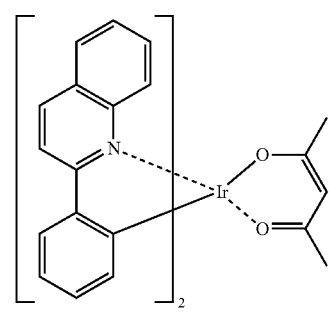 D-14
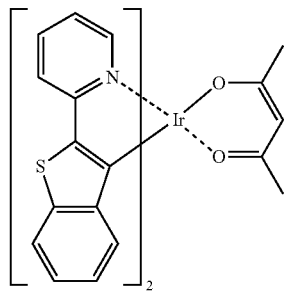 D-15

D-16
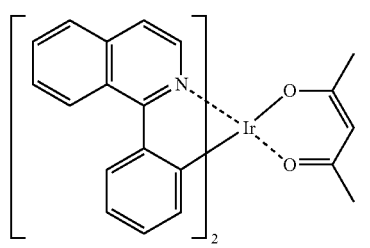
D-17
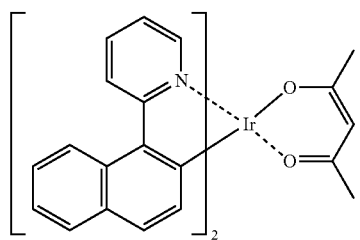
D-18
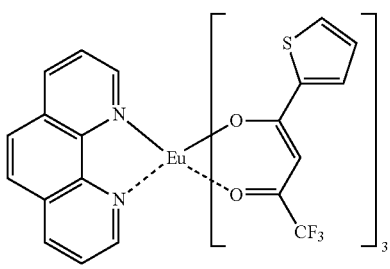
D-19
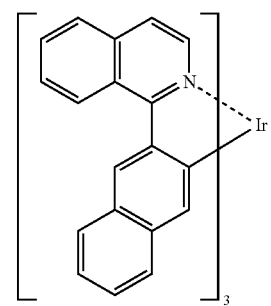
D-20
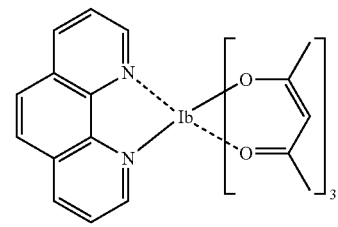
D-21
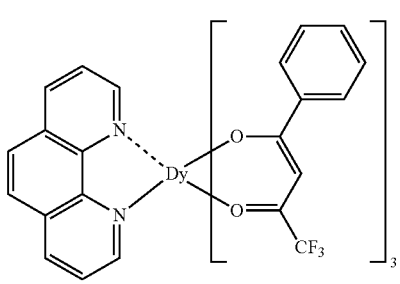
D-22
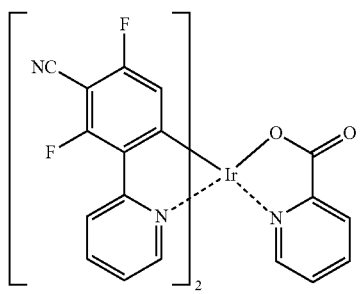
D-23
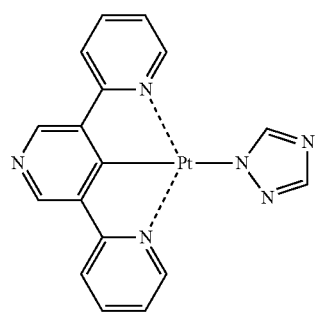
D-24
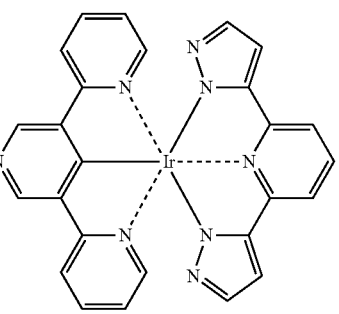
D-25
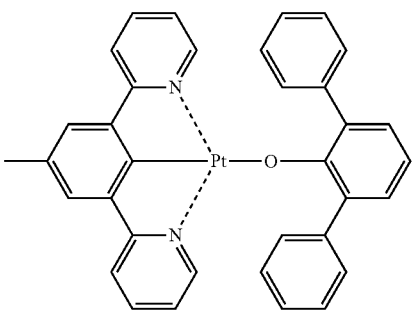
D-26
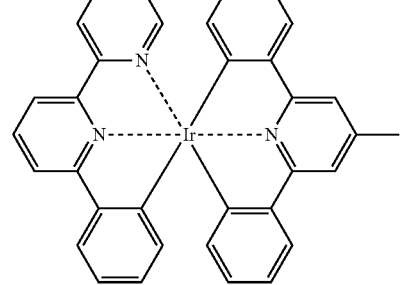

-continued
D-27
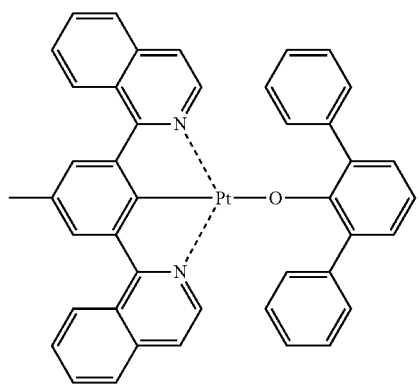
D-28
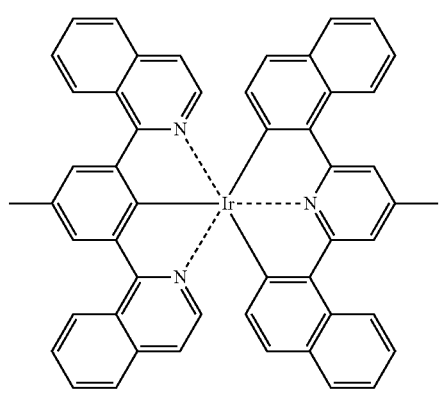
D-29
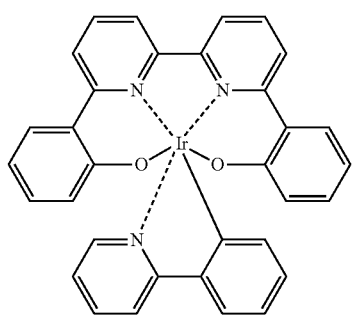
D-30
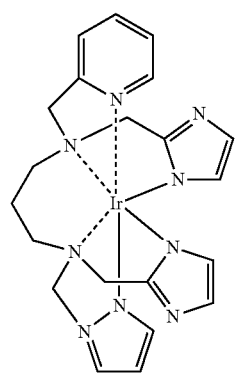
-continued
D-31
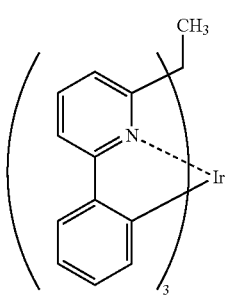
D-32
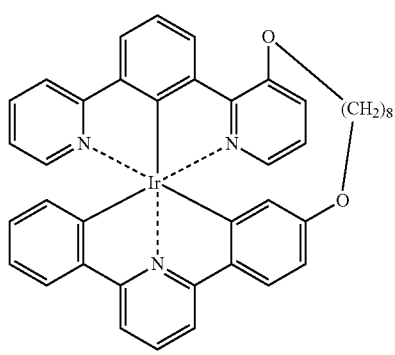
D-33
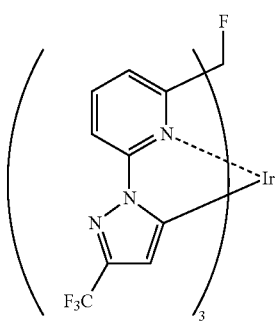
D-34
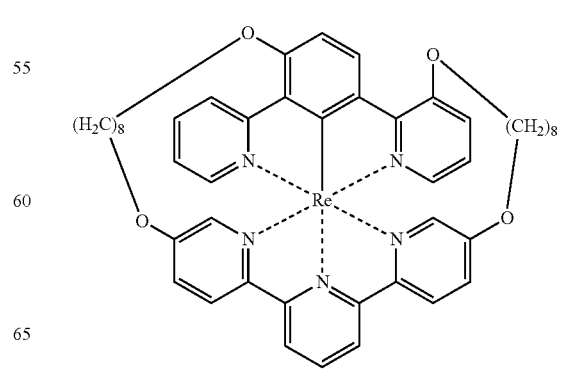

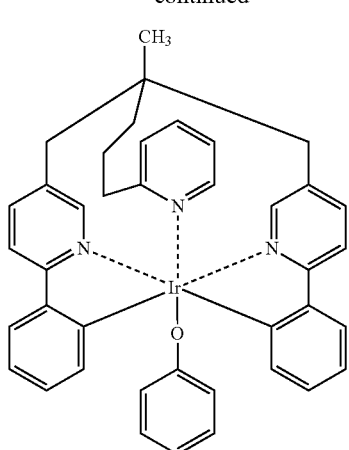

D-35

The phosphorescent material of the invention containing an iridium complex phosphorescent material is preferably contained in the light-emitting layer in a proportion of from 0.1 to 40 mass %, and more preferably from 0.5 to 20 mass %. When phosphorescent materials other than the phosphorescent material of the invention are used in combination, the phosphorescent material of the invention is preferably contained in the proportion of 50 mass % or more based on all the amount of the phosphorescent materials, and more preferably 80 mass % or more.

As the host material contained in the light-emitting layer in the invention, the compound represented by formula (I) is exemplified, but host materials other than the above compound can be used in combination. For example, other than the invention, those having a carbazole structure, those having a diarylamine structure, those having a pyridine structure, those having a pyrazine structure, those having a triazine structure, those having an arylsilane structure, and the materials described later in the items of hole injecting layer, hole transporting layer, electron injecting layer, and electron transporting layer are exemplified. Host materials capable of being used in combination are contained in the light-emitting layer preferably in the proportion of 90 mass % or less of the compound represented by formula (I), more preferably 50 mass % or less, and especially preferably 10 mass % or less.

The thickness of the light-emitting layer is not especially limited, but is generally preferably from 1 to 500 nm, more preferably from 5 to 200 nm, and still more preferably from 10 to 100 nm.

Hole Injecting Layer and Hole Transporting Layer:

The hole injecting layer and the hole transporting layer are layers having a function to receive positive holes from the anode or anode side and transport the positive holes to the cathode side. The hole injecting layer and the hole transporting layer are specifically preferably the layers containing carbazole derivatives, triazole derivatives, oxazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalcone derivatives, styrylanthracene derivatives, fluorenone derivatives, hydrazone derivatives, stilbene derivatives, silazane derivatives, aromatic tertiary amine compounds, styrylamine compounds, aromatic dimethylidyne compounds, porphyrin compounds, organic silane derivatives, carbon, and various kinds of metal complexes represented by Ir complex having phenylazole or phenylazine as the ligand.

The thickness of each of the hole injecting layer and the hole transporting layer is preferably 500 nm or less from the viewpoint of lowering driving voltage.

The thickness of the hole transporting layer is preferably from 1 to 500 nm, more preferably from 5 to 200 nm, and still more preferably from 10 to 100 nm. The thickness of the hole injecting layer is preferably from 0.1 to 200 nm, more preferably from 0.5 to 100 nm, and still more preferably from 1 to 100 nm.

The hole injecting layer and the hole transporting layer may be a single layer structure comprising one or two or more of the above materials, or may be a multilayer structure comprising a plurality of layers of the same or different compositions.

Electron Injecting Layer and Electron Transporting Layer:

The electron injecting layer and the electron transporting layer are layers having a function to receive electrons from the cathode or the cathode side and transport the electrons to the anode side. The electron injecting layer and the electron transporting layer are specifically preferably layers containing triazole derivatives, oxazole derivatives, oxadiazole derivatives, imidazole derivatives, fluorenone derivatives, anthraquinodimethane derivatives, anthrone derivatives, diphenylquinone derivatives, thiopyran dioxide derivatives, carbodiimide derivatives, fluorenylidene-methane derivatives, distyrylpyrazine derivatives, aromatic ring tetracarboxylic acid anhydride such as naphthalene, perylene, etc., phthalocyanine derivatives, various metal complexes represented by metal complexes of 8-quinolinol derivatives, metal complexes having metalphthalocyanine, benzoxazole, or benzothiazole as the ligand, organic silane derivatives, and the like.

The thickness of each of the electron injecting layer and the electron transporting layer is preferably 500 nm or less from the viewpoint of lowering driving voltage.

The thickness of the electron transporting layer is preferably from 1 to 500 nm, more preferably from 5 to 200 nm, and still more preferably from 10 to 100 nm. The thickness of the electron injecting layer is preferably from 0.1 to 200 nm, more preferably from 0.2 to 100 nm, and still more preferably from 0.5 to 50 nm, The electron injecting layer and the electron transporting layer may be a single layer structure comprising one or two or more of the above materials, or may be a multilayer structure comprising a plurality of layers of the same or dissimilar compositions.

Hole Blocking Layer:

The hole blocking layer is a layer having a function of preventing the positive holes transported from the anode side to the light-emitting layer from passing through to the cathode side. In the invention, a hole blocking layer can be provided as the organic layer contiguous to the light-emitting layer on the cathode side.

As the examples of the organic compounds constituting the hole blocking layer, aluminum complexes, e.g., BAlq, triazole derivatives, phenanthroline derivatives, e.g., BCP., can be exemplified.

The thickness of the hole blocking layer is preferably from 1 to 500 nm, more preferably from 5 to 200 nm, and still more preferably from 10 to 100 nm.

The hole blocking layer may be a single layer structure comprising one or two or more of the above materials, or may be a multilayer structure comprising a plurality of layers of the same or dissimilar compositions.

Protective Layer:

In the invention the organic EL device may be completely protected with a protective layer.

It is sufficient for the materials to be contained in the protective layer to have a function capable of restraining the substances accelerating deterioration of the device, e.g., water, oxygen, etc., from entering the device.

The specific examples of such materials include metals, e.g., In, Sn, Pb, Au, Cu, Ag, Al, Ti, Ni, etc., metal oxides, e.g., MgO, SiO, $SiO_2$, $Al_2O_3$, GeO, NiO, CaO, BaO, $Fe_2O_3$, $Y_2O_3$, $TiO_2$, etc., metal nitrides, e.g., $SiN_y$, $SiN_xO_y$, etc., metal fluorides, e.g., $MgF_2$, LiF, $AlF_3$, $CaF_2$, etc., polyethylene, polypropylene, polymethyl methacrylate, polyimide, polyurea, polytetrafluoroethylene, polychlorotrifluoro-ethylene, polydichlorodifluoroethylene, copolymers of chlorotrifluoroethylene with dichlorodifluoroethylene, copolymers obtained by copolymerization of monomer mixtures containing tetrafluoroethylene and at least one comonomer, fluorine-containing copolymers having a cyclic structure on the main chain of the copolymer, water absorptive substances having a water absorption rate of not lower than 1%, moisture proofing substances having a water absorption rate of not higher than 0.1%.

The forming method of the protective layer is not especially restricted and, for example, a vacuum deposition method, a sputtering method, a reactive sputtering method, an MBE (molecular beam epitaxy) method, a cluster ion beam method, an ion plating method, a plasma polymerization method (a high frequency excitation ion plating method), a plasma CVD method, a laser CVD method, a heat CVD method, a gas source CVD method, a coating method, a printing method, a transfer method, etc., can be applied to the invention.

Sealing Container:

The device of the invention may be completely sealed in a sealing container.

Further, a water absorber or an inert liquid may be filled in the space between the sealing container and the luminescent device. The water absorber is not especially restricted and, for example, barium oxide, sodium oxide, potassium oxide, calcium oxide, sodium sulfate, calcium sulfate, magnesium sulfate, phosphorus pentoxide, calcium chloride, magnesium chloride, copper chloride, cesium fluoride, niobium fluoride, calcium bromide, vanadium bromide, molecular sieve, zeolite, magnesium oxide, etc., can be exemplified. The inert liquid is not particularly limited and, for example, paraffins, liquid paraffins, fluorine solvents, such as perfluoroalkane, perfluoroamine, perfluoroether, etc., chlorine solvents, and silicone oils are exemplified.

Driving Method:

Emission can be obtained by the application of DC (if necessary, an alternating current factor may be contained) voltage (generally from 2 to 15 V) or direct electric current between the anode and cathode of the device of the invention.

In connection with the driving methods of the device of the invention, the driving methods disclosed in JP-A-2-148687, JP-A-6-301355, JP-A-5-29080, JP-A-7-134558, JP-A-8-234685, JP-A-8-241047, Japanese Patent 2784615, and U.S. Pat. Nos. 5,828,429 and 6,023,308 can be applied to the invention.

Example

Others:

The device in the invention can be preferably used in display devices, displays, backlights, electrophotography, illumination light sources, recording light sources, exposure light sources, reading light sources, indicators, signboards, interior designs, optical communications, and the like.

Example

The invention will be described in detail with reference to examples, but the invention should not be construed as being restricted thereto.

Synthesis of Exemplified Compounds:

Exemplified Compound (1-3) can be synthesized by the use of carbazole containing a deuterium atom on 1- to 8-positions described in Heterocycles, Vol. 67, No. 1, 353-359 (2006), by coupling with 4,4'-dibromobiphenyl by using a palladium catalyst and a copper catalyst.

Exemplified Compound (4-3) can be synthesized by coupling with 1,3-dibromobenzene in the same manner as in exemplified Compound (1-3).

Exemplified Compound (12-3) can be synthesized by coupling with 3,6-dibromo-9-phenylcarbazole described in Tetrahedron, Vol. 54, No. 42, 12707-12714 (1998) in the same manner as in exemplified Compound (1-3).

Exemplified Compound (4-6) can be synthesized according to the following method.

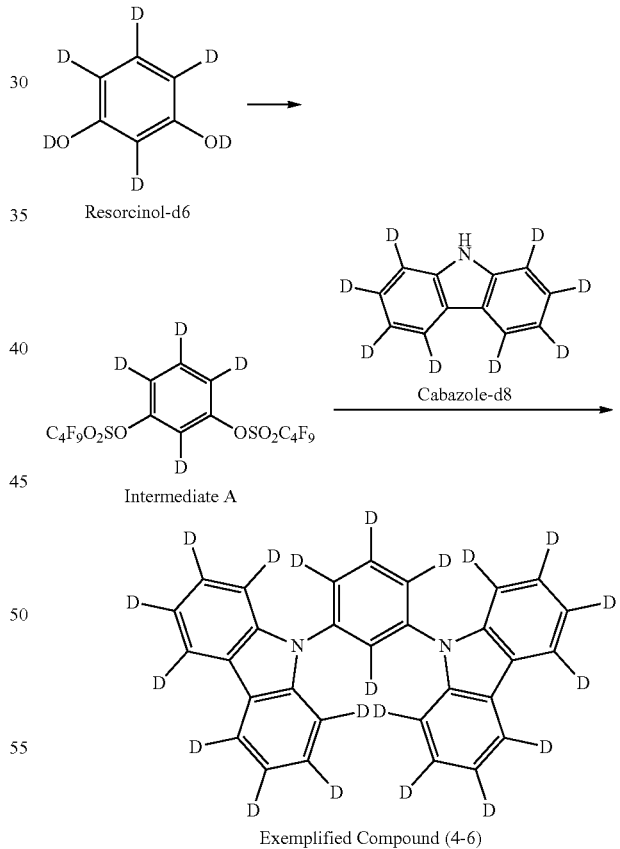

Resorcinol-d6 can be synthesized according to the method described in J. Am. Chem. Soc., Vol. 126, No. 40, 13033-03043 (2004).

Resorcinol-d6 (4.6 g) and triethylamine (14 ml) are mixed in dehydrated acetonitrile (40 ml). While cooling the reaction vessel in a water bath, nonafluorobutanesulfonyl fluoride (15.5 ml) is added. After stirring the reaction mixture at room temperature for 3 hours, water is added, and the organic layer is extracted from the reaction solution with a mixed solvent of hexane-ethyl acetate. The organic layer extracted is washed with dilute hydrochloric acid, water and saturated brine in this order, dried with sodium sulfate anhydride, and then the solvent is distilled off under reduced pressure to obtain 25.9 g of a crude product of intermediate A.

The crude product of intermediate A (13.6 g), carbazole-d8 (7.0 g), bis(benzylideneacetone) palladium (0.56 g), XantPhos (CAS No. 161265-03-8, 1.16 g), and rubidium carbonate (23 g) are mixed in toluene (200 ml) in nitrogen atmosphere, and the mixture is refluxed with heating. After the elapse of 8 hours, bis(benzylideneacetone) palladium (0.28 g) is additionally added, and the reaction mixture is refluxed with heating for further 3 hours. After cooling the reaction mixture to room temperature, water and ethyl acetate are added to the reaction mixture, and an organic layer obtained by filtering the insoluble matter is washed with water and saturated brine, and dried with sodium sulfate anhydride. A crude product obtained by the concentration of the organic layer under reduced pressure is purified by silica gel column chromatography (a mixed eluent of hexane/ethyl acetate having a volume ratio of 20), and further subjected to recrystallization and sublimation purification to obtain 2.7 g of exemplified Compound (4-6).

The degree of conversion to deuterium of exemplified Compound (4-6) measured by $^1$H-NMR with 1,2-dibromobutane as the internal standard substance, and heavy chloroform and heavy dimethyl sulfoxide as the solvents is 96% at every position.

In the above manufacturing method, when a defined substituent changes under the condition of a certain synthesizing method, or when it is not suitable to perform the method, the manufacture is easily possible by the means such as protection or de-protection of the functional groups (for example, T. W. Greene, Protective Groups in Organic Synthesis, John Wiley & Sons Inc. (1981)). Further, if necessary, it is also possible to arbitrarily change the order of the reaction processes such as the introduction of substituents and the like.

Manufacture and Evaluation of Organic Electroluminescent Device:

(1) Manufacture of Organic Electroluminescent Device in Comparative Example 1:

A glass substrate having an ITO film having a thickness of 0.5 mm and 2.5 cm square (manufactured by Geomatec Co., Ltd., surface resistance: 10Ω/□) is put in a washer and subjected to ultrasonic washing in 2-propanol, and then UV-ozone treatment for 30 minutes. The following organic layers are deposited in order on the transparent anode (ITO film) by vacuum deposition.

The deposition speed in the examples of the invention is 0.2 nm/sec unless otherwise indicated. The deposition speed is measured with a quartz oscillator film formation controller, CRTM-9000 (manufactured by ULVAC, Inc.). The film thickness of each film shown below is also computed from the calibration curves formed from the numeric value of CRTM-9000 and the thickness measured with a Dektak feeler type thickness meter.

<1> Compound A: Film thickness: 80 nm
<2> Compound B: Film thickness: 10 nm
<3> Co-deposition of Comparative Compound 1+light-emitting material A (10 wt %): Film thickness: 60 nm
<4> Compound C: Film thickness: 10 nm
<5> Compound D: Film thickness: 30 nm Finally, lithium fluoride of 0.1 nm and metal aluminum are deposited in this order in a thickness of 100 nm to prepare a cathode. This is put in a glove box replaced with argon gas so as not to be in contact with the air, and sealed with a stainless steel sealing can and a UV-curing type adhesive (XNR5516HV, manufactured by Nagase Ciba) to thereby obtain an organic electroluminescent device in Comparative Example 1.

(2) Manufacture of Organic Electroluminescent Devices in Comparative Examples 2 to 8 and Examples 1 to 8:

Organic electroluminescent devices in Comparative Examples 2 to 8 and Examples 1 to 8 are manufactured according to the same manner as in Comparative Example 1 except for changing, as shown in Table 1 below, light-emitting material A to light-emitting materials B to H having the structures shown below, Comparative Compound 1 to Comparative Compound 2, exemplified Compound (1-3) and exemplified Compound (4-6) shown below.

The chemical structures of Compounds A to D are shown below.

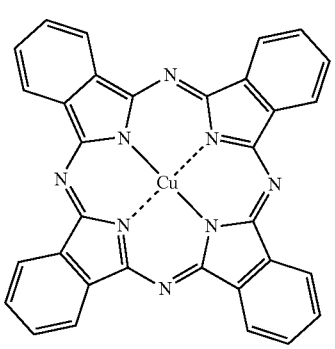

Compound A

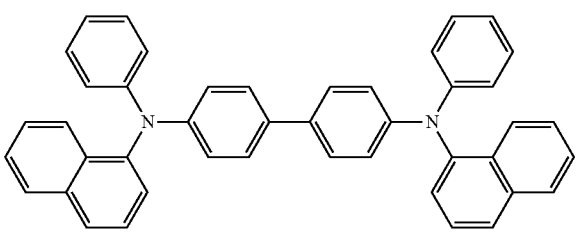

Compound B

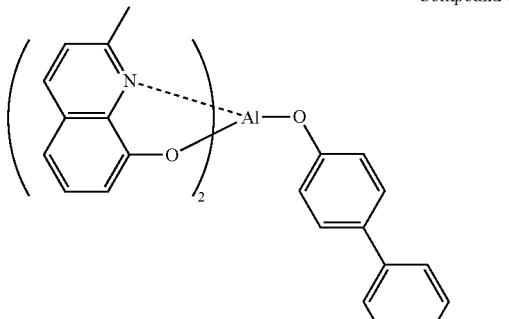

Compound C

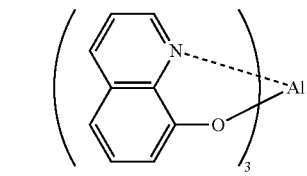

Compound D

The chemical structures of light-emitting materials A to H and emission wavelengths in a state of solution are as follows.

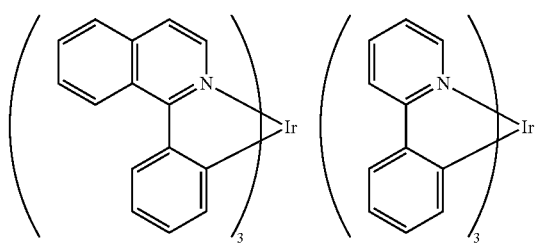

Light-Emitting
Material A
(620 nm)

Light-Emitting
Material B
(514 nm)

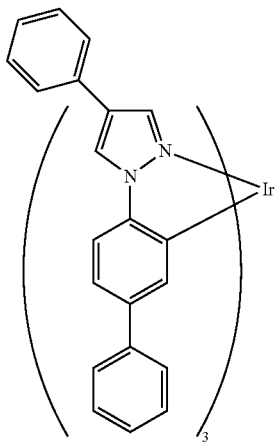

Light-Emitting
Material C
(478 nm)

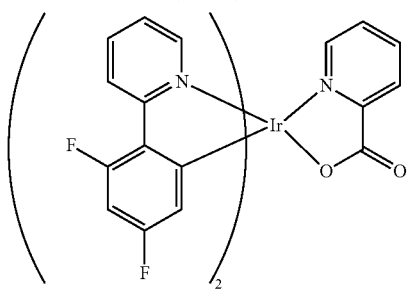

Light-Emitting
Material D
(466 nm)

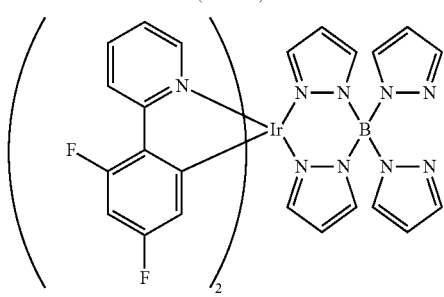

Light-Emitting
Material E
(460 nm)

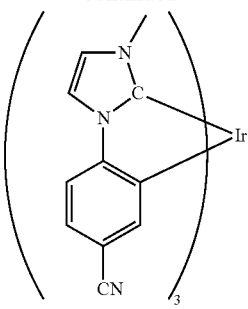

Light-Emitting
Material F
(458 nm)

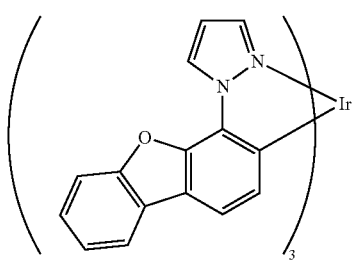

Light-Emitting
Material G
(456 nm)

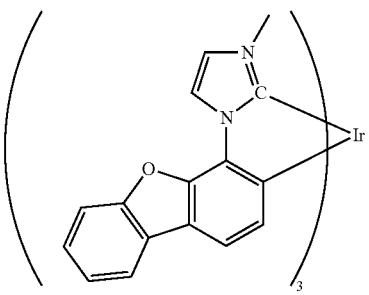

Light-Emitting
Material H
(444 nm)

The chemical structures of Comparative Compounds 1 to 3 are shown below.

Comparative Compound 1

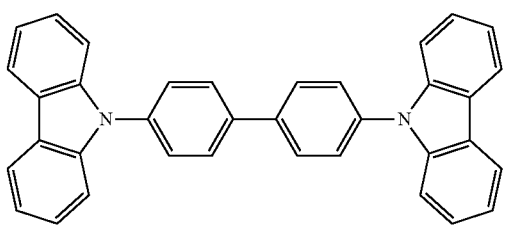

-continued

Comparative Compound 2

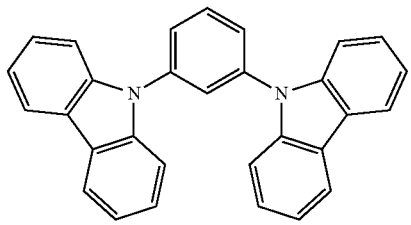

Comparative Compound 3

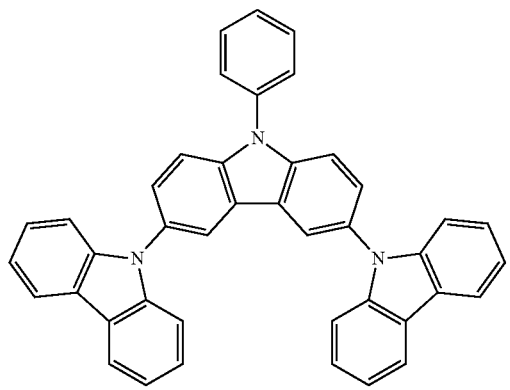

The chemical structures of exemplified Compounds (1-3) and (4-6) are shown below.

Exemplified Compound (1-3)

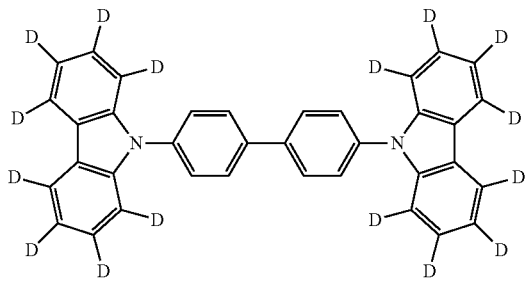

Exemplified Compound (4-6)

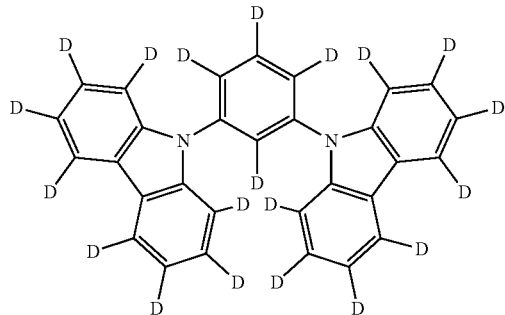

The obtained organic electroluminescent devices are evaluated according to the following methods.

(1) Measurement of Driving Voltage

Each of the organic electroluminescent devices is set on an emission spectrum measuring system, ELS1500 (manufactured by Shimadzu Corporation), and the applied voltage is measured when the luminance is 100 Cd/m².

(2) Evaluation of driving durability

Each of the organic electroluminescent devices is set on OLED test system ST-D type (manufactured by TSK Co.), and the device is driven on the condition of normal direction constant current of 0.4 mA by constant current mode, and half life of luminance (time required for luminance to lower to 50% from the initial luminance) is found.

The results of evaluations of organic electroluminescent devices are as shown in Table 1 below. As for driving voltage and half life time of luminance, the results of Example are shown in a relative value with the results of Comparative Example as 100 in the combination of Example and Comparative Example using the same light-emitting material.

TABLE 1

| Example No. | Light-Emitting Material | Material to be Deposited with Light-Emitting Material | Driving Voltage in Relative Value | Half Life Time of Luminance in Relative Value |
| --- | --- | --- | --- | --- |
| Comparative Example 1 | Light-Emitting Material A | Comparative Compound 1 | 100 | 100 |
| Example 1 | Light-Emitting Material A | Exemplified Compound (1-3) | 95 | 110 |
| Comparative Example 2 | Light-Emitting Material B | Comparative Compound 1 | 100 | 100 |
| Example 2 | Light-Emitting Material B | Exemplified Compound (1-3) | 97 | 115 |
| Comparative Example 3 | Light-Emitting Material C | Comparative Compound 2 | 100 | 100 |
| Example 3 | Light-Emitting Material C | Exemplified Compound (4-6) | 95 | 112 |
| Comparative Example 4 | Light-Emitting Material D | Comparative Compound 2 | 100 | 100 |
| Example 4 | Light-Emitting Material D | Exemplified Compound (4-6) | 90 | 140 |
| Comparative Example 5 | Light-Emitting Material E | Comparative Compound 2 | 100 | 100 |
| Example 5 | Light-Emitting Material E | Exemplified Compound (4-6) | 92 | 135 |
| Comparative Example 6 | Light-Emitting Material F | Comparative Compound 2 | 100 | 100 |
| Example 6 | Light-Emitting Material F | Exemplified Compound (4-6) | 90 | 160 |
| Comparative Example 7 | Light-Emitting Material G | Comparative Compound 2 | 100 | 100 |
| Example 7 | Light-Emitting Material G | Exemplified Compound (4-6) | 80 | 210 |
| Comparative Example 8 | Light-Emitting Material H | Comparative Compound 2 | 100 | 100 |
| Example 8 | Light-Emitting Material H | Exemplified Compound (4-6) | 85 | 180 |

From the above results, the organic electroluminescent devices of the invention using the compounds represented by formula (I) and iridium complex phosphorescent materials in combination have conspicuous effect and, in particular, the shorter the light-emitting wavelength of the light-emitting material in combination, the more conspicuous is the effect (2) Manufacture and Evaluation of Organic Electroluminescent Devices in Comparative Examples 2-1 to 2-13 and Examples 2-1 to 2-7:

The devices in Comparative Examples 2-1 to 2-13 and Examples 2-1 to 2-7 are manufactured in the same manner as in Comparative Example 1 and evaluated in the same manner except for changing the light-emitting material A and comparative compound 1 in the device in Comparative Example 1 to the combinations of the light-emitting materials and materials to be co-deposited with the light-emitting materials (host materials) shown in Table 2 below. The results obtained are shown in Table 2. However, the devices in Comparative Example 2-5* and Example 2-5** have a layer containing comparative compound 3 having a thickness of 3 nm and a layer containing exemplified compound (12-2) having a thickness of 3 nm respectively between the layer containing compound B and the layer containing comparative compound 1 in Comparative Example 1,

TABLE 2

| Example No. | Light-Emitting Material | Material to Be Co-deposited with Light-Emitting Material | Driving Voltage in Relative Value | Half Life Time of Luminance in Relative Value |
|---|---|---|---|---|
| Comparative Example 2-1 | Light-Emitting Material E | Comparative Compound 4 | 100 | 100 |
| Example 2-1 | Light-Emitting Material E | Exemplified Compound (2-3) | 95 | 140 |
| Comparative Example 2-2 | Light-Emitting Material E | Comparative Compound 5 | 100 | 100 |
| Example 2-2 | Light-Emitting Material E | Exemplified Compound (3-1) | 98 | 130 |
| Comparative Example 2-3 | Light-Emitting Material E | Comparative Compound 6 | 100 | 100 |
| Example 2-3 | Light-Emitting Material E | Exemplified Compound (5-3) | 90 | 135 |
| Comparative Example 2-4 | Light-Emitting Material G | Comparative Compound 7 | 100 | 100 |
| Example 2-4 | Light-Emitting Material G | Exemplified Compound (8-2) | 98 | 200 |
| Comparative Example 2-5* | Light-Emitting Material G | Comparative Compound 7 | 100 | 100 |
| Example 2-5** | Light-Emitting Material G | Exemplified Compound (8-2) | 95 | 220 |
| Comparative Example 2-6 | Light-Emitting Material G | Comparative Compound 8 | 100 | 100 |
| Example 2-6 | Light-Emitting Material G | Exemplified Compound (9-5) | 89 | 190 |
| Comparative Example 2-7 | Light-Emitting Material G | Comparative Compound 9 | 100 | 100 |
| Example 2-7 | Light-Emitting Material G | Exemplified Compound (14-3) | 87 | 195 |
| Comparative Example 2-8 | Light-Emitting Material I | Comparative Compound 1 | 100 | 100 |
| Comparative Example 2-9 | Light-Emitting Material I | Exemplified Compound (1-3) | 98 | 110 |
| Comparative Example 2-10 | Light-Emitting Material J | Comparative Compound 4 | 100 | 100 |
| Comparative Example 2-11 | Light-Emitting Material J | Exemplified Compound (2-3) | 95 | 105 |
| Comparative Example 2-12 | Light-Emitting Material K | Comparative Compound 2 | 100 | 100 |
| Comparative Example 2-13 | Light-Emitting Material K | Exemplified Compound (4-1) | 97 | 103 |

*Having a layer containing comparative compound 3 having a thickness of 3 nm.
**Having a layer containing exemplified compound (12-2) having a thickness of 3 nm.

The chemical structures of light-emitting materials I to K are as shown below.

Light-Emitting Material I

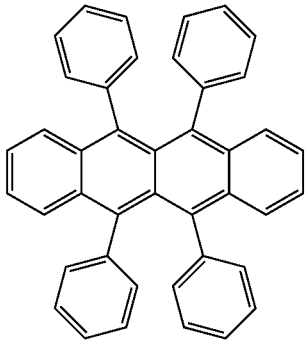

Light-Emitting Material J

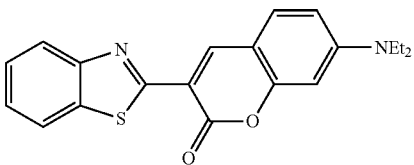

Light-Emitting Material K

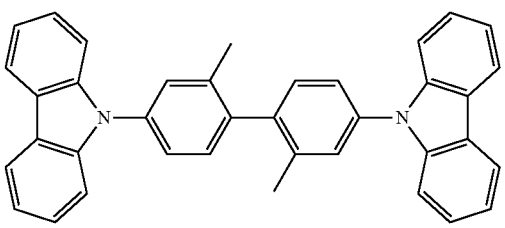

The chemical structures of comparative compounds 4 to 9 are as shown below.

Comparative Compound 4

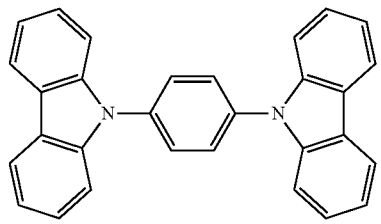

Comparative Compound 5

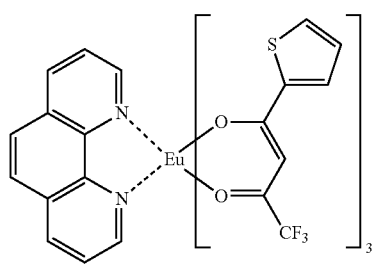

Comparative Compound 6

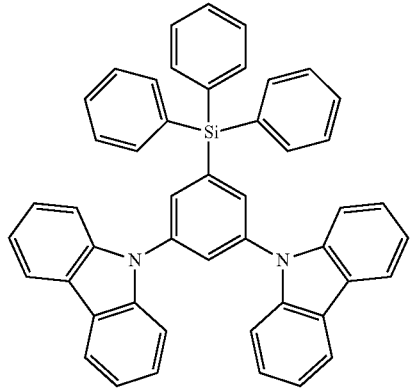

-continued

Comparative Compound 7

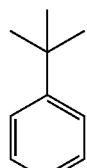

Comparative Compound 8

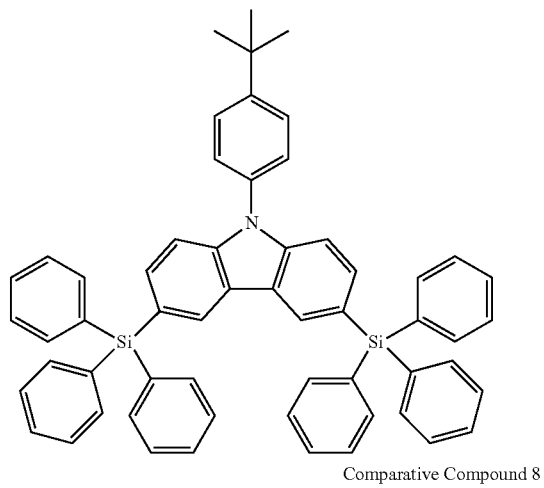

Comparative Compound 9

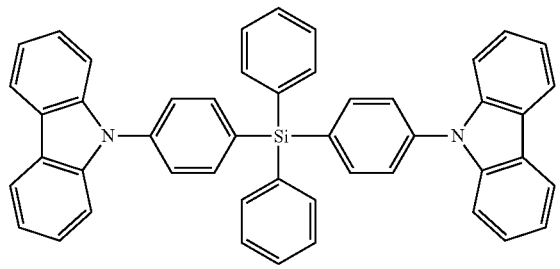

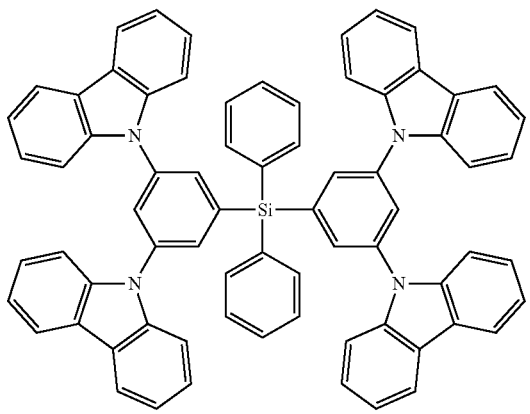

From the results shown in Table 2, in the embodiment of combining the compounds represented by formula (I) and iridium complex phosphorescent materials, the organic electroluminescent devices in the invention have especially conspicuous effect, and also have the effect even when used in the layer other than the light-emitting layer.

(3) Manufacture and Evaluation of Organic Electroluminescent Devices in Comparative Examples 3-1 and 3-2 and Examples 3-1 and 3-2:

The devices in Comparative Examples 3-1 and 3-2 and Examples 3-1 and 3-2 are manufactured in the same manner as in Comparative Example 1 and evaluated in the same manner except for changing compound B and comparative compound 1 in the device in Comparative Example 1 to the materials shown in Table 3 below. The results obtained are shown in Table 3.

TABLE 3

| Luminescent Device | Layer of Compound B | Layer of Comparative Compound 1 | Driving Voltage in Relative Value | Half Life Time of Luminance in Relative Value |
|---|---|---|---|---|
| Comparative Example 3-1 | Comparative Compound 5 | Comparative Compound 1 | 100 | 100 |
| Example 3-1 | Exemplified Compound (3-3) | Comparative Compound 1 | 97 | 130 |
| Comparative Example 3-2 | Comparative Compound 5 | Comparative Compound 1 | 100 | 100 |
| Example 3-2 | Exemplified Compound (3-3) | Exemplified Compound (1-3) | 89 | 205 |

From the results in Table 3, it is seen that the effect of the invention can also be obtained by using the compound represented by formula (I) in the organic layer contiguous to the light-emitting layer, and especially conspicuous effect can be obtained by using the compound represented by formula (I) in each of the light-emitting layer and the organic layer contiguous to the light-emitting layer.

(4) Manufacture and Evaluation of Organic Electroluminescent Devices in Comparative Examples 4-1 and 4-2:

The devices in Comparative Examples 4-1 and 4-2 are manufactured in the same manner as in Comparative Example 1 and evaluated in the same manner except for changing comparative compound 1 and compound C used in the organic electroluminescent device in Comparative Example 1 to the materials shown in Table 4 below. The results obtained are shown in Table 4.

TABLE 4

| Luminescent Device | Layer of Comparative Compound 1 | Layer of Compound C | Driving Voltage in Relative Value | Half Life Time of Luminance in Relative Value |
|---|---|---|---|---|
| Comparative Example 4-1 | Comparative Compound 2 | Compound C | 100 | 100 |
| Comparative Example 4-2 | Comparative Compound 2 | Compound E | 98 | 103 |

The chemical structure of compound E is as shown below.

Compound E

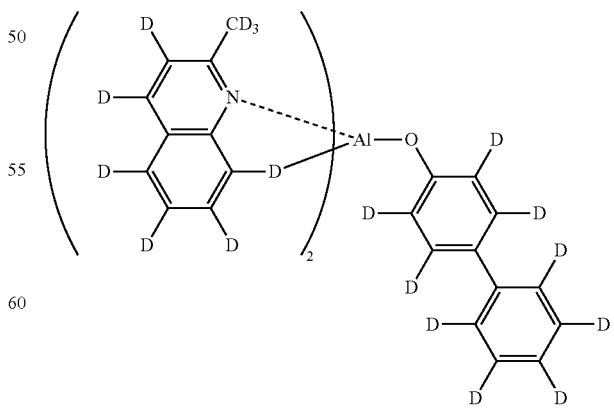

In Table 4, there is almost no difference in the effects in driving voltage and in half life time of luminance in the case of using compound C and in the case of using compound E obtained by deuterating compound C.

The results in Tables 1 and 4 show that the effect of the invention is not obtained by deuteration of a compound but is a peculiar effect obtained by using the compound represented by formula (I) having a specific structure and containing a deuterium atom.

The invention can provide an organic electroluminescent device excellent in efficiency (electric power consumption) and durability.

The entire disclosure of each and every foreign patent application from which the benefit of foreign priority has been claimed in the present application is incorporated herein by reference, as if fully set forth.

What is claimed is:

1. A compound of Formula (I)

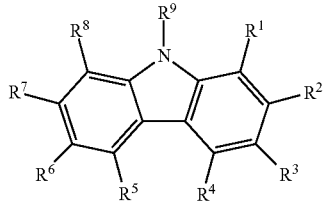

Formula (I)

wherein
$R^1$, $R^2$, $R^3$, $R^4$, $R^5$, $R^6$, $R^7$ and $R^8$ each represents a hydrogen atom or a substituent, and contiguous substituents of $R^1$ to $R^8$ may be bonded to each other to form a condensed ring;
at least one of $R^1$ to $R^8$ represents a deuterium atom or a substituent containing a deuterium atom;
$R^9$ represents a silyl group which may be substituted with a substituent; or
$R^9$ represents an aryl group which optionally comprises deuterium and which is substituted with a silyl group, wherein the silyl group may be further substituted; or
$R^9$ represents an aryl group which is substituted with a substituent selected from the group consisting of an alkenyl group, an alkynyl group, a hetero-aryl group, an amino group, a heterocyclic oxy group, an acyl group, an alkoxycarbonyl group, an aryloxycarbonyl group, an acyloxy group, an acylamino group, an alkoxycarbonylamino group, an aryloxycarbonylamino group, a sulfonylamino group, a sulfamoyl group, a carbamoyl group, an alkylthio group, an arylthio group, a heterocyclic thio group, a sulfonyl group, a sulfinyl group, a ureido group, a phosphoric acid amido group, a hydroxyl group, a mercapto group, a cyano group, a sulfo group, a carboxyl group, a nitro group, a hydroxamic acid group, a sulfino group, a hydrazino group, an imino group, a heterocyclic group, a silyloxy group, and combinations thereof, wherein the aryl and any substituent optionally comprises deuterium; and
wherein $R^9$ is not

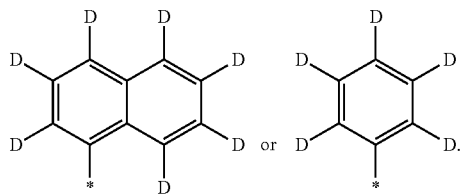

2. The compound of claim 1, wherein at least two of $R^1$ to $R^8$ represent a deuterium atom.

3. The compound of claim 1, wherein $R^1$ to $R^8$ each represent a deuterium atom.

4. The compound of claim 1, wherein the structure

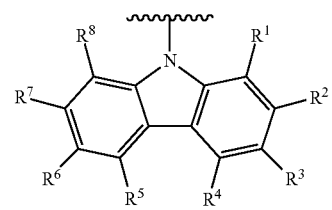

is represented by one of structures a-1 to a-7, b-1, b-2, b-4, c-1 to c-5, d-1 to d-5, e-1 to e-5, f-1 to f-6, g-1 to g-3, h-1 to h-e, i-1 to i-3, j-1 to j-3, or k-1 to k-3:

a-1

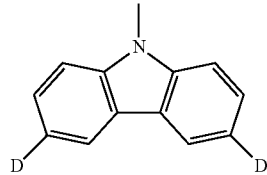

a-2

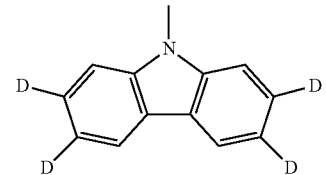

a-3

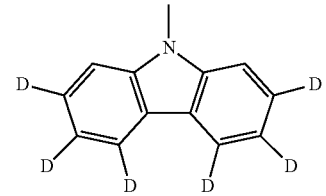

a-4

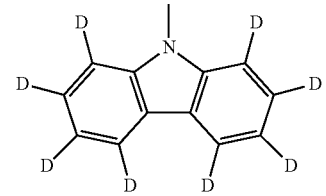

a-5

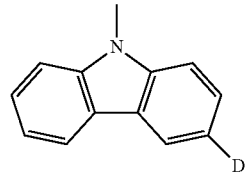

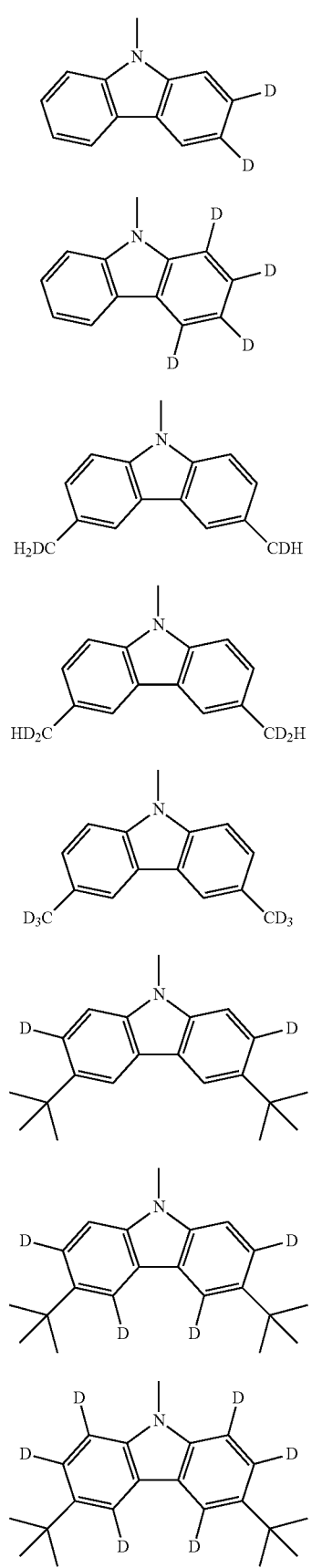
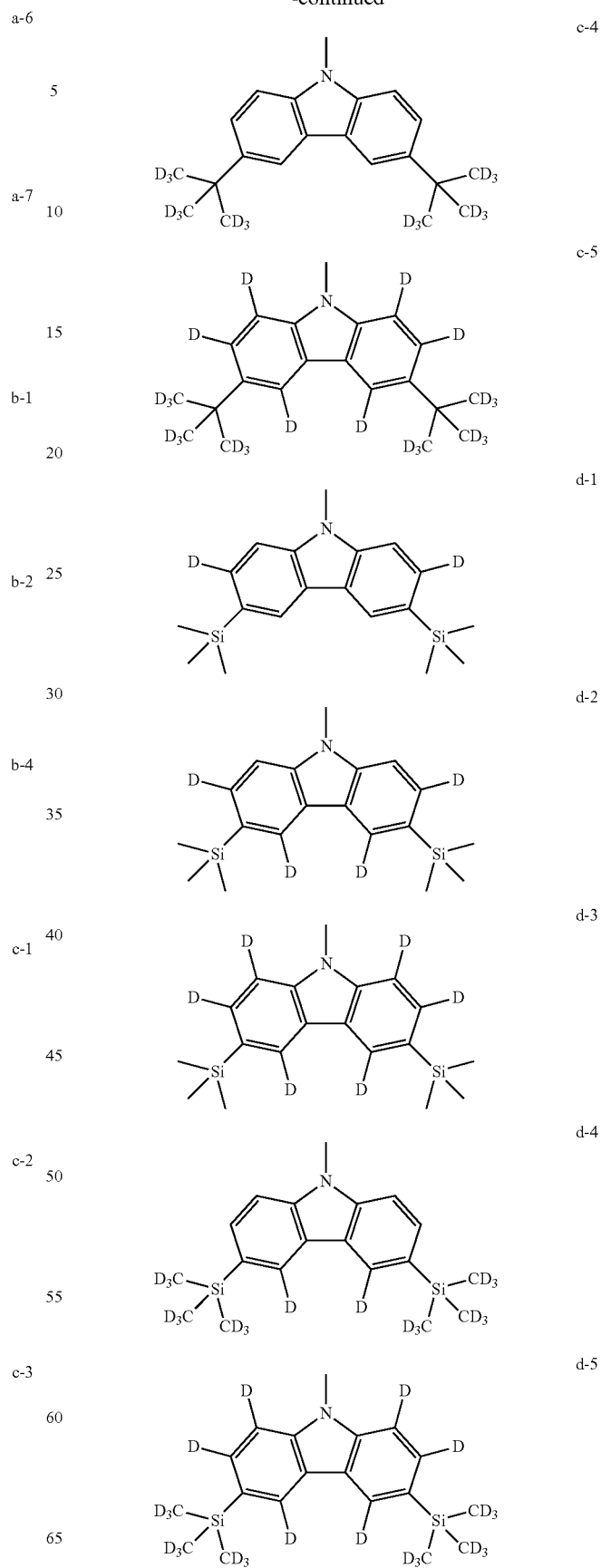

-continued
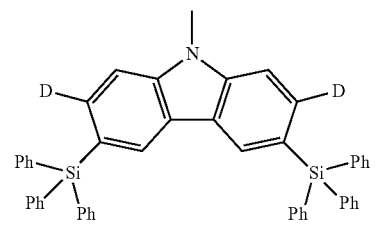
e-1
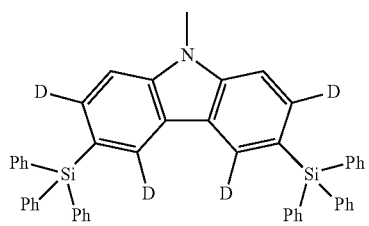
e-2
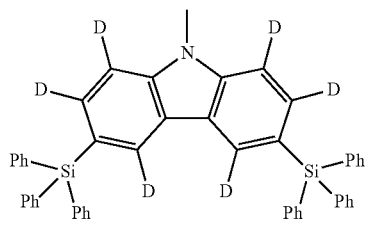
e-3
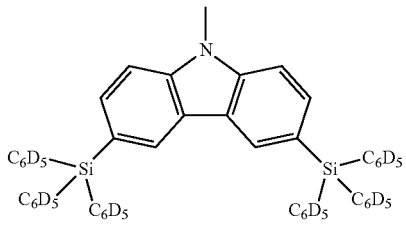
e-4
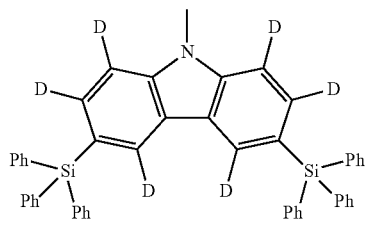
e-5
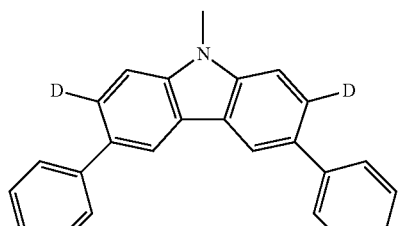
f-1
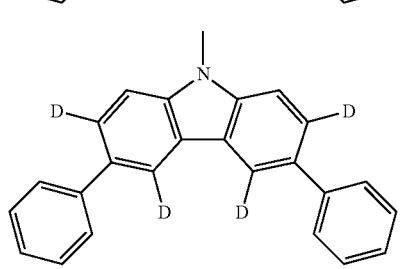
f-2
-continued
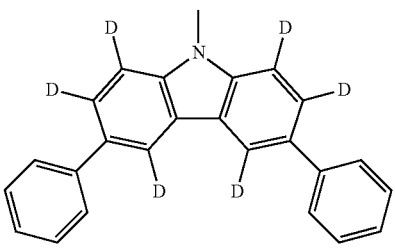
f-3
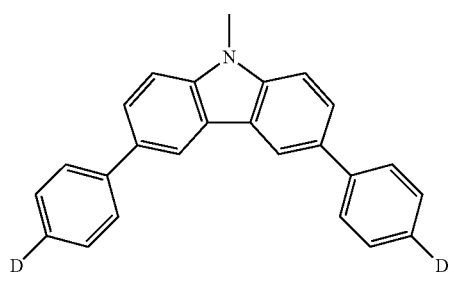
f-4
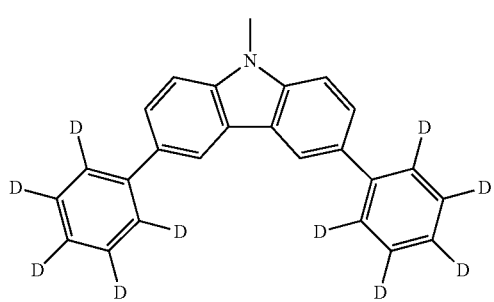
f-5
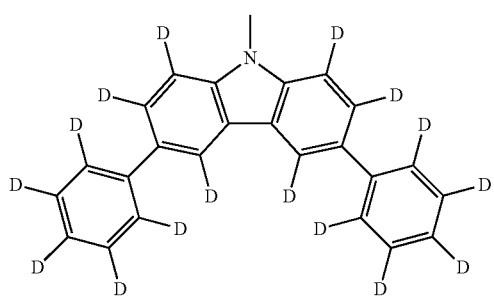
f-6
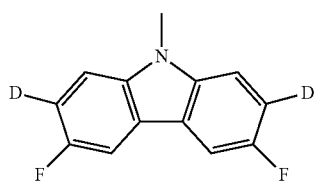
g-1
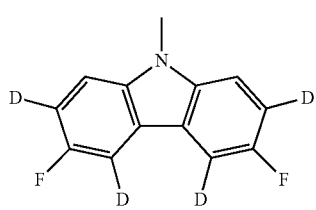
g-2

113
-continued
g-3
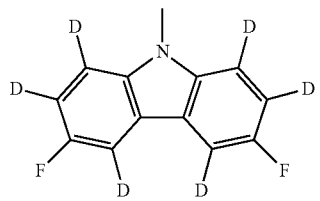
h-1
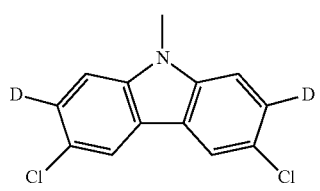
h-2
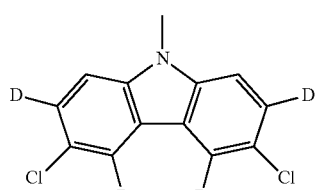
h-3
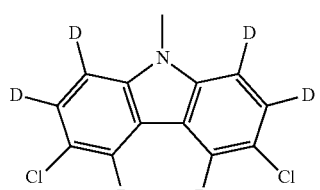
i-1
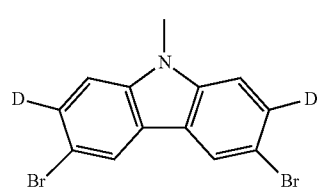
i-2
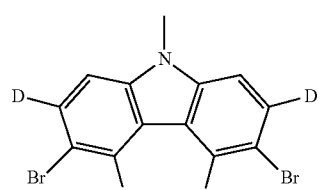
i-3
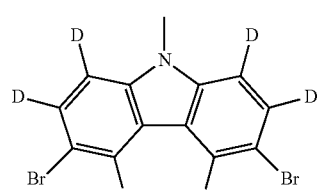
j-1
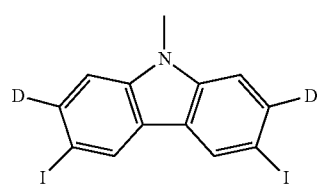
114
-continued
j-2
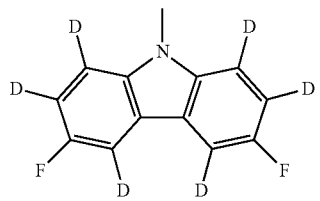
j-3
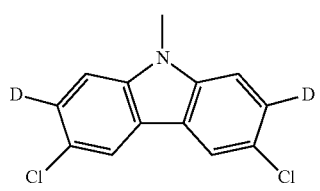
k-1
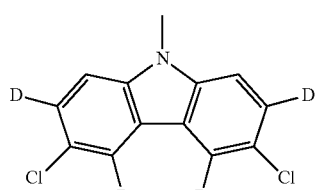
k-2
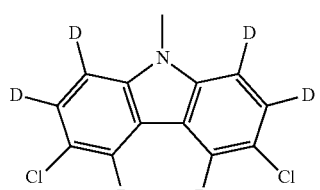
k-3
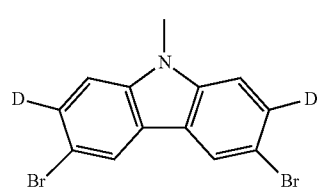
5. The compound of claim 1, wherein $R^9$ is represented by one of the following structures where * represents the bond to the carbazole nitrogen:
1G-0
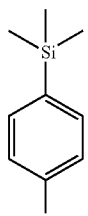
1G-1
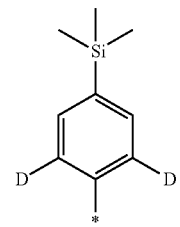

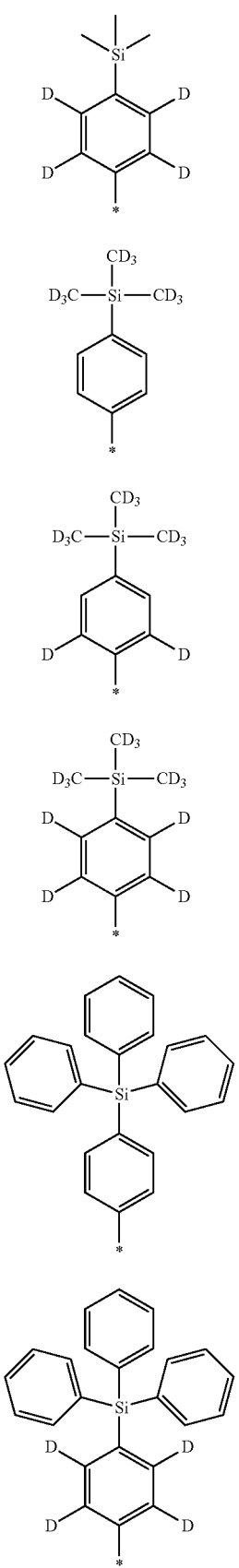
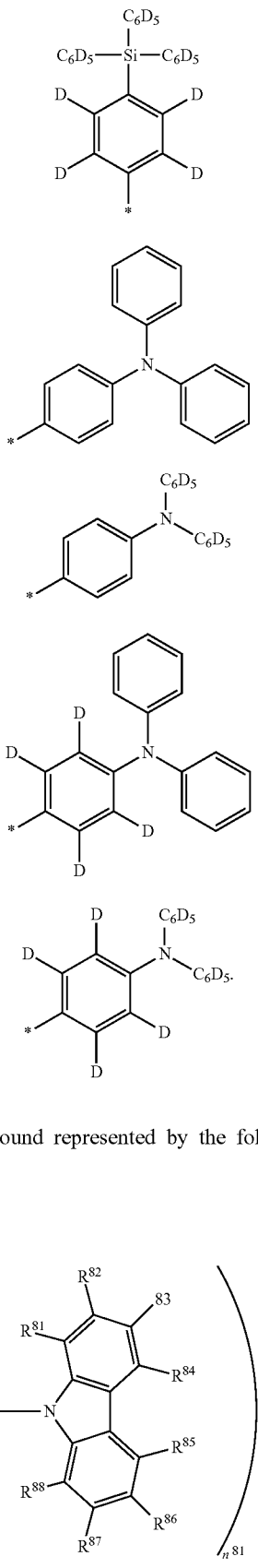
6. A compound represented by the following Formula (VIII):
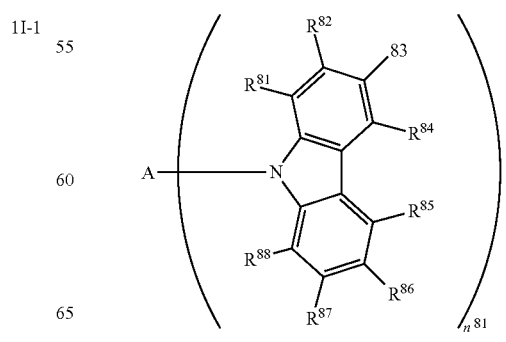
Formula (VIII)

wherein each $R^{81}$, $R^{82}$, $R^{83}$, $R^{84}$, $R^{85}$, $R^{86}$, $R^{87}$ and $R^{88}$ independently represents a hydrogen atom or a substituent, and contiguous substituents of $R^{81}$ to $R^{88}$ may be bonded to each other to form a condensed ring structure;

A represents a linking group; and $n^{81}$ represents an integer of from 2 to 6; and the compound represented by the Formula (VIII) contains at least one deuterium atom.

7. The compound of claim 6, wherein $n^{81}$ is 2 and A is represented by a structure selected from the group consisting of 2A-0 to 2M-0, where * represents the bond to the carbazole nitrogen, and where the two structures comprising carbazole and $R^{81}$ to $R^{88}$ can be the same or different:

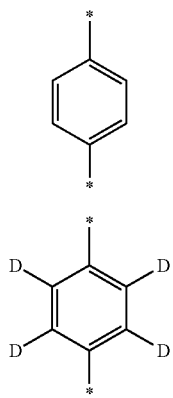

2A-0

2A-1

2B-0

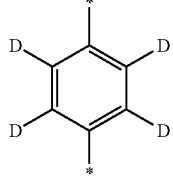

2B-1

2B-2

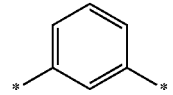

2B-3

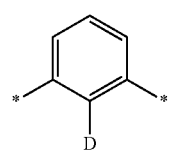

2B-4

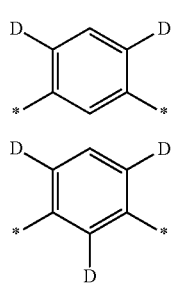

2C-0

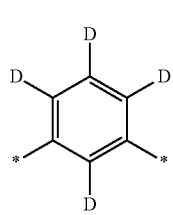

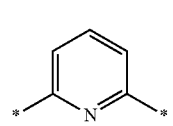

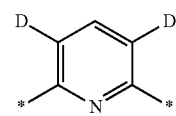

2C-1

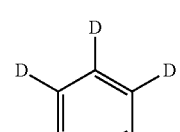

2C-2

2D-0

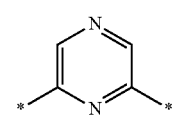

2D-1

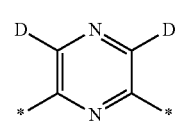

2E-0

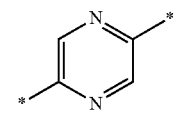

2E-1

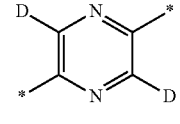

2F-0

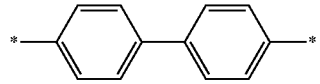

2F-1

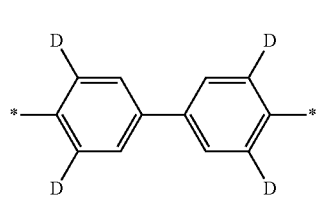

2F-2

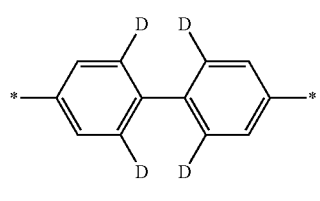

2F-3

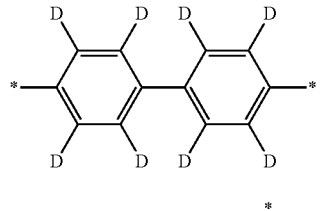

2G-0

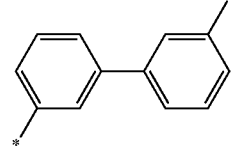

2G-1
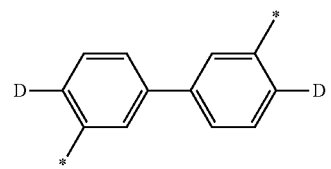
2G-2
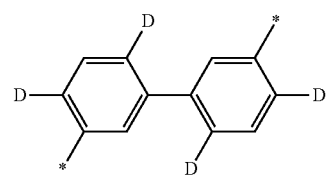
2G-3
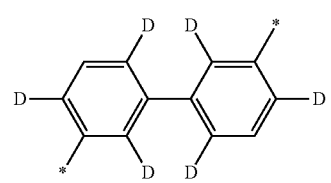
2H-0
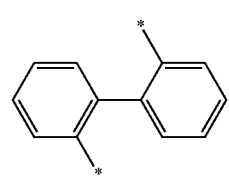
2H-1
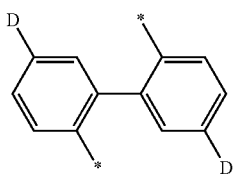
2H-2
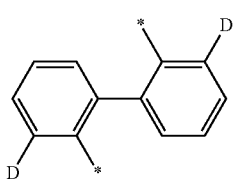
2H-3
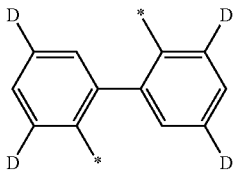
2H-4
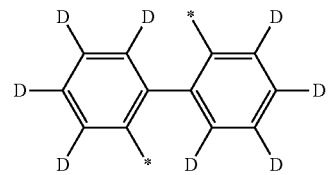
2I-0
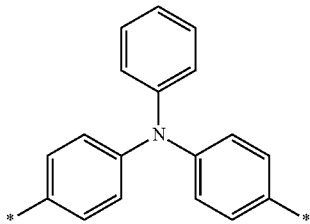
2I-1
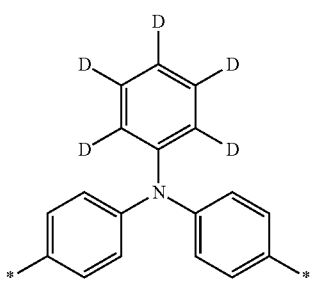
2I-2
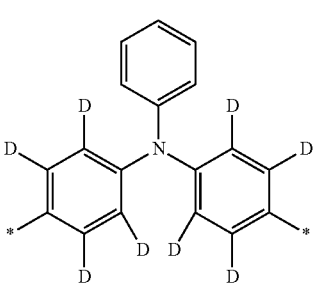
2I-3
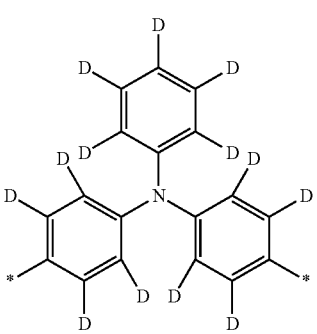
2J-0
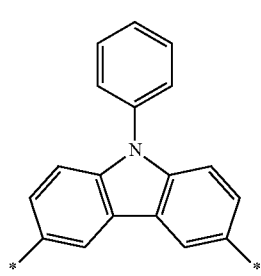

2J-1
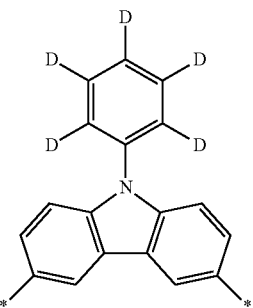
2J-2
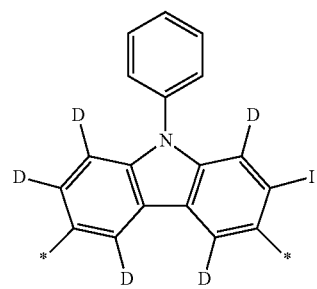
2J-3
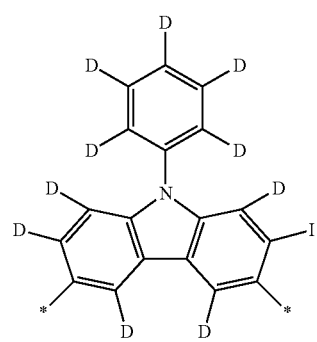
2K-0
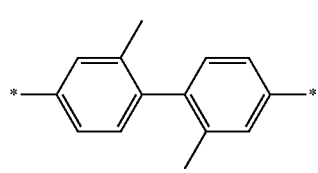
2L-0
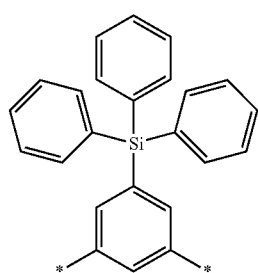
2L-1
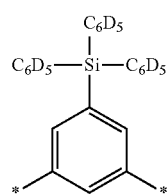
2M-0
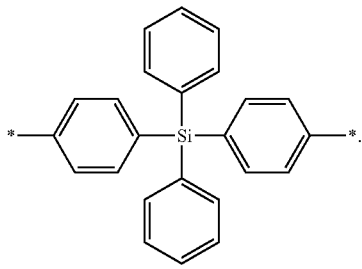
8. The compound of claim 6, wherein $n^{81}$ is 3 and A is represented by a structure selected from the group consisting of 3A-0 to 3C-1, where * represents the bond to the carbazole nitrogen, and where the three structures comprising carbazole and $R^{81}$ to $R^{88}$ can be the same or different:
3A-0
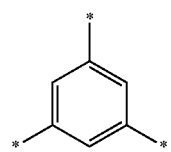
3A-1
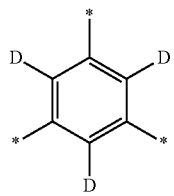
3B-0
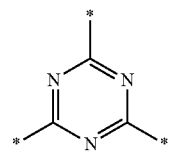
3C-0
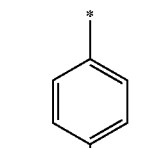
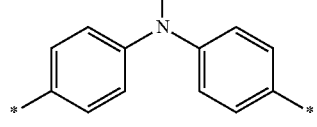
3C-1
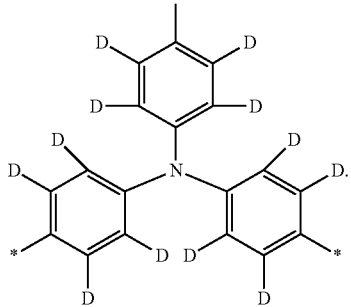

9. The compound of claim 6, wherein $n^{81}$ is 3 and A is represented by a structure selected from the group consisting of 4A-0 to 4C-0, where * represents the bond to the carbazole nitrogen, and where the four structures comprising carbazole and $R^{81}$ to $R^{88}$ can be the same or different:

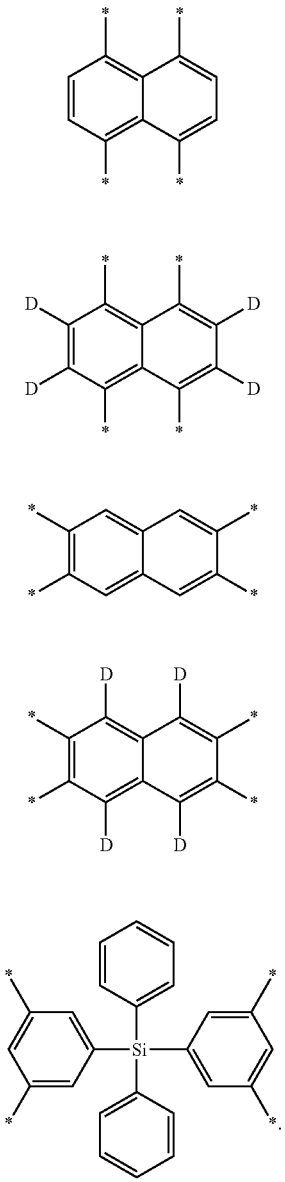

10. The compound of claim 6, wherein A is selected from the group consisting of alkylene, arylene, hetero-arylene, and silylene; and A may be further substituted.

11. The compound of 6, wherein A is selected from the group consisting of 1,2,3,4,5,6-hexa-substituted phenylene, 1,2,4,5-tetra-substituted phenylene, 1,3,5-tri-substituted phenylene, 1,2-di-substituted phenylene, 1,3-di-substituted phenylene, and 1,4-di-substituted phenylene.

12. The compound of 6, wherein the compound is represented by one of the following structures:

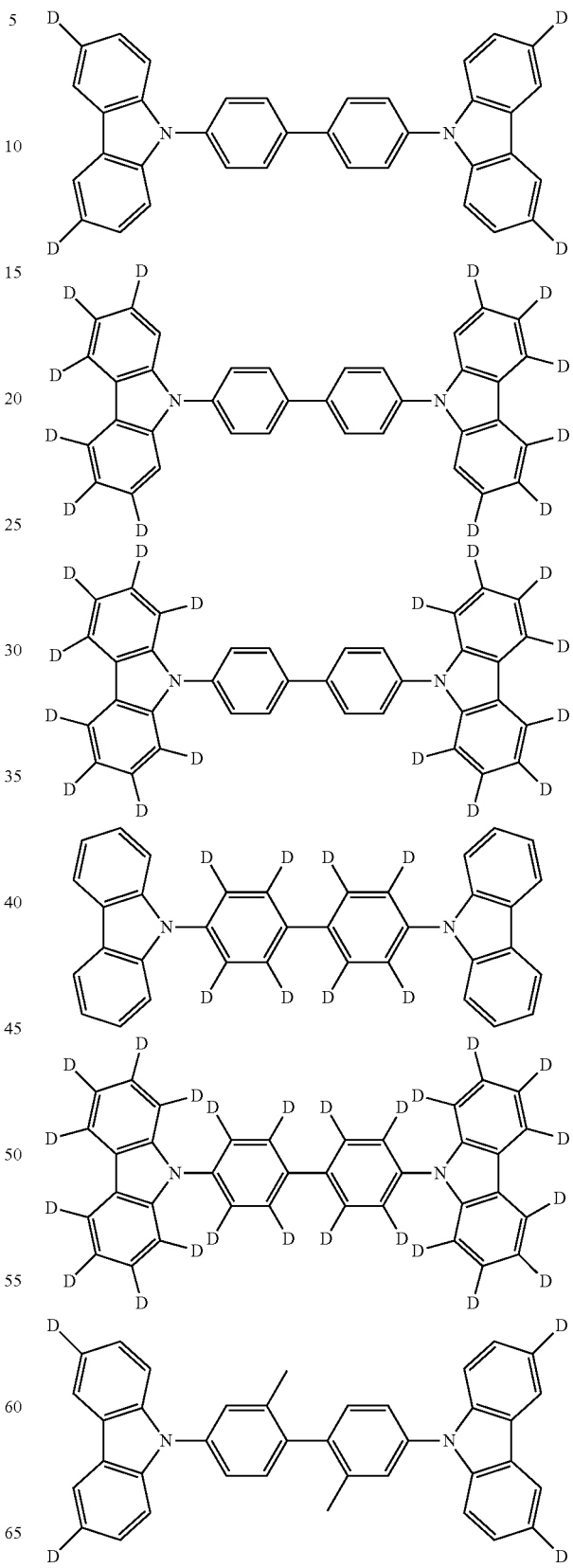

125
-continued
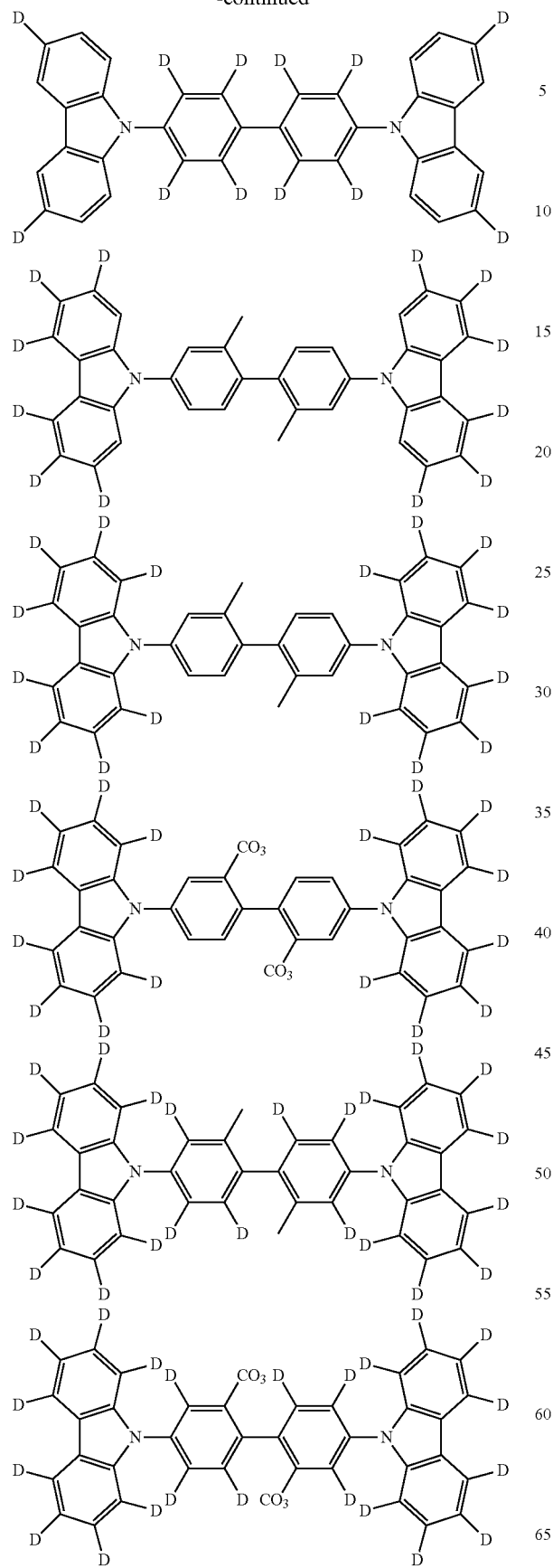
126
-continued
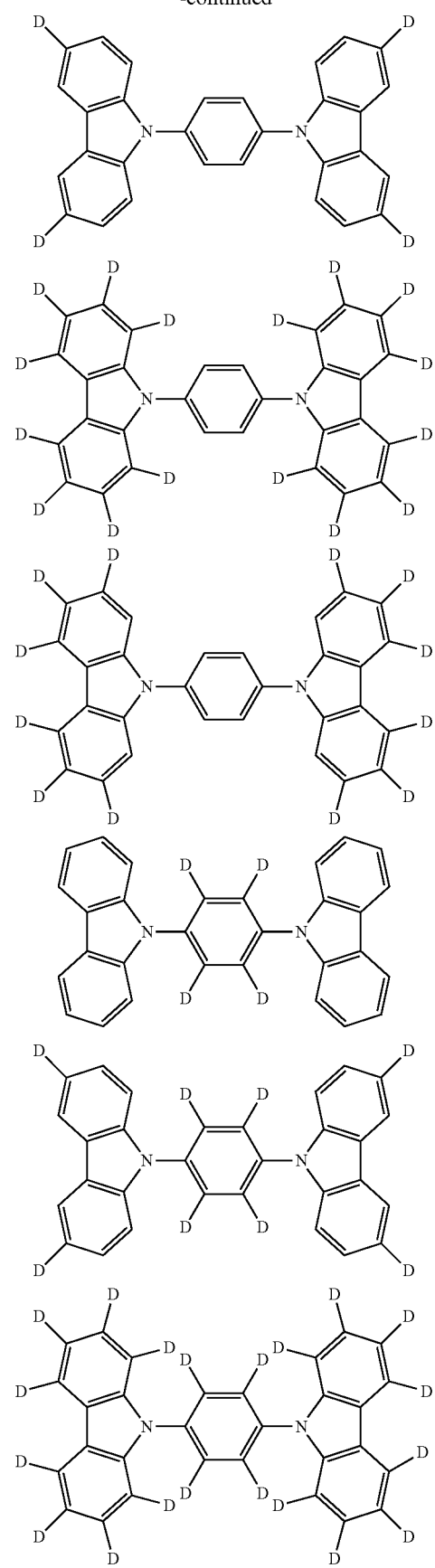

127
-continued
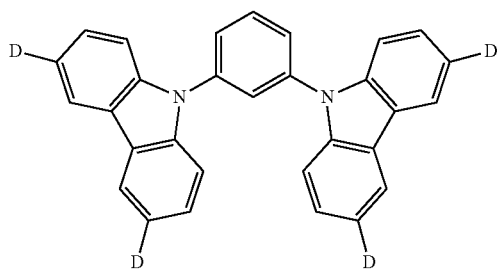
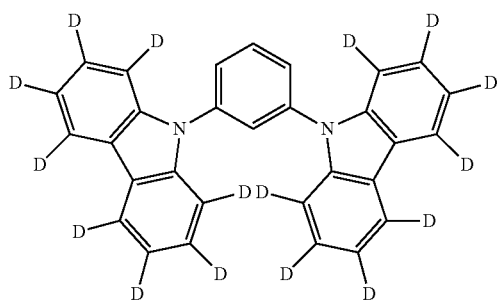
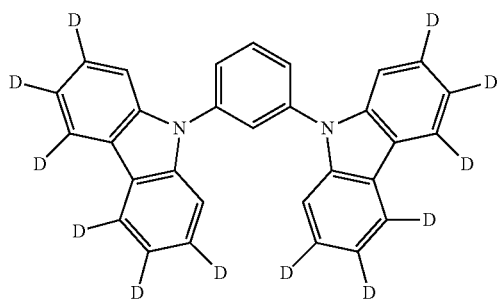
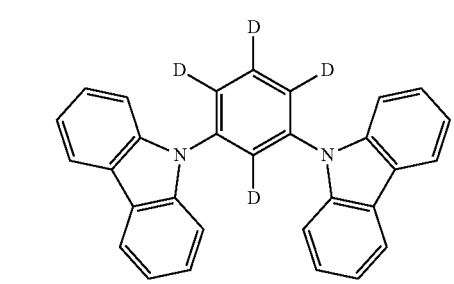
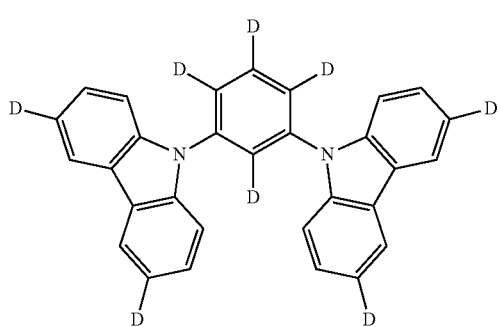
128
-continued
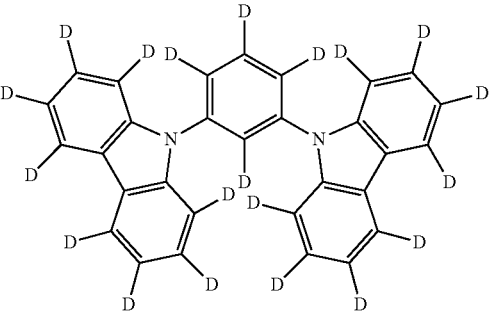
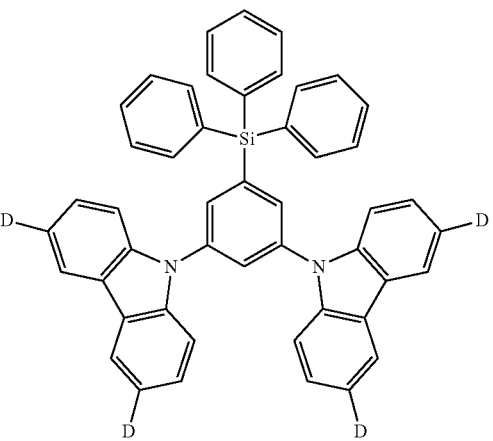
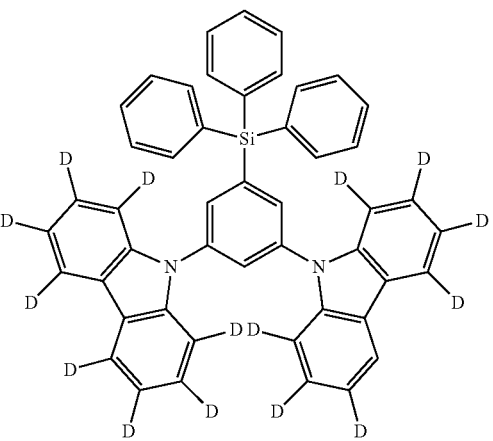
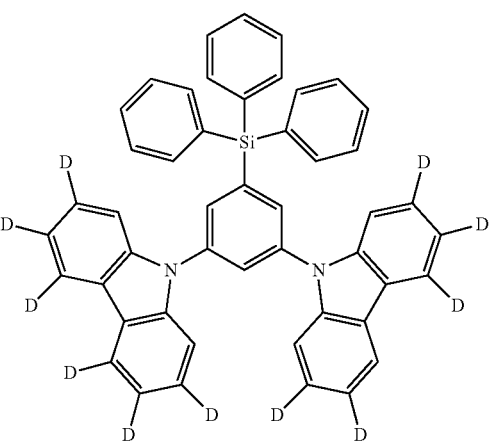

-continued
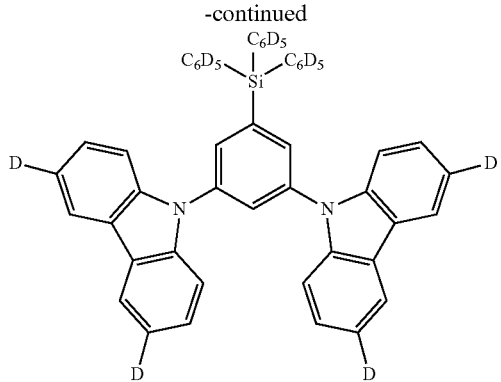
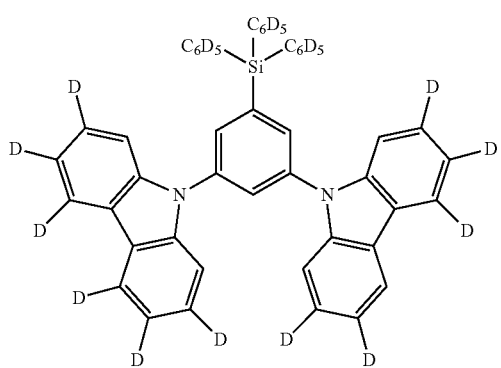
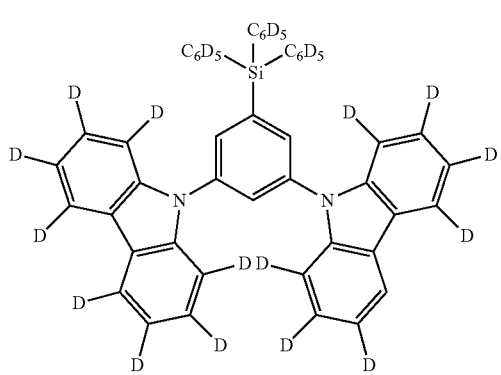
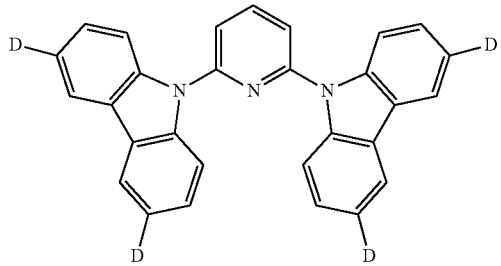
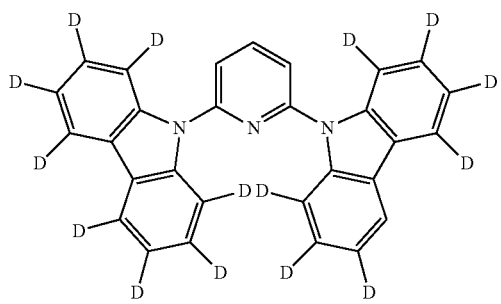
-continued
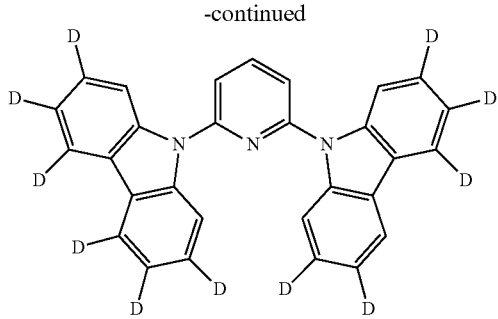
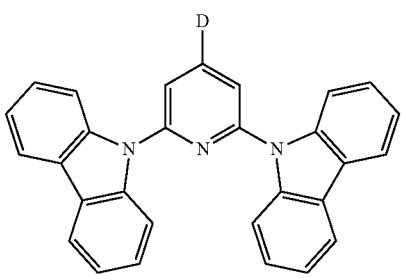
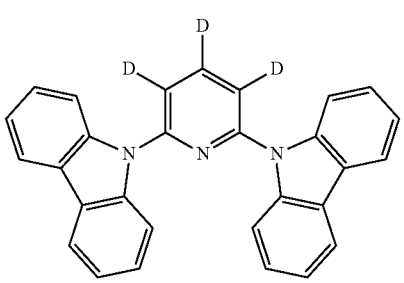
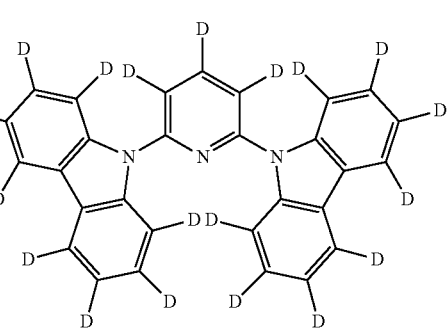
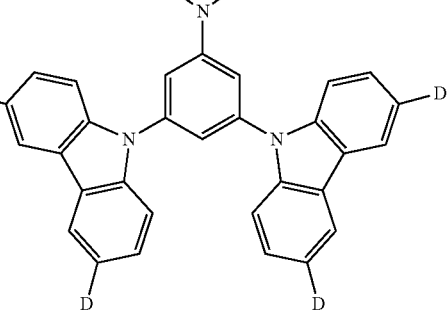

131
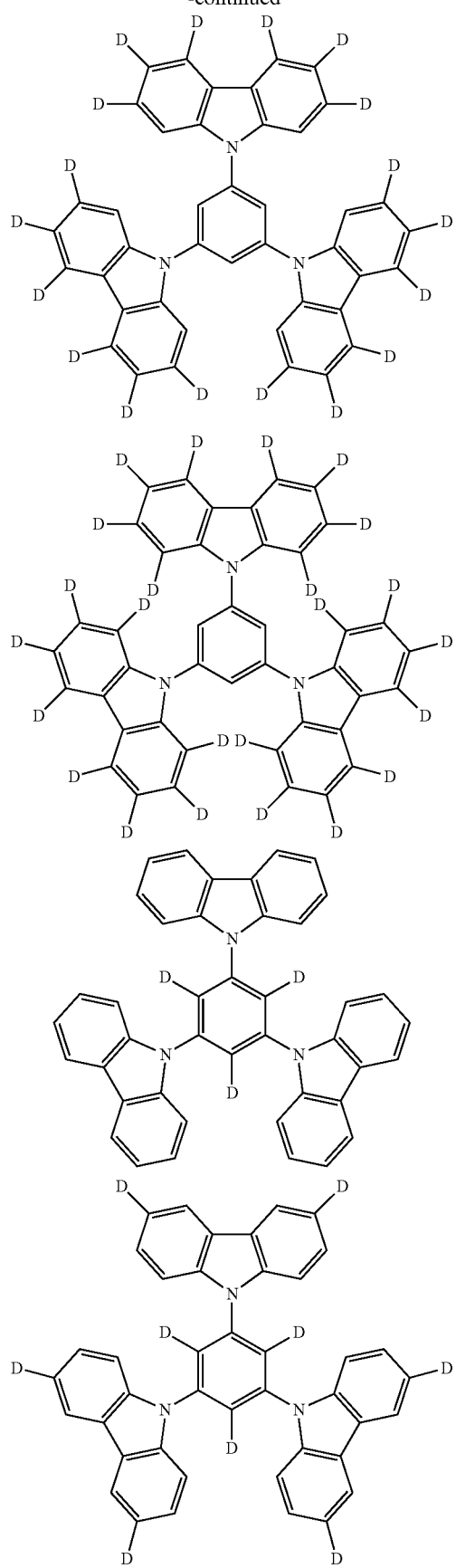
132
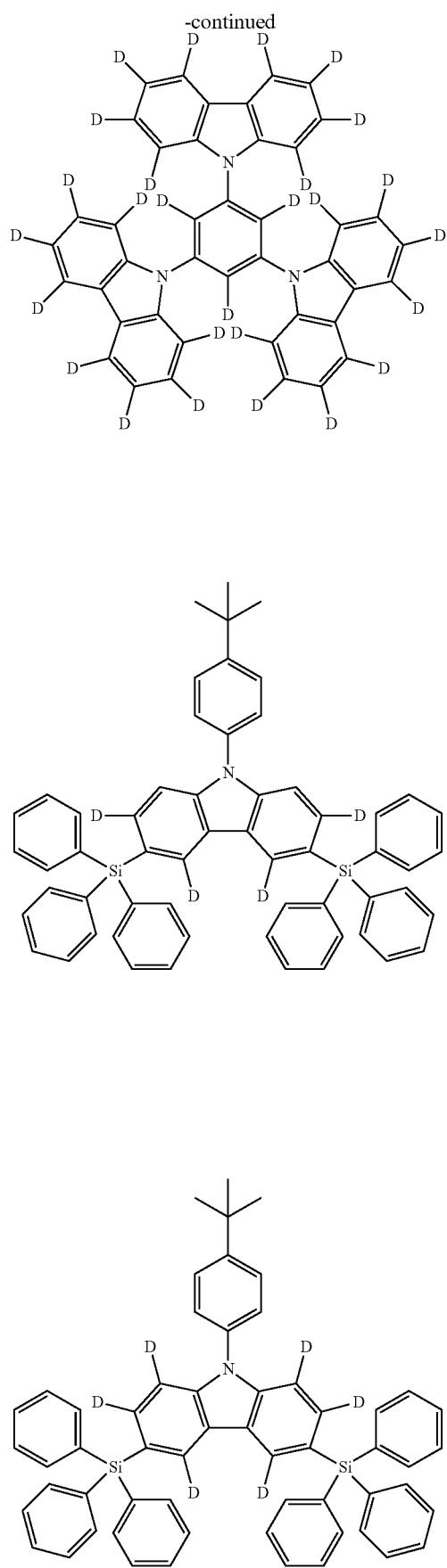

-continued
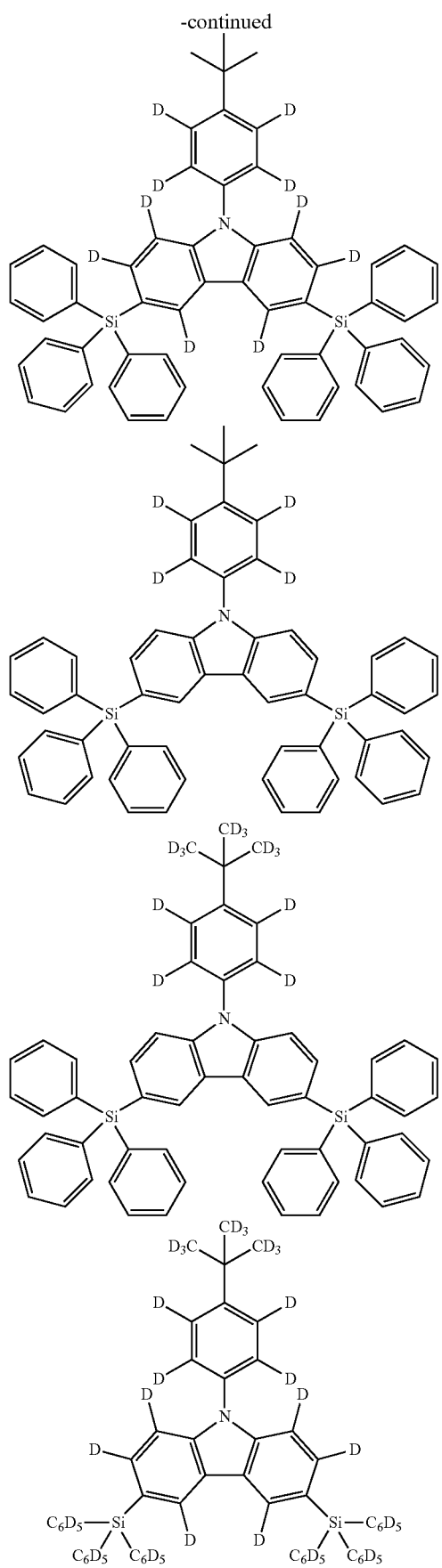
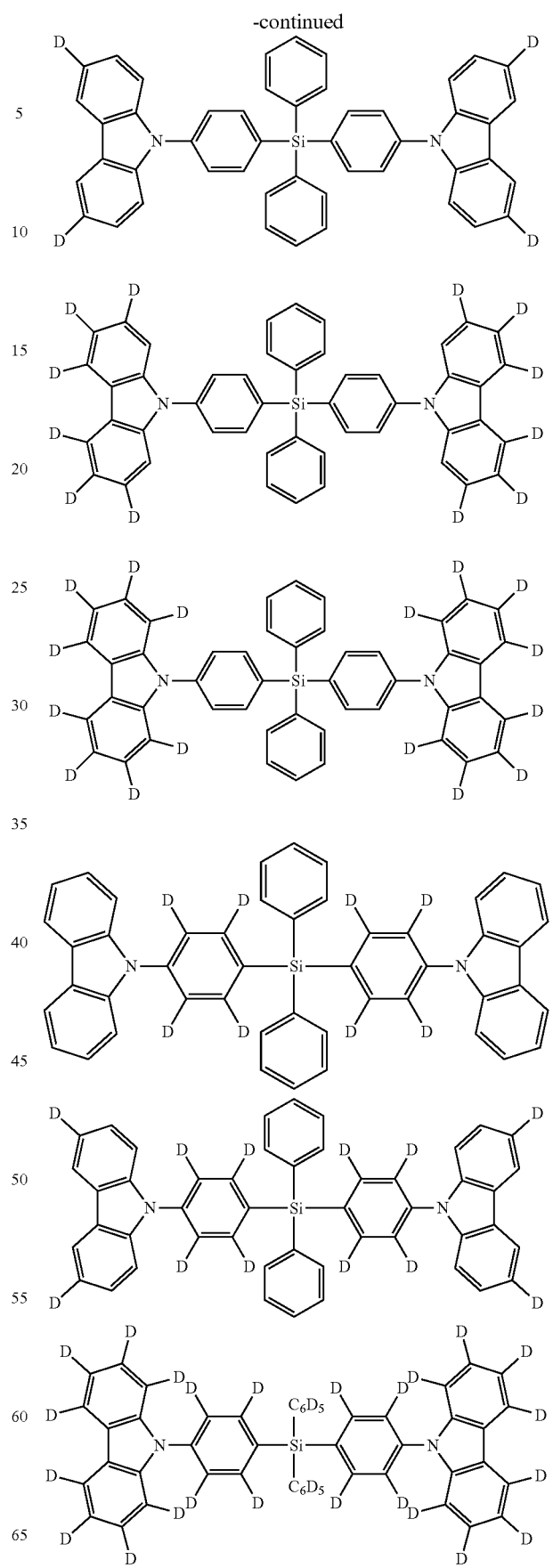

135
-continued
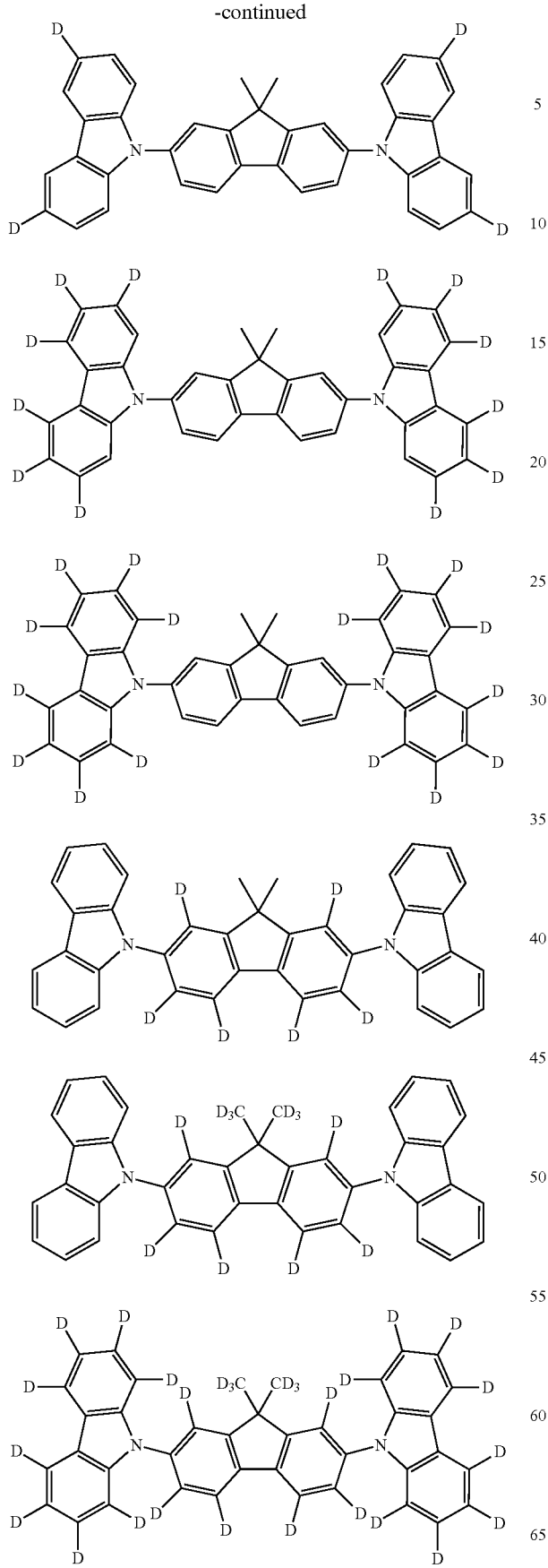
136
-continued
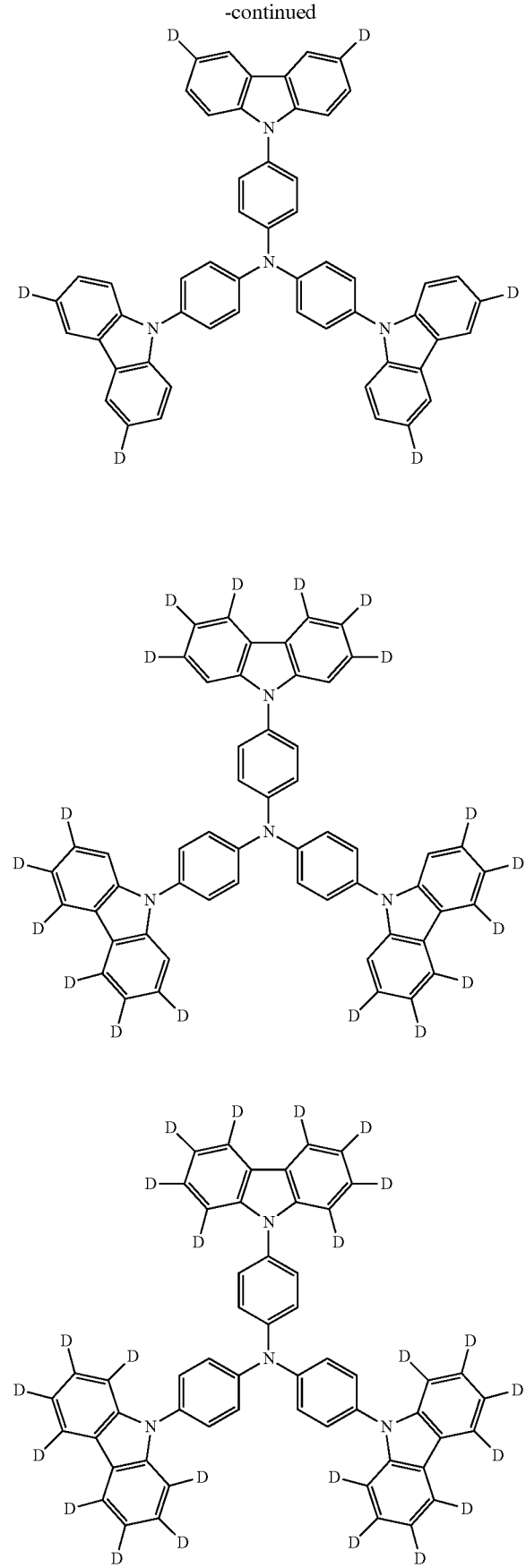

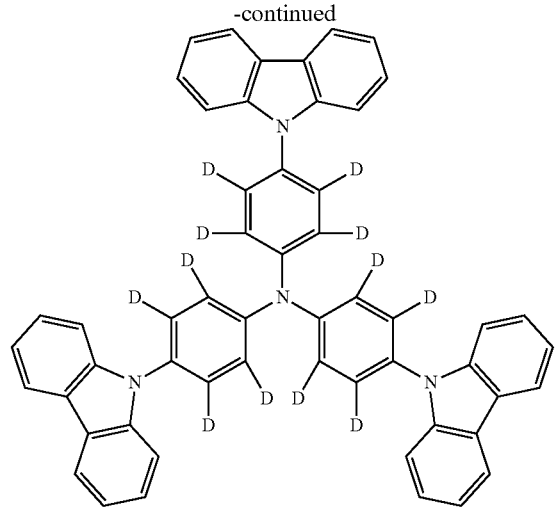
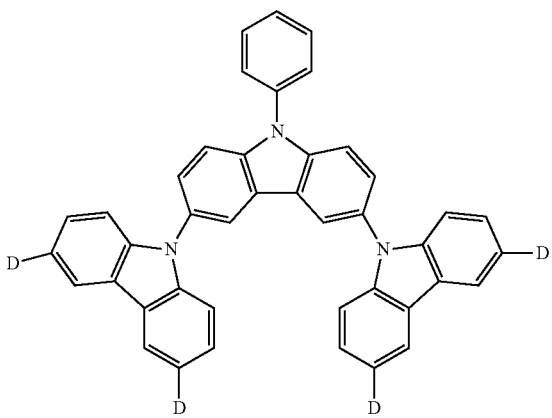
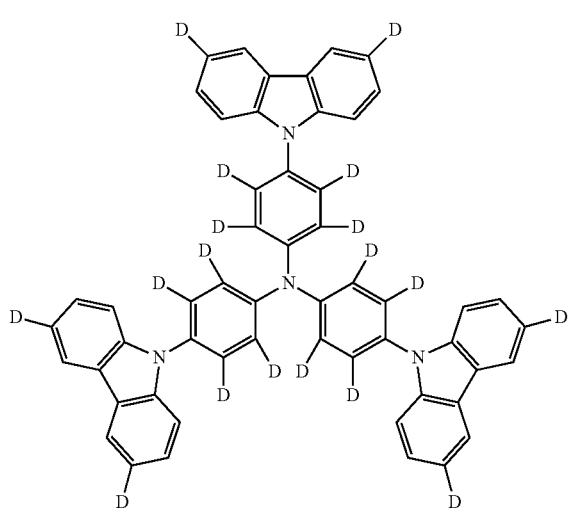
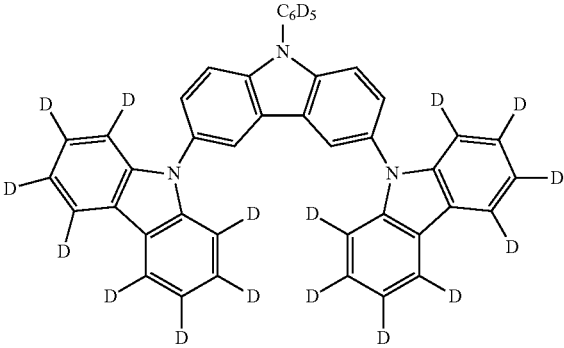
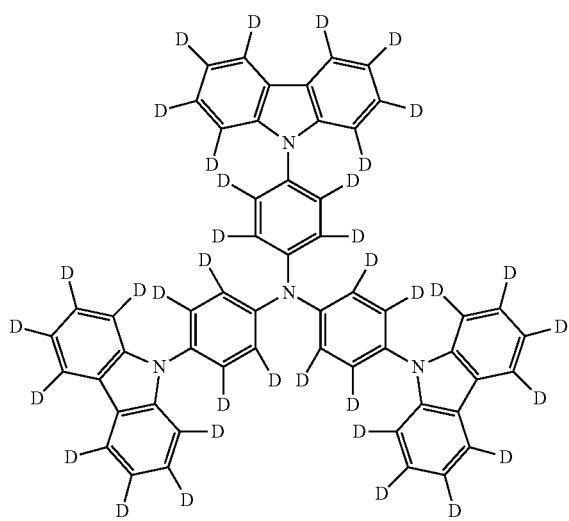
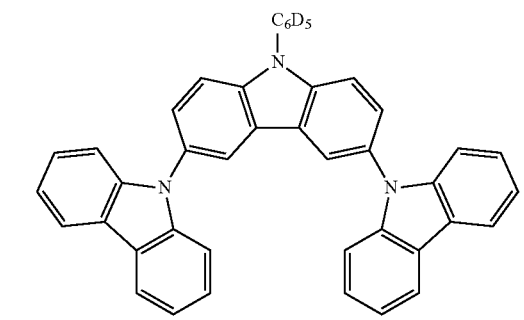

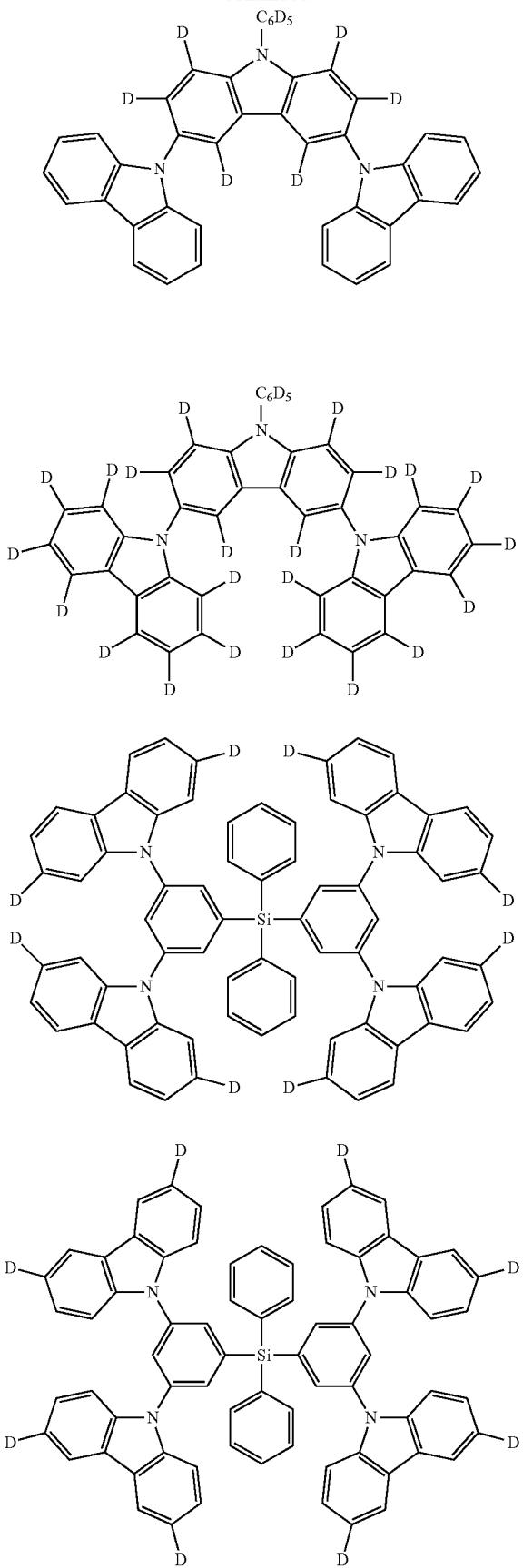

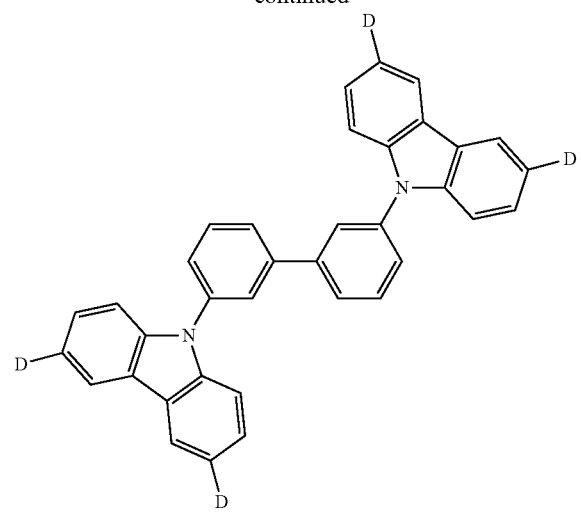
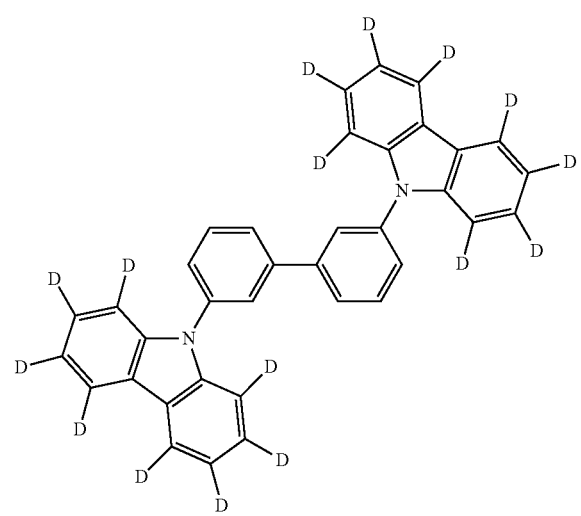
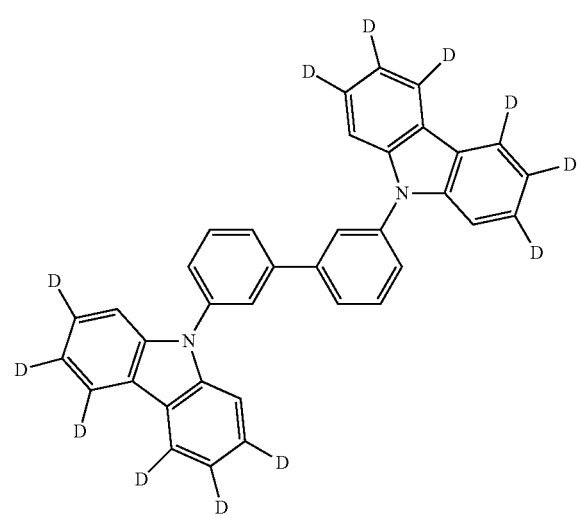

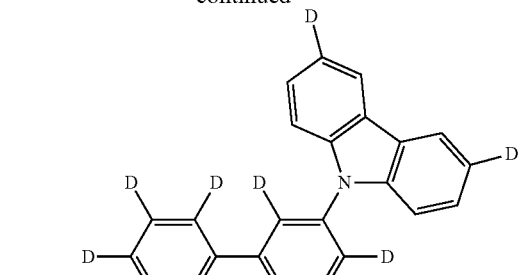
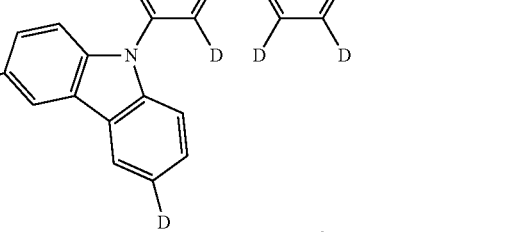
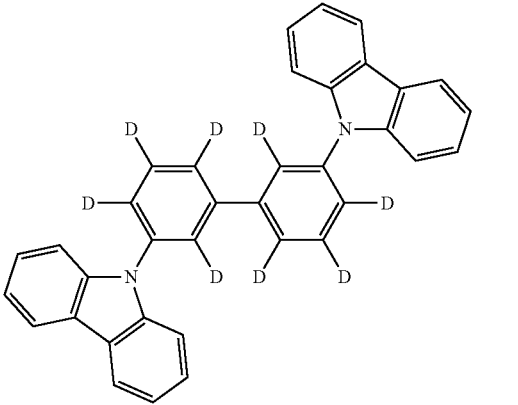
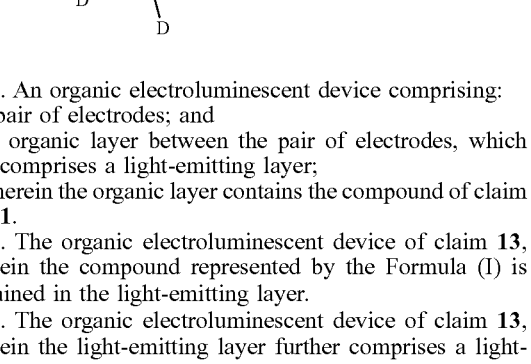

13. An organic electroluminescent device comprising:
   a pair of electrodes; and
   an organic layer between the pair of electrodes, which comprises a light-emitting layer;
   wherein the organic layer contains the compound of claim 1.

14. The organic electroluminescent device of claim 13, wherein the compound represented by the Formula (I) is contained in the light-emitting layer.

15. The organic electroluminescent device of claim 13, wherein the light-emitting layer further comprises a light-emitting material.

16. An organic electroluminescent device comprising:
a pair of electrodes; and
an organic layer between the pair of electrodes, which comprises a light-emitting layer;
wherein the organic layer contains the compound of claim 6.

17. A compound of Formula (I)

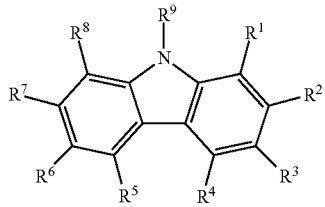

Formula (I)

wherein
$R^1$, $R^2$, $R^3$, $R^4$, $R^5$, $R^6$, $R^7$ and $R^8$ each represents a hydrogen atom or a substituent selected from the group consisting of deuterium, an alkyl group, an alkenyl group, an alkynyl group, an aryl group, a hetero-aryl group, an amino group, an alkoxyl group, an aryloxy group, a heterocyclic oxy group, an acyl group, an alkoxycarbonyl group, an aryloxycarbonyl group, an acyloxy group, an acylamino group, an alkoxycarbonylamino group, an aryloxycarbonylamino group, a sulfonylamino group, a sulfamoyl group, a carbamoyl group, an alkylthio group, an arylthio group, a heterocyclic thio group, a sulfonyl group, a sulfinyl group, a ureido group, a phosphoric acid amido group, a hydroxyl group, a mercapto group, a halogen group, a cyano group, a sulfo group, a carboxyl group, a nitro group, a hydroxamic acid group, a sulfino group, a hydrazino group, an imino group, a heterocyclic group, a silyl group, a silyloxy group, and combinations thereof; wherein two contiguous substituents of $R^1$ to $R^8$ may be bonded to each other to form a condensed ring;
wherein at least one of $R^1$ to $R^8$ represents a carbazolyl group which may be further substituted;
$R^9$ represents an alkyl group, an alkenyl group, an aryl group, a hetero-aryl group, or a silyl group, and each of which group may be substituted with a substituent; and
at least one of $R^1$ to $R^9$ represents a deuterium atom or a substituent containing a deuterium atom.

18. The compound of claim 17, wherein $R^3$ represents a carbazolyl group which is optionally further substituted.

19. An organic electroluminescent device comprising:
a pair of electrodes; and
an organic layer between the pair of electrodes, which comprises a light-emitting layer;
wherein the organic layer contains the compound of claim 17.

* * * * *